(12) United States Patent
Takahashi et al.

(10) Patent No.: US 10,332,912 B2
(45) Date of Patent: Jun. 25, 2019

(54) DISPLAY DEVICE AND ELECTRONIC DEVICE INCLUDING THE SAME

(71) Applicant: Semiconductor Energy Laboratory Co., Ltd., Atsugi-shi, Kanagawa-ken (JP)

(72) Inventors: Kei Takahashi, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/372,839

(22) Filed: Dec. 8, 2016

(65) Prior Publication Data

US 2017/0092662 A1    Mar. 30, 2017

Related U.S. Application Data

(63) Continuation of application No. 12/945,475, filed on Nov. 12, 2010, now Pat. No. 9,520,411.

(30) Foreign Application Priority Data

Nov. 13, 2009  (JP) ................................ 2009-259818
Dec. 8, 2009   (JP) ................................ 2009-278995

(51) Int. Cl.
*H01L 27/12*      (2006.01)
*H01L 27/32*      (2006.01)
(Continued)

(52) U.S. Cl.
CPC ....... *H01L 27/1225* (2013.01); *G09G 3/3233* (2013.01); *G09G 3/3266* (2013.01);
(Continued)

(58) Field of Classification Search
CPC ............ H01L 27/1225; H01L 27/3262; G09G 3/3233; G09G 2310/028; G09G 2310/0286; G09G 2300/0814
See application file for complete search history.

(56) References Cited

U.S. PATENT DOCUMENTS 5,091,334 A    2/1992  Yamazaki et al.
5,262,350 A    11/1993 Yamazaki et al.
(Continued)

FOREIGN PATENT DOCUMENTS

CN    0019011668 A    1/2007
CN    101258607 A     9/2008
(Continued)

OTHER PUBLICATIONS

International Search Report (Application No. PCT/JP2010/069226) dated Dec. 7, 2010.
(Continued)

*Primary Examiner* — Liliana Cerullo
(74) *Attorney, Agent, or Firm* — Fish & Richardson P.C.

(57) ABSTRACT

A display device includes a pixel portion including a plurality of pixels each including a first transistor, a second transistor, and a light-emitting element, in which a gate of the first transistor is electrically connected to a scan line, one of a source and a drain of the first transistor is electrically connected to a signal line, and the other of them is electrically connected to a gate of the second transistor; one of a source and a drain of the second transistor is electrically connected to a power supply line and the other of them is electrically connected to the light-emitting element, and the first transistor includes an oxide semiconductor layer. A period when the display device displays a still image includes a period in which output of a signal to all the scan lines in the pixel portion is stopped.

22 Claims, 28 Drawing Sheets

(51) Int. Cl.
*G09G 3/3233* (2016.01)
*G09G 3/3266* (2016.01)
*H01L 29/786* (2006.01)

(52) U.S. Cl.
CPC ...... *H01L 27/3246* (2013.01); *H01L 27/3248* (2013.01); *H01L 27/3262* (2013.01); *G09G 2300/0814* (2013.01); *G09G 2300/0842* (2013.01); *G09G 2310/0286* (2013.01); *G09G 2310/08* (2013.01); *H01L 29/7869* (2013.01); *H01L 29/78672* (2013.01)

(56) References Cited

U.S. PATENT DOCUMENTS

| | | | |
|---|---|---|---|
| 5,262,654 A | 11/1993 | Yamazaki | |
| 5,289,030 A | 2/1994 | Yamazaki et al. | |
| 5,453,858 A | 9/1995 | Yamazaki | |
| 5,534,884 A | 7/1996 | Mase et al. | |
| 5,591,987 A | 1/1997 | Yamazaki et al. | |
| 5,731,856 A | 3/1998 | Kim et al. | |
| 5,744,864 A | 4/1998 | Cillessen et al. | |
| 5,764,225 A | 6/1998 | Koshobu | |
| 5,767,832 A | 6/1998 | Koyama et al. | |
| 5,812,149 A | 9/1998 | Kawasaki et al. | |
| 5,849,601 A | 12/1998 | Yamazaki | |
| 5,859,443 A | 1/1999 | Yamazaki et al. | |
| 5,889,291 A | 3/1999 | Koyama et al. | |
| 5,949,397 A | 9/1999 | Koyama et al. | |
| 5,977,940 A | 11/1999 | Akiyama et al. | |
| 5,982,471 A | 11/1999 | Hirakata et al. | |
| 6,252,572 B1 * | 6/2001 | Kurumisawa ........ G09G 3/3625 345/100 | |
| 6,288,487 B1 | 9/2001 | Arai | |
| 6,294,274 B1 | 9/2001 | Kawazoe et al. | |
| 6,295,047 B1 | 9/2001 | Koyama et al. | |
| 6,310,600 B1 | 10/2001 | Koyama et al. | |
| 6,355,941 B1 | 3/2002 | Yamazaki et al. | |
| 6,380,932 B1 | 4/2002 | Kawasaki et al. | |
| 6,417,830 B1 | 7/2002 | Byeon | |
| 6,476,791 B2 | 11/2002 | Koyama et al. | |
| 6,480,181 B2 | 11/2002 | Ishii | |
| 6,563,174 B2 | 5/2003 | Kawasaki et al. | |
| 6,580,423 B1 | 6/2003 | Murade | |
| 6,614,418 B2 | 9/2003 | Koyama et al. | |
| 6,727,522 B1 | 4/2004 | Kawasaki et al. | |
| 6,747,627 B1 | 6/2004 | Koyama et al. | |
| 6,774,419 B2 | 8/2004 | Kimura | |
| 6,795,066 B2 | 9/2004 | Tanaka et al. | |
| 6,943,766 B2 | 9/2005 | Nakamura et al. | |
| 6,953,951 B2 | 10/2005 | Yamazaki et al. | |
| 6,963,337 B2 | 11/2005 | Kawasaki et al. | |
| 7,049,190 B2 | 5/2006 | Takeda et al. | |
| 7,053,874 B2 | 5/2006 | Koyama | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,109,961 B2 | 9/2006 | Osame | |
| 7,211,825 B2 | 5/2007 | Shih et al. | |
| 7,282,782 B2 | 10/2007 | Hoffman et al. | |
| 7,286,108 B2 | 10/2007 | Tsuda et al. | |
| 7,291,967 B2 | 11/2007 | Sakata et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,362,295 B2 | 4/2008 | Park et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,456,830 B2 | 11/2008 | Kawasaki et al. | |
| 7,462,862 B2 | 12/2008 | Hoffman et al. | |
| 7,468,304 B2 | 12/2008 | Kaji et al. | |
| 7,477,216 B2 | 1/2009 | Koyama et al. | |
| 7,501,293 B2 | 3/2009 | Ito et al. | |
| 7,511,709 B2 | 3/2009 | Koyama et al. | |
| 7,616,179 B2 | 11/2009 | Nakagawa et al. | |
| 7,674,650 B2 | 3/2010 | Akimoto et al. | |
| 7,732,819 B2 | 6/2010 | Akimoto et al. | |
| 7,737,438 B2 | 6/2010 | Endo et al. | |
| 7,767,106 B2 | 8/2010 | Chang | |
| 7,791,072 B2 | 9/2010 | Kumomi et al. | |
| 7,791,074 B2 | 9/2010 | Iwasaki | |
| 7,807,515 B2 | 10/2010 | Kato et al. | |
| 7,863,611 B2 | 1/2011 | Abe et al. | |
| 7,868,326 B2 | 1/2011 | Sano et al. | |
| 7,872,259 B2 | 1/2011 | Den et al. | |
| 7,897,976 B2 | 3/2011 | Kawazoe et al. | |
| 7,906,777 B2 | 3/2011 | Yano et al. | |
| 7,910,490 B2 | 3/2011 | Akimoto et al. | |
| 7,924,276 B2 | 4/2011 | Tsuda et al. | |
| 7,932,521 B2 | 4/2011 | Akimoto et al. | |
| 7,935,582 B2 | 5/2011 | Iwasaki | |
| 7,956,361 B2 | 6/2011 | Iwasaki | |
| 7,998,372 B2 | 8/2011 | Yano et al. | |
| 8,003,981 B2 | 8/2011 | Iwasaki et al. | |
| 8,008,658 B2 | 8/2011 | Park et al. | |
| 8,084,331 B2 | 12/2011 | Ofuji et al. | |
| 8,129,714 B2 | 3/2012 | Yano et al. | |
| 8,154,024 B2 | 4/2012 | Iwasaki | |
| 8,158,974 B2 | 4/2012 | Yano et al. | |
| 8,164,256 B2 | 4/2012 | Sano et al. | |
| 8,168,974 B2 | 5/2012 | Sano et al. | |
| 8,202,365 B2 | 6/2012 | Umeda et al. | |
| 8,203,146 B2 | 6/2012 | Abe et al. | |
| 8,212,252 B2 | 7/2012 | Den et al. | |
| 8,247,266 B2 | 8/2012 | Park et al. | |
| 8,253,911 B2 | 8/2012 | Kimura | |
| 8,274,077 B2 | 9/2012 | Akimoto et al. | |
| 8,274,078 B2 | 9/2012 | Itagaki et al. | |
| 8,319,214 B2 | 11/2012 | Imai | |
| 8,415,198 B2 | 4/2013 | Itagaki et al. | |
| 8,466,463 B2 | 6/2013 | Akimoto et al. | |
| 8,478,346 B2 | 7/2013 | Yamazaki | |
| 8,482,550 B2 | 7/2013 | Tanikame | |
| 8,541,944 B2 | 9/2013 | Sano et al. | |
| 8,629,069 B2 | 1/2014 | Akimoto et al. | |
| 8,642,402 B2 | 2/2014 | Yano et al. | |
| 8,669,550 B2 | 3/2014 | Akimoto et al. | |
| 8,742,412 B2 | 6/2014 | Goyal et al. | |
| 8,754,876 B2 | 6/2014 | Tanikame | |
| 8,767,159 B2 | 7/2014 | Kimura | |
| 8,779,419 B2 | 7/2014 | Yano et al. | |
| 8,785,240 B2 | 7/2014 | Watanabe | |
| 8,790,959 B2 | 7/2014 | Akimoto et al. | |
| 8,796,069 B2 | 8/2014 | Akimoto et al. | |
| 8,803,768 B2 | 8/2014 | Kimura et al. | |
| 9,001,094 B2 | 4/2015 | Tanikame | |
| 9,035,928 B2 | 5/2015 | Tanikame | |
| 9,099,562 B2 | 8/2015 | Akimoto et al. | |
| 9,118,777 B2 | 8/2015 | Yamazaki | |
| 9,269,826 B2 | 2/2016 | Hosono et al. | |
| 9,349,320 B2 | 5/2016 | Tanikame | |
| 9,360,722 B2 | 6/2016 | Kimura | |
| 9,626,914 B2 | 4/2017 | Tanikame | |
| 9,645,461 B2 | 5/2017 | Kimura | |
| 10,012,880 B2 | 7/2018 | Kimura | |
| 2001/0046027 A1 | 11/2001 | Tai et al. | |
| 2002/0056838 A1 | 5/2002 | Ogawa | |
| 2002/0093473 A1 | 7/2002 | Tanaka et al. | |
| 2002/0132454 A1 | 9/2002 | Ohtsu et al. | |
| 2003/0063078 A1 | 4/2003 | Hanari et al. | |
| 2003/0098860 A1 | 5/2003 | Nakamura et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosono et al. | |
| 2005/0052386 A1 | 3/2005 | Kwon et al. | |
| 2005/0127380 A1 | 6/2005 | Kawasaki et al. | |
| 2005/0140632 A1 | 6/2005 | Tsuda et al. | |
| 2005/0199959 A1 | 9/2005 | Chiang et al. | |
| 2005/0231456 A1 | 10/2005 | Nakamura et al. | |

(56) References Cited

U.S. PATENT DOCUMENTS

| | | |
|---|---|---|
| 2006/0035452 A1 | 2/2006 | Carcia et al. |
| 2006/0043377 A1 | 3/2006 | Hoffman et al. |
| 2006/0043380 A1 | 3/2006 | Kawazoe et al. |
| 2006/0091793 A1 | 5/2006 | Baude et al. |
| 2006/0108529 A1 | 5/2006 | Saito et al. |
| 2006/0108636 A1* | 5/2006 | Sano ............... H01L 21/428 257/347 |
| 2006/0110867 A1 | 5/2006 | Yabuta et al. |
| 2006/0113536 A1 | 6/2006 | Kumomi et al. |
| 2006/0113539 A1* | 6/2006 | Sano ............... H01L 29/51 257/59 |
| 2006/0113549 A1 | 6/2006 | Den et al. |
| 2006/0113565 A1 | 6/2006 | Abe et al. |
| 2006/0152150 A1 | 7/2006 | Boerner et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267889 A1 | 11/2006 | Kimura |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0120803 A1* | 5/2007 | Nakamura ........... G09G 3/3648 345/98 |
| 2007/0152217 A1 | 7/2007 | Lai et al. |
| 2007/0172591 A1 | 7/2007 | Seo et al. |
| 2007/0182700 A1 | 8/2007 | Baba et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0200803 A1 | 8/2007 | Kimura |
| 2007/0252928 A1 | 11/2007 | Ito et al. |
| 2007/0259466 A1 | 11/2007 | Sakata et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0055218 A1 | 3/2008 | Tsuda et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0198107 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284929 A1 | 11/2008 | Kimura |
| 2008/0284970 A1 | 11/2008 | Ishitani |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134389 A1 | 5/2009 | Matsunaga |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0194766 A1 | 8/2009 | Park et al. |
| 2009/0219295 A1 | 9/2009 | Reijnaerts |
| 2009/0239335 A1 | 9/2009 | Akimoto et al. |
| 2009/0261325 A1 | 10/2009 | Kawamura et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0045179 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0244185 A1 | 9/2010 | Takafuji et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0063262 A1 | 3/2011 | Umezaki et al. |
| 2011/0090183 A1 | 4/2011 | Yamazaki et al. |
| 2011/0090204 A1 | 4/2011 | Yamazaki et al. |
| 2011/0102696 A1 | 5/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0201162 A1 | 8/2011 | Hosono et al. |
| 2011/0256684 A1 | 10/2011 | Iwasaki et al. |
| 2012/0012838 A1 | 1/2012 | Hosono et al. |
| 2014/0346506 A1 | 11/2014 | Kimura et al. |
| 2015/0148107 A1 | 5/2015 | Yamazaki |
| 2015/0187253 A1 | 7/2015 | Kimura |
| 2015/0340513 A1 | 11/2015 | Akimoto et al. |
| 2017/0180538 A1 | 6/2017 | Yamazaki |
| 2018/0364531 A1 | 12/2018 | Kimura |
| 2019/0051759 A1 | 2/2019 | Akimoto et al. |

FOREIGN PATENT DOCUMENTS

| | | |
|---|---|---|
| CN | 101309863 A | 11/2008 |
| CN | 101540135 A | 9/2009 |
| CN | 101548383 A | 9/2009 |
| EP | 1296174 A | 3/2003 |
| EP | 1478031 A | 11/2004 |
| EP | 1737044 A | 12/2006 |
| EP | 1770788 A | 4/2007 |
| EP | 1816637 A | 8/2007 |
| EP | 1915784 A | 4/2008 |
| EP | 1918904 A | 5/2008 |
| EP | 1995787 A | 11/2008 |
| EP | 1998373 A | 12/2008 |
| EP | 1998374 A | 12/2008 |
| EP | 1998375 A | 12/2008 |
| EP | 2006824 A | 12/2008 |
| EP | 2020686 A | 2/2009 |
| EP | 2061087 A | 5/2009 |
| EP | 2071441 A | 6/2009 |
| EP | 2226847 A | 9/2010 |
| EP | 2246894 A | 11/2010 |
| EP | 2339639 A | 6/2011 |
| EP | 2413366 A | 2/2012 |
| EP | 2420913 A | 2/2012 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 01-238073 A | 9/1989 |
| JP | 05-251705 A | 9/1993 |
| JP | 05-275735 A | 10/1993 |
| JP | 06-196705 A | 7/1994 |
| JP | 07-297406 A | 11/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-312253 A | 11/2001 |
| JP | 2002-014320 A | 1/2002 |
| JP | 2002-076356 A | 3/2002 |
| JP | 2002-140036 A | 5/2002 |
| JP | 2002-207462 A | 7/2002 |
| JP | 2002-278523 A | 9/2002 |
| JP | 2002-289859 A | 10/2002 |
| JP | 2003-086000 A | 3/2003 |
| JP | 2003-086808 A | 3/2003 |
| JP | 2003-208111 A | 7/2003 |
| JP | 2003-249656 A | 9/2003 |
| JP | 2003-344823 A | 12/2003 |
| JP | 2004-103957 A | 4/2004 |
| JP | 2004-272270 A | 9/2004 |
| JP | 2004-273614 A | 9/2004 |
| JP | 2004-273732 A | 9/2004 |
| JP | 2005-167164 A | 6/2005 |
| JP | 2005-190797 A | 7/2005 |
| JP | 2006-024610 A | 1/2006 |
| JP | 2006-084758 A | 3/2006 |
| JP | 3766926 | 4/2006 |
| JP | 2006-165528 A | 6/2006 |
| JP | 2006-165532 A | 6/2006 |
| JP | 2006-186319 A | 7/2006 |
| JP | 2007-058186 A | 3/2007 |
| JP | 2007-103918 A | 4/2007 |
| JP | 2007-142195 A | 6/2007 |
| JP | 2007-142196 A | 6/2007 |
| JP | 2007-206651 A | 8/2007 |
| JP | 2007-250983 A | 9/2007 |
| JP | 2007-271971 A | 10/2007 |
| JP | 2007-286150 A | 11/2007 |
| JP | 2008-033066 | 2/2008 |
| JP | 2008-033066 A | 2/2008 |
| JP | 2008-042067 A | 2/2008 |
| JP | 2008-053356 A | 3/2008 |
| JP | 2008-072025 A | 3/2008 |
| JP | 2008-134625 A | 6/2008 |
| JP | 2008-141119 A | 6/2008 |
| JP | 2008-216529 A | 9/2008 |
| JP | 2008-281988 A | 11/2008 |
| JP | 2008-287115 A | 11/2008 |
| JP | 2008-311342 A | 12/2008 |
| JP | 2009-021612 A | 1/2009 |
| JP | 2009-141342 A | 6/2009 |
| JP | 2009-175704 A | 8/2009 |
| JP | 2009-224479 A | 10/2009 |
| JP | 2009-258275 A | 11/2009 |
| JP | 4415062 | 2/2010 |
| JP | 2010-177431 A | 8/2010 |
| JP | 4571221 | 10/2010 |
| KR | 10-0265195 | 9/2000 |
| KR | 2001-0105273 | 11/2001 |
| KR | 2003-0043774 A | 6/2003 |
| KR | 2005-0072424 A | 7/2005 |
| KR | 2007-0085828 A | 8/2007 |
| KR | 2008-0053215 A | 6/2008 |
| KR | 2009-0085738 A | 8/2009 |
| TW | 558707 | 10/2003 |
| TW | 200522721 | 7/2005 |
| TW | 200901528 | 1/2009 |
| TW | 200941729 | 10/2009 |
| TW | 200945856 | 11/2009 |
| WO | WO-2003/071608 | 8/2003 |
| WO | WO-2004/032576 | 4/2004 |
| WO | WO-2004/114391 | 12/2004 |
| WO | WO-2005/088726 | 9/2005 |
| WO | WO-2006/051994 | 5/2006 |
| WO | WO-2006/051995 | 5/2006 |
| WO | WO-2007/029844 | 3/2007 |
| WO | WO-2007/119386 | 10/2007 |
| WO | WO-2007/139009 | 12/2007 |
| WO | WO-2008/023553 | 2/2008 |
| WO | WO-2008/069286 | 6/2008 |
| WO | WO-2008/096768 | 8/2008 |
| WO | WO-2008/117739 | 10/2008 |
| WO | WO-2008/126879 | 10/2008 |
| WO | WO-2008/133345 | 11/2008 |
| WO | WO-2009/084311 | 7/2009 |
| WO | WO-2009/096608 | 8/2009 |

OTHER PUBLICATIONS

Written Opinion (Application No. PCT/JP2010/069226) dated Dec. 7, 2010.

Kim.S et al., "High-Performance oxide thin film transistors passivated by various gas plasmas", 214th ECS Meeting, 2006, No. 2317, ECS.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Park.S et al., "Challenge to Future Displays: Transparent AM-OLED Driven by PEALD Grown ZnO TFT", IMID '07 Digest, 2007, pp. 1249-1252.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Lee.M et al., "15.4:Excellent Performance of Indium-Oxide-Based Thin-Film Transistors by DC Sputtering", SID Digest '09 : SID International Symposium Digest of Technical Papers, May 3, 2009, pp. 191-193.

Park.J et al., "High performance amorphous oxide thin film transistors with self-aligned top-gate structure", IEDM 09: Technical Digest of International Electron Devices Meeting, Dec. 7, 2009, pp. 191-194.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Mo.Y et al., "Amorphous Oxide TFT Backplanes for Large Size AMOLED Displays", IDW'08 : Proceedings of the 6th International Display Workshops, Dec. 3, 2008, pp. 581-584.

Lee.H et al., "Current Status of, Challenges to, and Perspective View of AM-OLED", IDW'06 : Proceedings of the 13th International Display Workshops, Dec. 7, 2006, pp. 663-666.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kikuchi.H et al., "Polymer-Stabilized Liquid Crystal Blue Phases", Nature Materials, Sep. 2, 2002, vol. 1, pp. 64-68.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Kitzerow.H et al., "Observation of Blue Phases in Chiral Networks", Liquid Crystals, 1993, vol. 14, No. 3, pp. 911-916.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17 22.

Nakamura.M, "Synthesis of Homologous Compound with New Long-Period Structure", NIRIM Newsletter, Mar. 1, 1995, vol. 150, pp. 1-4.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Clark.S et al., "First Principles Methods Using CASTEP", Zeitschrift fur Kristallographie, 2005, vol. 220, pp. 567-570.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Miyasaka.M, "SUFTLA Flexible Microelectronics on Their Way to Business", SID Digest '07 : SID International Symposium Digest of Technical Papers, 2007, vol. 38, pp. 1673-1676.

Kikuchi.H et al., "62.2: Invited Paper:Fast Electro-Optical Switching in Polymer-Stabilized Liquid Crystalline Blue Phases for Display Application", SID Digest '07 : SID International Symposium of Technical Papers, 2007, vol. 38, pp. 1737-1740.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Nowatari.H et al., "60.2: Intermediate Connector With Suppressed Voltage Loss for White Tandem OLEDs", SID Digest '09 : SID Digest '09 : SID International Symposium Digest of Technical Papers, May 31, 2009, vol. 40, pp. 899-902.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kurokawa.Y et al., "UHF RFCPUS on Flexible and Glass Substrates for Secure RFID Systems", Journal of Solid-State Circuits , 2008, vol. 43, No. 1, pp. 292-299.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Kimizuka.N et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga or Al; B: Mg, Mn, Fe, Ni, Cu,or Zn] at Temperatures over 1000° C.", Journal of Solid State Chemistry, 1985, vol. 60, pp. 382-384.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Janotti.A et al., "Native Point Defects in ZnO", Phys. Rev. B (Physical Review. B), Oct. 4, 2007, vol. 76, No. 16, pp. 165202-1-165202-22.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Janotti.A et al., "Oxygen Vacancies in ZnO", Appl. Phys. Lett. (Applied Physics Letters), 2005, vol. 87, pp. 122102-1-122102-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Nakamura.M et al., "Syntheses and crystal structures of new homologous compounds, indium iron zinc oxides (InFeO3(ZnO)m) (m natural number) and related compounds", Kotai Butsuri (Solide State Physics), 1993, vol. 28, No. 5, 317-327.

Chinese Office Action (Application No. 201080051723.4) dated May 6, 2014.

Chinese Office Action (Application No. 201080051723.4) dated Nov. 4, 2014.

Taiwanese Office Action (Application No. 099138507) dated Jan. 26, 2015.

Taiwanese Office Action (Application No. 106111196) dated Sep. 27, 2017.

Korean Office Action (Application No. 2012-7014970) dated May 15, 2017.

Korean Office Action (Application No. 2018-7003094) dated Feb. 27, 2018.

Chinese Office Action (Application No. 201610009295.8) dated Sep. 25, 2018.

* cited by examiner

DISPLAY DEVICE AND ELECTRONIC DEVICE INCLUDING THE SAME

CROSS-REFERENCE TO RELATED APPLICATIONS

This application is a continuation of U.S. application Ser. No. 12/945,475, filed Nov. 12, 2010, now allowed, which claims the benefit of foreign priority applications filed in Japan as Serial No. 2009-259818 on Nov. 13, 2009, and Serial No. 2009-278995 on Dec. 8, 2009, all of which are incorporated by reference.

TECHNICAL FIELD

The present invention relates to a display device. Further, the present invention relates to an electronic device including the display device.

BACKGROUND ART

In recent years, flat panel displays, which are typified by a liquid crystal display device or an electroluminescence display device (hereinafter, referred to as an EL display device) including an electroluminescence element, are under mass production as the mainstream of the image display device.

In an active matrix liquid crystal display device or in an active matrix EL display device, each pixel in a pixel portion is provided with a transistor. These transistors include a semiconductor layer of silicon (Si) as an active layer.

In contrast, there has been proposed is an image display device in which a transistor includes oxide in its active layer (e.g., see Patent Document 1).

REFERENCE

[Patent Document 1] Japanese Published Patent Application No. 2006-165528

DISCLOSURE OF INVENTION

One measure for evaluating the electric characteristics of a transistor is off current. Off current refers to current which flows between a source and a drain when the transistor is in an off state (in a non-conductive state). In an n-channel transistor, off current refers to current which flows between a source and a drain when voltage applied between a gate and the source is equal to or less than the threshold voltage (Vth).

Patent Document 1 discloses that when an amorphous oxide semiconductor thin film is used as a channel layer of a transistor, off current can be lower than 10 µA ($=1\times10^{-5}$ A), preferably lower than 0.1 µA ($=1\times10^{-7}$ A). In addition, in Patent Document 1, it is said that an on/off ratio can exceed $10^3$ by using an amorphous oxide semiconductor thin film. However, in a transistor with electric characteristics in such a level, off current is less than satisfactory. In other words, to meet the needs for a further reduction in power consumption of image display devices, off current needs to be further lowered.

One object of one embodiment of the present invention is to provide a display device with reduced power consumption which includes a pixel portion provided with a plurality of pixels having a transistor including an oxide semiconductor.

In one embodiment of the present invention, each pixel in a display portion of a display device at least includes a transistor including an oxide semiconductor. The transistor including an oxide semiconductor has stable electric characteristics such as a very low off current. In order to form a transistor with very low off current, according to one embodiment the present invention, an oxide semiconductor (a high-purity oxide semiconductor) in which the concentration of impurities to be suppliers of carriers is reduced to such a degree that the oxide semiconductor can be expressed as intrinsic or substantially intrinsic. Typically, in one embodiment of the present invention, the transistor including an oxide semiconductor includes a film the hydrogen concentration of which is $5\times10^{19}$ /cm$^3$ or less.

One embodiment of the present invention is a display device including: a pixel portion including a plurality of pixels each including a first transistor, a second transistor, and a light-emitting element including a pair of electrodes. In the display device, a gate of the first transistor is electrically connected to a scan line, one of a source and a drain of the first transistor is electrically connected to a signal line, and the other of the source and the drain of the first transistor is electrically connected to a gate of the second transistor; one of a source and a drain of the second transistor is electrically connected to a power supply line, and the other of the source and the drain of the second transistor is electrically connected to one of the pair of electrodes; and the first transistor includes an oxide semiconductor layer a hydrogen concentration of which is $5\times10^{19}$ /cm$^3$ or less.

Further, another embodiment of the present invention is a display device in which a period when the display device displays a still image includes a period when output of a signal to all the scan lines in the pixel portion is stopped.

One embodiment of the present invention is a display device including: a pixel portion including a plurality of pixels each including a first transistor, a second transistor, and a light-emitting element including a pair of electrodes; a driver circuit portion driving the pixel portion; a signal generation circuit generating a control signal for driving the driver circuit portion and an image signal supplied to the pixel; a memory circuit storing image signals of respective frame periods; a comparison circuit detecting a difference between image signals of successive frame periods among the image signals of the respective frame periods stored in the memory circuit; a selection circuit selecting and outputting the image signals of the successive frame periods when the comparison circuit detects a difference; and a display control circuit supplying the control signal and the image signal output from the selection circuit to the driver circuit portion when the comparison circuit detects a difference, and stopping supply of the control signal to the driver circuit portion when the comparison circuit does not detect a difference. In the display device, a gate of the first transistor is electrically connected to a scan line, one of a source and a drain of the first transistor is electrically connected to a signal line, and the other of the source and the drain of the first transistor is electrically connected to a gate of the second transistor, one of a source and a drain of the second transistor is electrically connected to a power supply line, and the other of the source and the drain of the second transistor is electrically connected to one of the pair of electrodes; and the first transistor includes an oxide semiconductor layer a hydrogen concentration of which is $5\times10^{19}$ /cm$^3$ or less.

Further, another embodiment of the present invention is a display device in which the control signal is a high power supply potential, a low power supply potential, a clock signal, a start pulse signal, or a reset signal.

Further, another embodiment of the present invention is a display device in which the pixel further includes a luminous layer.

Further, another embodiment of the present invention is a display device in which a carrier concentration of the oxide semiconductor layer is less than $1 \times 10^{14}$ /cm$^3$.

Further, another embodiment of the present invention is a display device in which a band gap of the oxide semiconductor layer is 2 eV or more.

Further, another embodiment of the present invention is a display device in which the second transistor includes an oxide semiconductor layer a hydrogen concentration of which is $5 \times 10^{19}$ /cm$^3$ or less.

Further, another embodiment of the present invention is a display device in which the second transistor includes a polycrystalline silicon layer.

Further, another embodiment of the present invention is an electronic device including any of the above display devices.

Note that it is difficult to distinguish a source and a drain of a transistor from each other because of the structure of a transistor. Further, potential levels may be interchanged depending on an operation of a circuit. Therefore, in this specification, a source and a drain is not particularly specified and are also referred to as a first electrode (or a first terminal) and a second electrode (or a second terminal). For example, in the case where the first electrode is a source, the second electrode refers to a drain, whereas in the case where the first electrode is a drain, the second electrode refers to a source.

Note that in this specification, an aperture ratio refers to a ratio of a light-transmitting area to a unit area; the aperture ratio is decreased as an area of a region occupied by components that do not transmit light is increased, whereas the aperture ratio is increased as an area of a region occupied by components that transmit light is increased. In a display device, the aperture ratio is increased by a reduction in area occupied by a wiring and a capacitor line that overlap with a pixel electrode, and by a reduction in size of a transistor.

In particular, in a self-luminous display device in which each pixel includes a light-emitting element, the aperture ratio refers to the proportion of an emission area of a light-emitting element in a pixel area that can be observed by an observant facing a display of the display device.

In this specification, the phrase "A and B are connected" refers to the case where A and B are electrically connected (i.e., A and B are connected with another element or circuit interposed therebetween), the case where A and B are functionally connected (i.e., A and B are functionally connected with another circuit interposed therebetween), or the case where A and B are directly connected (i.e., A and B are connected without another element or circuit interposed therebetween).

Further, in this specification, ordinal numbers such as first, second, third, and N-th (N is a natural number) are used in order to avoid confusion among components, and the terms do not limit the components numerically. For example, a transistor which is referred to as a "first transistor" in this specification may alternatively be referred to as a "second transistor" as long as it is not confused with another component.

According to one embodiment of the present invention, by using a transistor including a high-purity oxide semiconductor in a pixel portion of a display device, off current can be reduced to $1 \times 10^{-13}$ A or lower. Thus, data can be held for a long time and power consumption for displaying a still image or the like can be suppressed.

Furthermore, the image to be displayed is determined whether it is a still image or a moving image, and in a period in which a still image is displayed, operation of a driver circuit portion is stopped, whereby power consumption of the display device can be further reduced.

BEST MODE FOR CARRYING OUT THE INVENTION

Figure 1:
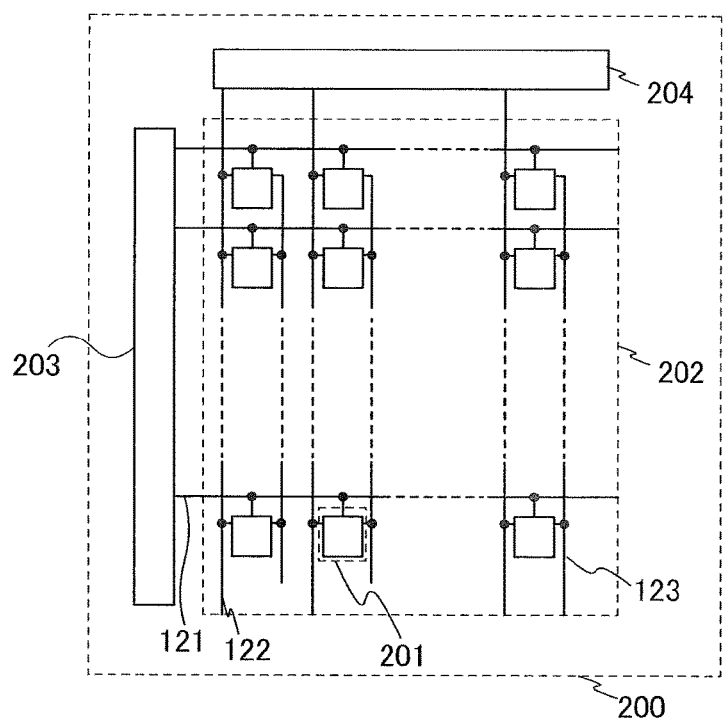
FIG. 1 illustrates a structural example of a display device.

Embodiments of the present invention will be described in detail with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments. Note that in the embodiments of present invention to be described below, the same reference numerals are used to denote the same components in different drawings.

Note that, each of the embodiments described below can be implemented by being combined with any of the other embodiments given in this specification unless otherwise specified.

(Embodiment 1)

In this embodiment, an example of a display device which is one embodiment of the present invention will be described. Specifically, a structural example of a pixel in a pixel portion of a display device will be described with reference to FIG. 1, FIG. 2, FIG. 3, FIG. 4, FIGS. 5A to 5C, and FIGS. 6A and 6B.

FIG. 1 illustrates a structural example of a display device which is one embodiment of the present invention. As is illustrated in FIG. 1, in a display device, a pixel portion 202 in which a plurality of pixels 201 are arranged in a matrix is provided over a substrate 200. In addition, the display device includes a scan line driver circuit 203 and a signal line driver circuit 204 as circuits for driving the plurality of pixels 201. Whether the pixels 201 are in a selected state or in a non-selected state is determined for each row in accordance with a scan signal supplied through the first wiring 121 (a scan line) electrically connected to the scan line driver circuit 203. The pixel 201 selected by the scan signal is supplied with a video voltage (also referred to as an image signal, a video signal, or video data) through the second wiring 122 (a signal line) electrically connected to the signal line driver circuit 204. The pixel 201 includes a light-emitting element including a pair of electrodes to one of which a power supply line 123 for supplying a potential is electrically connected.

Note that although FIG. 1 illustrates a structure where the scan line driver circuit 203 and the signal line driver circuit 204 are provided over the substrate 200, the present invention is not limited to this structure. Only one of the scan line driver circuit 203 and the signal line driver circuit 204 may be provided over the substrate 200. Alternatively, only the pixel portion 202 may be provided over the substrate 200.

Further, although FIG. 1 illustrates an example where the plurality of pixels 201 are arranged in a matrix (a stripe arrangement), the present invention is not limited to this structure. As for the arrangement of the pixels 201, a delta arrangement or Bayer arrangement may be employed as an alternative to a stripe arrangement.

As a display method in the pixel portion 202, a progressive method, an interlace method or the like can be employed. Color components controlled in the pixel at the time of color display are not limited to three colors of R, G, and B (R, G, and B represent red, green, and blue, respectively); for example, R, G, B, and W (W represents white), or R, G, B, and one or more of yellow, cyan, magenta, and the like can be employed. Further, the sizes of display regions of may be different between color components of dots. Note that the present invention is not limited to the application to a display device for color display but can also be applied to a display device for monochrome display.

Further, although FIG. 1 illustrates a structure where the ratio of the number of first wirings 121 to the number of second wirings 122, which are respectively extended in the row direction and the column direction of the pixels, is one to one, the present invention is not limited to this structure. For example, adjacent pixels 201 may share the first wiring 121 or the second wiring 122 and be driven.

Figure 2:
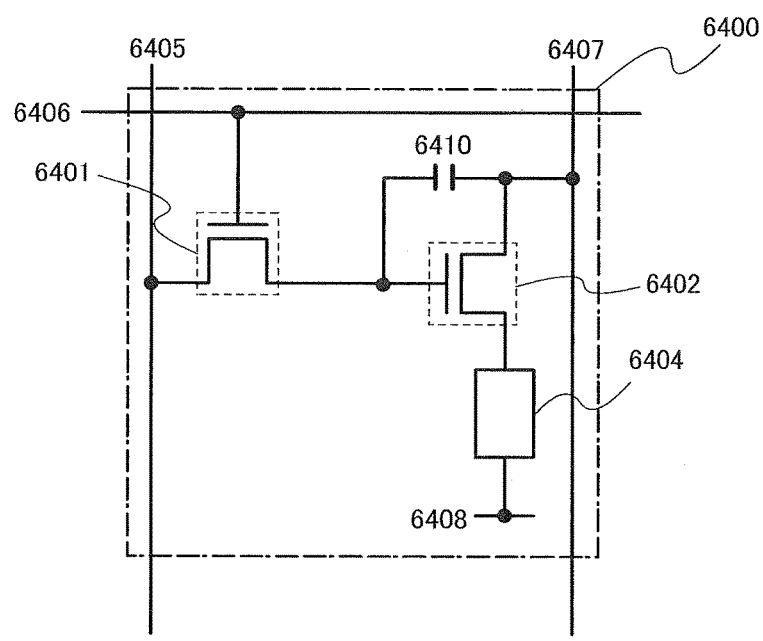
FIG. 2 is an equivalent circuit diagram illustrating a structural example of a pixel.

FIG. 2 is an equivalent circuit diagram illustrating a structural example of the pixel 201 in FIG. 1. Note that the present invention is not limited to the pixel structure in FIG. 2.

The pixel 6400 includes a first transistor (hereinafter, also referred to as a switching transistor) 6401, a second transistor (hereinafter, also referred to as a driver transistor) 6402, and a light-emitting element 6404.

A gate of the first transistor 6401 is electrically connected to a scan line 6406, a first electrode (one of a source electrode and a drain electrode) of the first transistor 6401 is electrically connected to a signal line 6405, and a second electrode (the other of the source electrode and the drain electrode) of the first transistor 6401 is electrically connected to a gate of the second transistor 6402. A first electrode (one of a source electrode and a drain electrode) of the second transistor 6402 is electrically connected to a power supply line 6407, and a second electrode (the other of the source electrode and the drain electrode) of the second transistor 6402 is electrically connected to a first electrode (a pixel electrode) of the light-emitting element 6404. Note that a second electrode of the light-emitting element 6404 corresponds to a common electrode 6408. Although FIG. 2 illustrates a structure where a capacitor 6410 is provided between the gate of the second transistor 6402 and the power supply line 6407, the present invention is not limited to this structure. For example, a capacitor may be provided between the gate of the second transistor 6402 and the second electrode of the second transistor 6402.

The common electrode 6408 is electrically connected to a common potential line so as to be supplied with a low power supply potential. In addition, the power supply line 6407 is set so as to be supplied with a high power supply potential. Note that the low power supply potential is a potential which is lower than a high power supply potential with which the power supply line 6407 is supplied. Specific examples of the low power supply potential are GND and 0 V. Note that the potentials of the high power supply potential and the low power supply potential need to be set so that the potential difference between them may be at least equal to or greater than the forward threshold voltage of the light-emitting element 6404.

In this embodiment, a transistor including an oxide semiconductor layer is used as the first transistor 6401. In this case, the first transistor 6401 is an n-channel transistor. The second transistor 6402 may be either an n-channel transistor or a p-channel transistor. Further, the second transistor 6402 may include either an oxide semiconductor layer or a silicon layer as an active layer. When a silicon layer is used as an active layer, an amorphous silicon layer may be used but a polycrystalline silicon layer is preferably used. In this embodiment, the second transistor 6402 is an n-channel transistor and includes an oxide semiconductor layer as an active layer.

Figure 3:
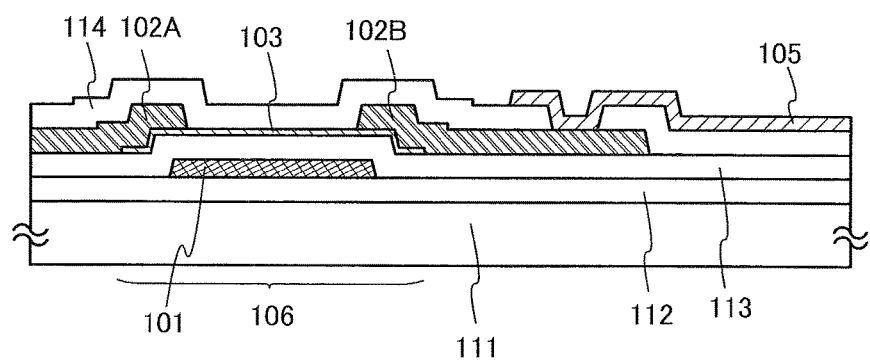
FIG. 3 is a cross-sectional view illustrating an example of a transistor.

FIG. 3 is an example of a cross-sectional view of the first transistor 6401 in the pixel 6400. A transistor 106 illustrated in FIG. 3 corresponds to the first transistor 6401 and has a bottom-gate structure. The transistor 106 is also called an inverted-staggered transistor because a first wiring 101 serving as a gate electrode is provided under the oxide semiconductor layer 103 serving as a channel region, and a first electrode (one of a source electrode and a drain electrode) 102A and a second electrode (the other of the source electrode and the drain electrode) 102B are provided on the opposite side of the oxide semiconductor layer 103 from the first wiring 101.

The first wiring 101 is provided over the substrate 111 with a base film 112 interposed therebetween. The first wiring 101 serves as a gate of the transistor 106. In addition, the first wiring 101 may be a scan line itself which is electrically connected to the scan line driver circuit or may be a wiring which is electrically connected to the scan line.

A gate insulating film 113 is provided to cover the first wiring 101. The oxide semiconductor layer 103 is provided over the gate insulating film 113. The first electrode 102A and the second electrode 102B are provided over the oxide semiconductor layer 103. The first electrode 102A and the second electrode 102B are electrically connected to the oxide semiconductor layer 103 and one of them serves as a source electrode and the other of them serves as a drain electrode. Note that the first electrode 102A may be a signal line itself which is electrically connected to the signal line driver circuit or may be a wiring which is electrically connected to the signal line.

An oxide insulating layer 114 serving as a passivation film is provided over the oxide semiconductor layer 103, the first electrode 102A, and the second electrode 102B. An opening is formed in the oxide insulating layer 114. Through the opening, a fourth wiring 105 and the second electrode 102B are electrically connected. Note that the fourth wiring 105 is electrically connected to the gate of the second transistor.

Next, the oxide semiconductor layer 103 will be described.

The oxide semiconductor layer 103 in this embodiment is an oxide semiconductor layer in which impurities, which adversely affect the electric characteristics of the transistor including the oxide semiconductor, are reduced to a very low level, that is, the oxide semiconductor layer 103 is a high-purity oxide semiconductor. As a typical example of impurities which adversely affect the electric characteristics, hydrogen is given. Hydrogen is an impurity which may be a supplier (donor) of electrons in an oxide semiconductor. An oxide semiconductor which includes a large amount of hydrogen may become an n-type oxide semiconductor. Thus, a transistor including an oxide semiconductor which includes a large amount of hydrogen may be a normally-on transistor, and the on/off ratio of the transistor cannot be high enough. In this specification, a "high-purity oxide semiconductor" is an oxide semiconductor in which hydrogen is reduced as much as possible and which is intrinsic or substantially intrinsic. One example of a high-purity oxide semiconductor is an oxide semiconductor the hydrogen concentration of which is $5\times10^{19}$ /cm$^3$ or less at most, preferably $5\times10^{18}$ /cm$^3$ or less, more preferably $5\times10^{17}$ /cm$^3$ or less, or less than $1\times10^{16}$ /cm$^3$. A transistor is formed using, for a channel formation region, an oxide semiconductor film the carrier concentration of which is less than $1\times10^{14}$ /cm$^3$, preferably less than $1\times10^{12}$ /cm$^3$, more preferably less than $1\times10^{11}$ /cm$^3$ or less than $6.0\times10^{10}$ /cm$^3$. Note that the concentration of hydrogen in the oxide semiconductor layer may be measured by secondary ion mass spectrometry (SIMS).

Further, it is preferable that the energy gap of the oxide semiconductor layer 103 be 2 eV or more, preferably 2.5 eV or more, more preferably 3 eV or more.

The high-purity oxide semiconductor layer, which is obtained by drastically removing hydrogen included in the oxide semiconductor layer as described above, is used for a channel formation region of a transistor, whereby a transistor with an extremely small off current value can be provided.

For example, even when a transistor including the high-purity oxide semiconductor layer has a channel length of 3 μm and a channel width of 10 mm, the transistor operates in such a manner that the drain current is $1\times10^{-13}$ A or less when the drain voltage is 1 V or 10 V and the gate voltage is in the range of −5 V to −20 V (that is, the transistor is in an off state).

Next, characteristics of a transistor including a high-purity oxide semiconductor layer are described with reference to FIG. 21, FIG. 22, FIGS. 23A and 23B, FIG. 24, FIG. 25, FIGS. 26A and 26B, and FIGS. 27A and 27B. Note that the following description is based on an ideal situation for ease of understanding and does not entirely reflect the actual situation. Note that the following description is just a consideration and is irrelevant to the validity of the present invention.

Figure 21:
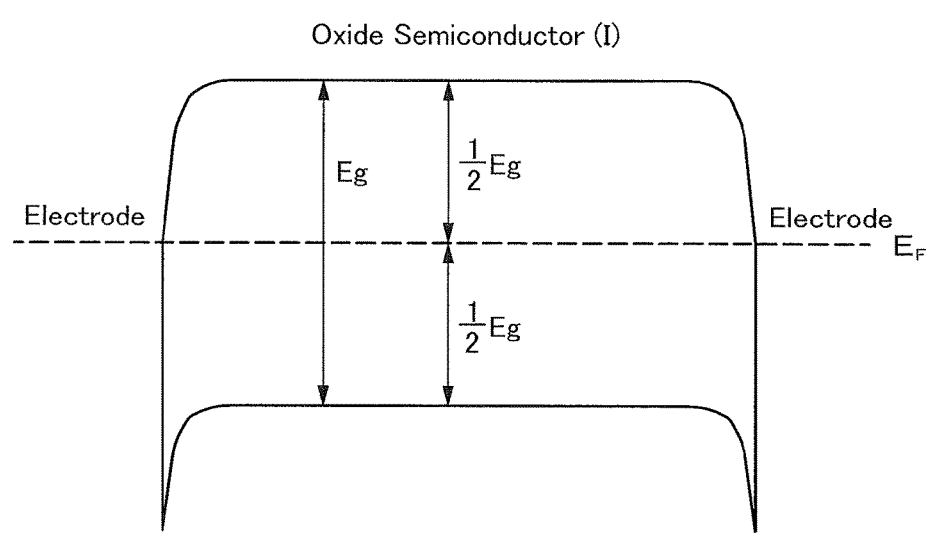
FIG. 21 illustrates a band structure between a source and a drain of a MOS transistor including an oxide semiconductor.

FIG. 21 is illustrates a source-drain band structure of a transistor including high-purity oxide semiconductor layer. Fermi level of the highly purified oxide semiconductor is located in the middle of the forbidden band in an ideal state. In an oxide semiconductor with a reduced hydrogen concentration, the number of minority carriers (holes in this case) is zero or extremely close to zero.

In this case, to obtain a flat band structure at the metal-oxide semiconductor junction interface, the following condition is given:

$$\phi_m = x - V_t \ln(N_d/N_c)$$

where $\phi_m$ is work function, x is electron affinity of an oxide semiconductor, $N_d$ is carrier density (electron density) of the oxide semiconductor in thermal equilibrium, and $N_c$ is effective density of states of the oxide semiconductor in the conduction band.

Here, $V_t$ is expressed as $V_t = k_b T/q$, where $k_b$ is Boltzmann constant, T is temperature, and q is elementary charge. When the right side of the equation $\phi_m = x - V_t \ln(N_d/N_c)$ is greater than the left side, an ohmic contact is provided. Here, at a junction interface, Fermi level of metal of an electrode is the same as the level of the conduction band of an oxide semiconductor, if the equation $\phi_m = x$ is satisfied. When it is assumed that the band gap of the oxide semiconductor is 3.05 eV, the electron affinity of the oxide semicondcutor is 4.3 eV, the oxide semiconductor is in an intrinsic state (the carrier density is approximately $1\times10^{-7}$/cm$^3$), and titanium (Ti) whose work function is 4.3 eV is used as the source electrode and the drain electrode, barrier is not formed against electrons as illustrated in FIG. 21.

Figure 22:
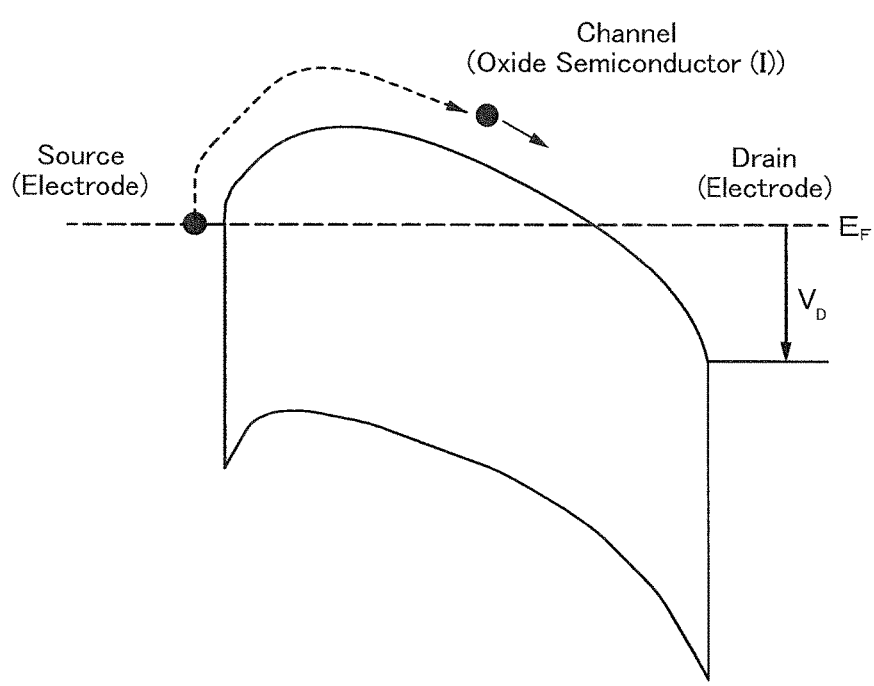
FIG. 22 illustrates the state where positive voltage is applied to the drain side in FIG. 19.

FIG. 22 illustrates a state where positive voltage is applied to the drain side in a transistor including an oxide semiconductor. Since the band gap of an oxide semiconductor is wide, the intrinsic carrier density of a highly purified oxide semiconductor which is intrinsic or substantially intrinsic is zero or extremely close to zero. However, it will be understood that carriers (electrons) are injected from the source side and flow into the drain side when positive voltage is applied to a gate and voltage is applied between a source and a drain.

Figure 23A:
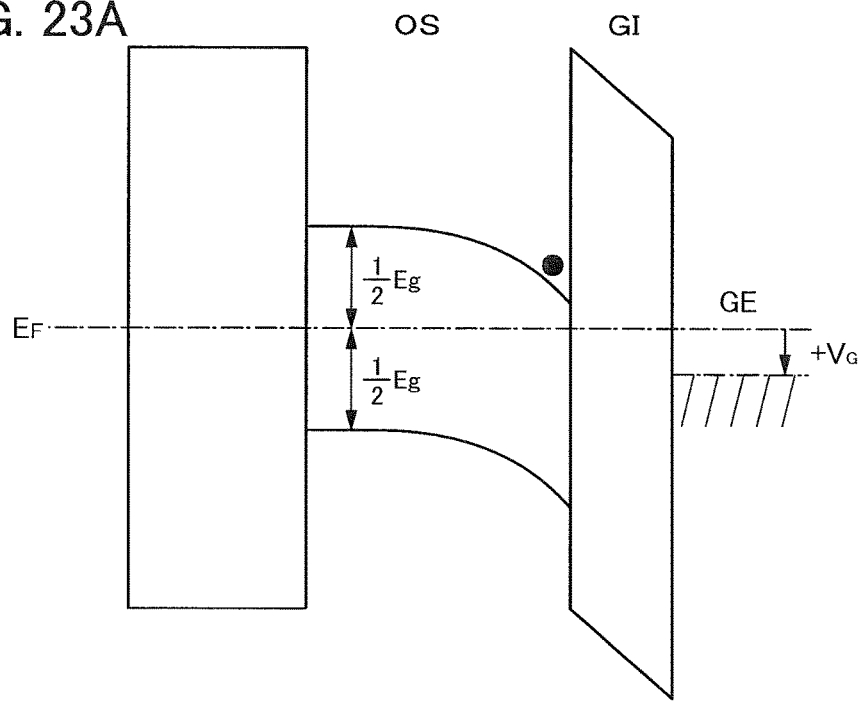
FIGS. 23A and 23B are energy band diagrams of a MOS structure of the MOS transistor including an oxide semiconductor, illustrating the case where gate voltage is positive and the case where the gate voltage is negative, respectively.

FIG. 23A is an energy band diagram of a MOS transistor including an oxide semiconductor, to which positive gate voltage is applied. In the drawing, GE represents a gate electrode, GI represents a gate insulating film, and OS represents an oxide semiconductor. In this case, almost no thermally excited carriers exist in a highly purified oxide semiconductor. Thus, carriers are not stored also in the vicinity of a gate insulating film. However, carriers injected from the source side can be transferred as illustrated in FIG. 22.

Figure 23B:
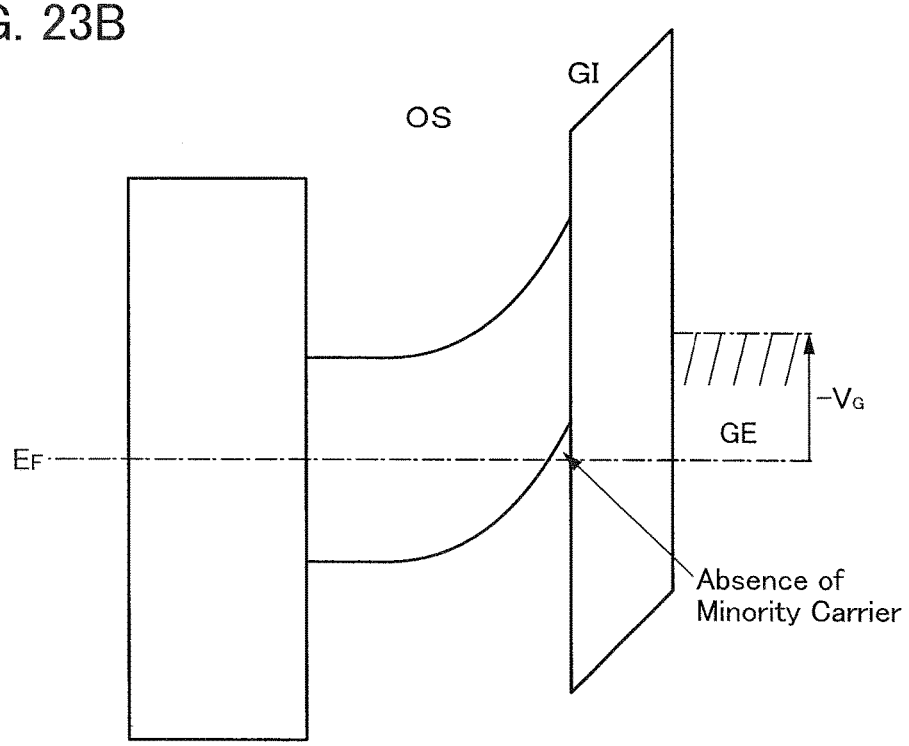

FIG. 23B is an energy band diagram of a MOS transistor including an oxide semiconductor, to which a negative gate voltage is applied. The number of minority carriers (holes) in the oxide semiconductor is substantially zero; thus, the current value between the source and the drain is extremely close to zero.

Figure 24:
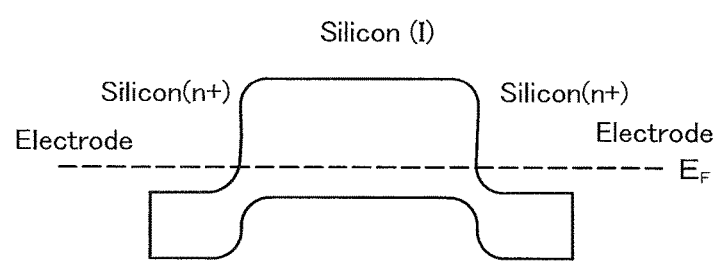
FIG. 24 illustrates a band structure between a source and a drain of a silicon MOS transistor.

FIG. 24 is a band diagram of a transistor including a silicon semiconductor. The intrinsic carrier density of a silicon semiconductor is $1.45 \times 10^{10}$ /cm$^3$ (300 K) and carriers exist even at room temperature. This means that thermally excited carriers exist even at room temperature. In practical use, a silicon wafer to which an impurity element such as phosphorus or boron is added is used; therefore, a silicon semiconductor practically has $1 \times 10^{14}$ /cm$^3$ or more carriers which contribute to conduction between the source and the drain. Further, since the band gap of a silicon semiconductor is 1.12 eV, off current of a transistor including a silicon semiconductor greatly changes depending on temperature.

As described above, not only by simply using an oxide semiconductor with a wide band gap for a transistor, but also by reducing impurities which form donors, such as hydrogen, to a very low level so that the carrier density be less than $1 \times 10^{14}$ /cm$^3$, preferably less than $1 \times 10^{12}$ /cm$^3$, more preferably less than $1 \times 10^{11}$ /cm$^3$ or less than $6.0 \times 10^{10}$ /cm$^3$, carriers which are thermally excited at a practical operation temperature can be eliminated, so that a transistor may be operated by only carriers injected from the source side. This makes it possible to reduce the off current to $1 \times 10^{-13}$ A or less and to obtain a transistor whose off current hardly changes due to temperature change and which is capable of extremely stable operation.

Next, measured values of off current using a test element group (also referred to as a TEG) will be described.

Figure 25:
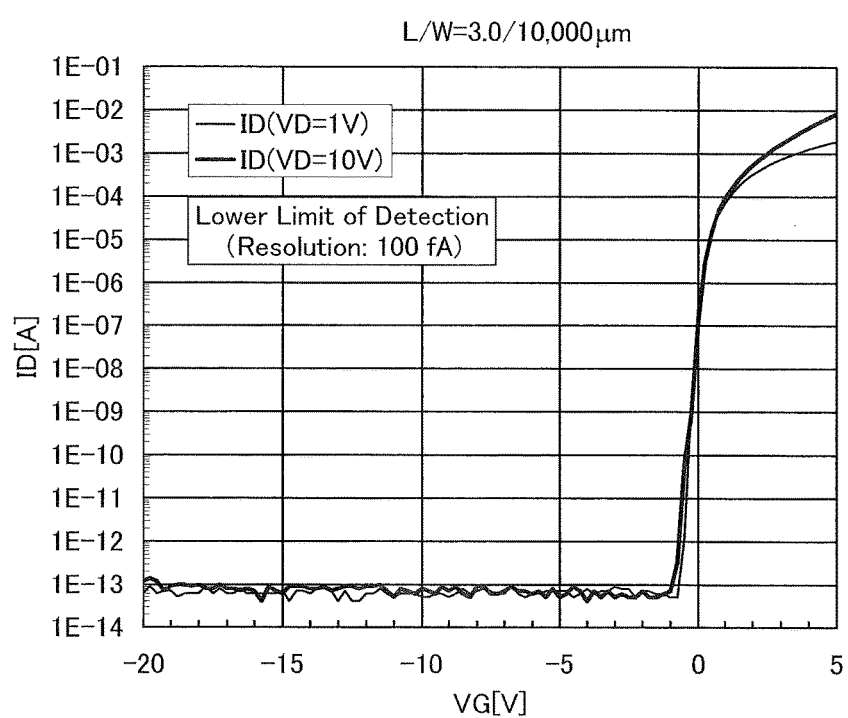
FIG. 25 is a graph showing initial characteristics of a transistor which is formed.
Figure 26A:
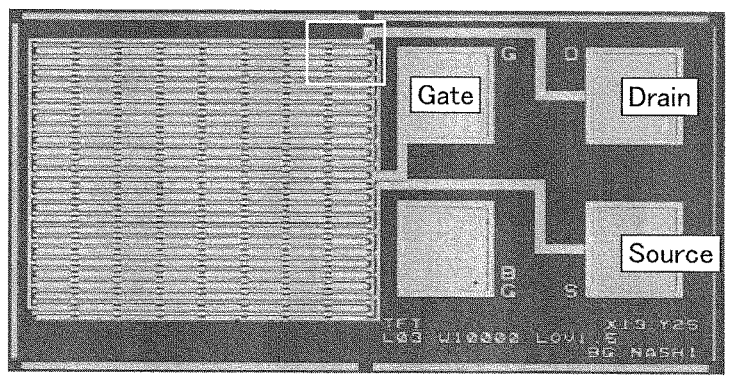
FIGS. 26A and 26B are top views of the transistor which is formed.
Figure 26B:
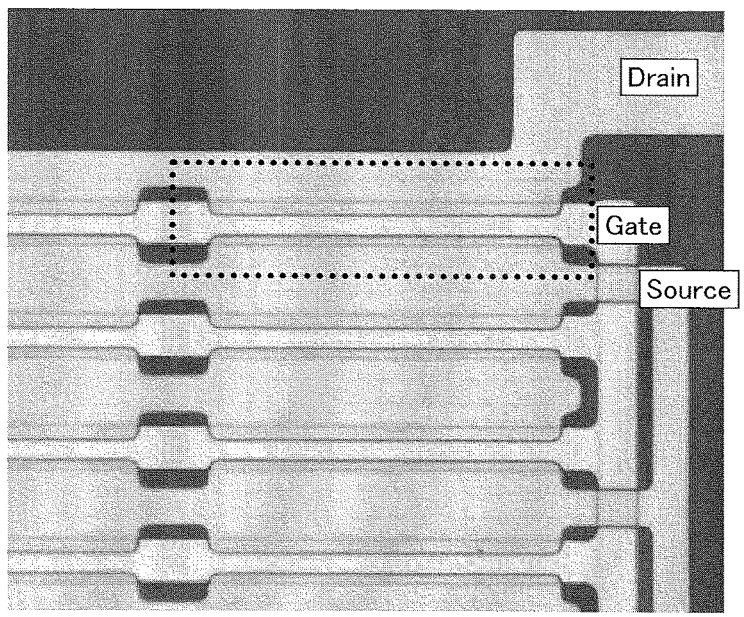

Two hundreds transistors each with L/W=3 μm/50 μm are connected in parallel; FIG. 25 shows initial characteristics of a transistor with L/W=3 μm/10000 μm. Here, Vg is in the range of from −20 V to 5+V. A top view is illustrated in FIG. 26A and a partially enlarged top view thereof is show in FIG. 26B. The region enclosed by a dotted line in FIG. 26B is a transistor of one stage with L/W=3 μm/50 μm and Lov=1.5 μm. In order to measure initial characteristics of the transistor, change of characteristics of the source-drain current (hereinafter referred to as a drain current or Id), i.e., Vg-Id characteristics, were measured, under the conditions where the substrate temperature was set to room temperature, the voltage between source and drain (hereinafter referred to as a drain voltage or Vd) was set to 10 V, and the voltage between source and gate (hereinafter referred to as a gate voltage or Vg) was changed from −20 V to +20 V.

As illustrated in FIG. 25, the transistor having a channel width W of 10000 μm has off current of $1 \times 10^{-13}$ A or less at Vd of 1 V and 10 V, which is less than or equal to the resolution (100 fA) of a measuring system (a semiconductor parameter analyzer, Agilent 4156C manufactured by Agilent Technologies Inc.).

Next, a method for manufacturing the transistor used for the measurement is described.

First, a silicon nitride layer was formed as a base layer over a glass substrate by a CVD method, and a silicon oxynitride layer was formed over the silicon nitride layer. A tungsten layer was formed as a gate electrode over the silicon oxynitride layer by a sputtering method. Here, the tungsten layer was selectively etched into the gate electrode.

Then, a silicon oxynitride layer having a thickness of 100 nm was formed as a gate insulating layer over the gate electrode by a CVD method.

Then, an oxide semiconductor layer having a thickness of 50 nm was formed over the gate insulating layer by a sputtering method using an In—Ga—Zn—O-based metal oxide target (at a molar ratio of $In_2O_3:Ga_2O_3:ZnO=1:1:2$). Then, the oxide semiconductor layer was selectively etched into an island-shaped oxide semiconductor layer.

Then, first heat treatment was performed on the oxide semiconductor layer in a nitrogen atmosphere in a clean oven at 450° C. for 1 hour.

Then, a titanium layer (having a thickness of 150 nm) was formed as a source electrode and a drain electrode over the oxide semiconductor layer by a sputtering method. Here, the source electrode and the drain electrode were selectively etched such that 200 transistors each having a channel length L of 3 μm and a channel width W of 50 μm were connected in parallel to obtain a transistor with L/W=3 μm/10000 μm.

Then, a silicon oxide layer having a thickness of 300 nm was formed as a protective insulating layer in contact with the oxide semiconductor layer by a reactive sputtering method. Here, the silicon oxide layer which is a protective insulating layer was selectively etched to form openings over the gate electrode, the source electrode, and the drain electrode. After that, second heat treatment was performed in a nitrogen atmosphere at 250° C. for one hour.

Then, heat treatment was performed at 150° C. for 10 hours before the measurement of Vg-Id characteristics.

Through the above process, a bottom-gate transistor was formed.

The reason why the off current of the transistor is approximately $1 \times 10^{-13}$ A as illustrated in FIG. 25 is that the hydrogen concentration of the oxide semiconductor layer was sufficiently reduced in the above manufacturing process. The hydrogen concentration in the oxide semiconductor layer is $5 \times 10^{19}$ atoms/cm$^3$ or less, preferably $5 \times 10^{18}$ atoms/cm$^3$ or less, more preferably $5 \times 10^{17}$ atoms/cm$^3$ or less or less than $1 \times 10^{16}$ atoms/cm$^3$. Note that the hydrogen concentration in the oxide semiconductor layer is measured by secondary ion mass spectrometry (SIMS).

Although the example of using an In—Ga—Zn—O-based oxide semiconductor has been described, this embodiment is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can be used. Furthermore, as an oxide semiconductor material, an In—Al—Zn—O-based oxide semiconductor to which $AlO_x$ is added at 2.5 wt % to 10 wt % or an In—Zn—O-based oxide semiconductor to which $SiO_x$ is added at 2.5 wt % to 10 wt % can be used.

The carrier concentration of the oxide semiconductor layer which is measured by a carrier measuring system is less than $1 \times 10^{14}$ /cm$^3$, preferably less than $1 \times 10^{12}$ /cm$^3$, more preferably less than $1 \times 10^{11}$ /cm$^3$ or less than $6.0 \times 10^{10}$ /cm$^3$. In other words, the carrier concentration of the oxide semiconductor layer can be extremely close to zero. Note that for measuring the carrier concentration, for example, a MOS capacitor may be formed and a CV measurement result (CV characteristics) thereof may be evaluated.

The channel length L of a transistor can be 10 nm to 1000 nm inclusive. In this case, a circuit operation speed can be increased. In addition, power consumption can be reduced because off current is extremely small.

Note that, in circuit design, the oxide semiconductor layer can be regarded as an insulator when the transistor is in an off state.

Then, the temperature characteristics of off current of the transistor formed in this embodiment were evaluated. Temperature characteristics are important in considering the environmental resistance, maintenance of performance, or the like of an end product including the transistor. It is to be understood that a smaller amount of change is more preferable and more flexible product designing will be allowed.

For the temperature characteristics, the Vg-Id characteristics were obtained using a constant-temperature chamber under the conditions where substrates provided with transistors were kept at respective constant temperatures of −30° C., 0° C., 25° C., 40° C., 60° C. 80° C., 100° C., and 120° C.; the drain voltage was set to 6 V; and the gate voltage was changed from −20 V to +20V.

Figure 27A:
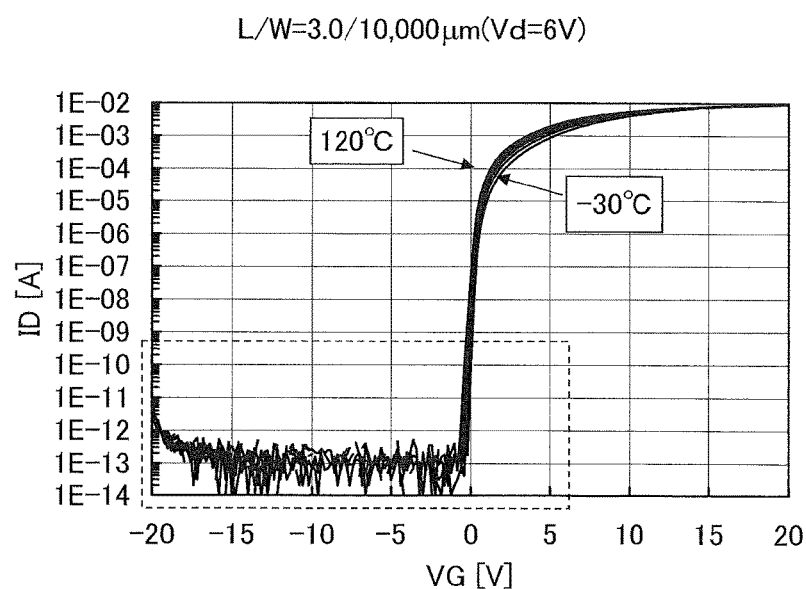
FIGS. 27A and 27B are graphs showing electric characteristics of the transistor which is formed.
Figure 27B:
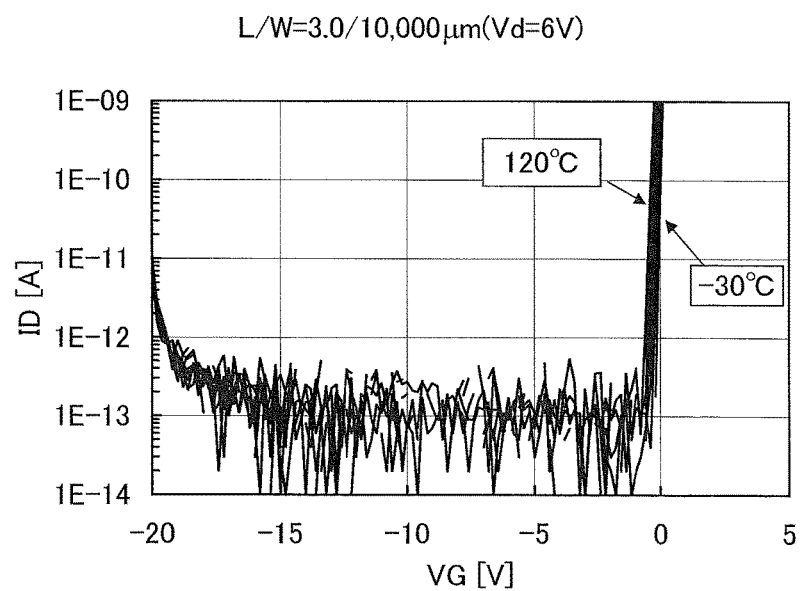

FIG. 27A shows Vg-Id characteristics measured at the above temperatures and interposed in the graph, and FIG. 27B shows an enlarged view of a range of off current enclosed by a dotted line in FIG. 27A. The rightmost curve indicated by an arrow in the graph is a curve obtained at −30° C.; the leftmost curve is a curve obtained at 120° C.; and curves obtained at the other temperatures are located therebetween. The temperature dependence of on current can hardly be observed. On the other hand, as is shown in the enlarged view of FIG. 27B, the off current is $1\times10^{-12}$ A or less, which is near the resolution of the measuring system, at all the temperatures except when the gate voltage is around −20 V, and the temperature dependence of the off current is not observed. In other words, even at a high temperature of 120° C., the off current is kept at $1\times10^{-12}$ A or less, and since the channel width W is 10000 μm, the off current is $1\times10^{-16}$ A/μm, which is extremely small.

A transistor including a purified oxide semiconductor (purified OS) shows almost no temperature dependence of off current. It can be said that an oxide semiconductor does not show temperature dependence when purified because the conductivity type becomes extremely close to an intrinsic type and the Fermi level is located in the middle of the forbidden band, as illustrated in the band diagram of FIG. 21. This also results from the fact that the oxide semiconductor has an energy gap of 3 eV or more and includes very few thermally excited carriers. In addition, the source region and the drain region are in a degenerated state, which is also a factor for not showing temperature dependence. The transistor is operated mainly with carriers which are injected from the degenerated source region into the oxide semiconductor, and the above characteristics (independence of off current on temperature) can be explained by independence of the carrier density on temperature.

As described above, even in a transistor having a channel width W of $1\times10^4$ μm and a channel length of 3 μm, excellent electric characteristics, off current of $10^{-13}$ A or less and the subthreshold swing (S value) of 0.1 V/dec. (the thickness of the gate insulating film is 100 nm), can be obtained. By highly purifying the oxide semiconductor so that the amount of impurities in the oxide semiconductor may be as small as possible, favorable operation of the transistor can thus be realized. The above transistor including the oxide semiconductor layer can have off current of 10 aA/μm ($1\times10^{-17}$ A/μm) or less per channel width of 1 μm, or even 1 aA/μm ($1\times10^{-18}$ A/μm) or less. When a transistor having an extremely small value of off current (off current value) is used as the first transistor 6401, an electrical signal such as an image signal can be held for a longer period of time. For example, a writing interval can be 10 seconds or longer, preferably 30 seconds or longer, more preferably 1 minute or more and less than 10 minutes. An increase in writing interval leads to a further reduction in power consumption.

On the other hand, design or the like is performed while estimating the amount of the off current of a transistor including low-temperature polysilicon at around $1\times10^{-12}$ A, for example. Thus, the voltage holding period of a transistor including an oxide semiconductor can be approximately $10^5$ times as long as the voltage holding period of a transistor including low-temperature polysilicon, when the storage capacitance is substantially the same (approximately 0.1 pF). Further, a transistor including amorphous silicon has off current of $1\times10^{-13}$ A/μm or greater per channel width of 1 μm. Thus, the voltage holding period of a transistor including a high-purity oxide semiconductor can be approximately $10^4$ times as long as the voltage holding period of a transistor including amorphous silicon, when the storage capacitance is substantially the same (approximately 0.1 pF).

For example, display is performed at 60 frames per second (16 msec per one frame) in a pixel including a transistor which includes low-temperature polysilicon. The same can be said for a case of still image display because a decrease in rate (an increase in writing interval) will cause a decrease in voltage of a pixel and a defect of display. In contrast, in the case where the transistor including the above oxide semiconductor layer is used, since off current is small, the holding period of one signal writing can be approximately 1600 seconds, that is, $10^5$ times as long as that of the transistor including low-temperature polysilicon. Thus, a still image can be displayed on a display portion even with a small number of writing of image signals. Because the holding period can be extended, the frequency of signal writing can be decreased particularly when a still image is displayed. For example, the number of times of writing into a pixel during one still-image display period (approximately 1600 seconds) can be one when a transistor including the oxide semiconductor layer is used, whereas the number needs to be approximately $10^5$ when a transistor including low-temperature polysilicon is used. Thus, a reduction in power consumption of a display device can be achieved.

Figure 4:
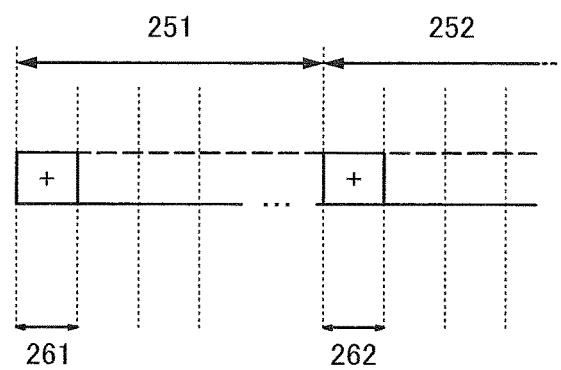
FIG. 4 illustrates a relation between a writing period and a holding period of a pixel.

FIG. 4 shows a relation between a writing period to the display portion and a holding period (also referred to as one frame period). In FIG. 4, periods 251 and 252 each are a holding period, and periods 261 and 262 each are a writing period to the display portion. When the above transistor including a high-purity oxide semiconductor layer is used, the holding period can be set longer. Therefore, the frequency of writing into a pixel can be drastically decreased particularly when a still image is displayed. Therefore, in the case of displaying a still image or the like which involves less frequent changes in display, power consumption can be reduced.

In displaying a still image, refresh operation can be performed as appropriate during the holding period, in accordance with the holding rate of the voltage applied to a gate of a driver transistor. For example, the refresh operation can be performed at the time when the voltage in the gate of the driver transistor reaches a predetermined level with respect to a value (initial value) of a voltage just after the signal writing into the gate of the driver transistor. The predetermined level is preferably set, with respect to the initial value, to a voltage at which flickers are not sensed.

Specifically, in the case where a picture is an object to be displayed, refresh operation (rewriting) is preferably performed every time the voltage reaches a value lower than the initial value by 1.0%, preferably 0.3%. In the case where characters are objects to be displayed, refresh operation (rewriting) is preferably performed every time the voltage reaches a value lower than the initial value by 10%, preferably 3%.

As an example of a driving method of the light-emitting element 6404, a method of performing analog gray scale driving will be described. Voltage higher than or equal to voltage which is the sum of the forward voltage of the light-emitting element 6404 and Vth of the second transistor 6402 is applied to the gate of the second transistor 6402. Here, the forward voltage of the light-emitting element 6404 indicates a voltage at which a desired luminance is obtained, and includes at least the forward threshold voltage. For example, by inputting a video signal (an image signal) which enables the second transistor 6402 to operate in a saturation region, current can be supplied to the light-emitting element 6404. Note that in order for the second transistor 6402 to operate in the saturation region, the potential of the power supply line 6407 is set higher than the gate potential of the second transistor 6402. When an analog video signal is used, it is possible to feed current to the light-emitting element 6404 in accordance with the video signal and perform analog grayscale driving.

Further, a voltage-input voltage-driving method enables an area grayscale display using a plurality of pixels, color display by combination (e.g., R+G, G+B, R+B, and R+G+B) of a plurality of pixels having different emission colors (e.g., R, G, and B), and the like. In the case of the voltage-input voltage-driving method, a signal which makes the second transistor 6402 be completely turned on or off is input to the gate of the second transistor 6402. That is, the second transistor 6402 operates in a linear region. Note that in order for the second transistor 6402 to operate in the linear region, the voltage of the power supply line 6407 is set lower than the gate potential of the second transistor 6402. Specifically, a voltage signal which supplies a potential equal to or higher than the sum of the potential of the power supply line and the threshold voltage of the second transistor 6402 may be applied to the signal line 6405.

Note that also in the case where the light-emitting element 6404 is driven by an analog grayscale driving method or a voltage-input voltage-driving method, the gate potential of the second transistor 6402 can be held for a long time because off current of the switching transistor 6401 is suppressed to, for example, $1\times10^{-16}$ A/μm or less. Therefore, still image display can be performed on a display portion even by less frequent writing of image signals. The frequency of writing of signals can be reduced, which leads to a reduction in power consumption. The pixel structure is not limited to that illustrated in FIG. 2. For example, a switch, a resistor, a capacitor, a transistor, a logic circuit, or the like may be added to the pixel illustrated in FIG. 2.

As an example of a light-emitting element, a light-emitting element utilizing electroluminescence is given. Light-emitting elements utilizing electroluminescence are classified according to whether the light-emitting material is an organic compound or an inorganic compound. In general, the former is referred to as an organic EL element, and the latter is referred to as an inorganic EL element.

An organic EL element includes a pair of electrodes (an anode and a cathode) and a layer including an organic compound interposed therebetween. When a potential of the anode is higher than that of the cathode, holes and electrons are injected into the layer including the organic compound from the anode and the cathode, respectively. When electrons and holes (carriers) are recombined in the layer including an organic compound, light is emitted.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light-emission that utilizes a donor level and an acceptor level. A thin-film inorganic EL element has a structure where a light-emitting layer is sandwiched between dielectric layers, which are further sandwiched between electrodes, and its light emission mechanism is localized type light-emission that utilizes inner-shell electron transition of metal ions.

Note that although an organic EL element is given as a light-emitting element in this embodiment, the present invention is not limited to this structure. In other words, an inorganic EL element can be used as a light-emitting element in the present invention.

Next, a cross-sectional structure of a display device including a light-emitting element will be described with reference to FIGS. 5A to 5C. Note that driver transistors 7001, 7011, and 7021 illustrated as examples in FIGS. 5A to 5C each may be a transistor including a high-purity oxide semiconductor layer or a transistor including a silicon layer. In this embodiment, the driver transistors 7001, 7011, and 7021 include a high-purity oxide semiconductor layer as an active layer.

The light-emitting element given as an example in this embodiment has a structure in which an electroluminescence layer (an EL layer) is sandwiched between a pair of electrodes (a first electrode and a second electrode). One of the first electrode and the second electrode serves as an anode and the other serves as a cathode.

As a material for the anode, for example, a metal which has a high work function (specifically, 4.0 eV or higher), or an alloy, conductive compound, or mixture thereof is preferably used. Specifically, indium tin oxide (ITO), indium tin oxide containing silicon or silicon oxide, indium zinc oxide (IZO), indium oxide containing tungsten oxide and zinc oxide (IWZO), and the like can be given. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be given.

As a material for the cathode, for example, a metal which has a low work function (specifically, 3.8 eV or lower), or an alloy, conductive compound, or mixture thereof is preferably used. Specifically, an element belonging to Group 1 or 2 of the periodic table, that is, an alkali metal such as lithium (Li) and cesium (Cs), an alkaline earth metal such as magnesium (Mg), calcium (Ca), and strontium (Sr), and the like can be given. Further, an alloy including an alkali metal or an alkaline earth metal (e. g., MgAg or AlLi) can be used. Further, a rare earth metal such as europium (Eu) or ytterbium (Yb), or an alloy including a rare earth metal can be used. In the case where an electron-injection layer which is in contact with the second electrode is provided as part of the EL layer, a variety of conductive materials such as Al, Ag, or ITO can be used for the second electrode regardless of the magnitude of their work functions. A film of such a conductive material can be formed by a sputtering method, an ink jetting method, a spin coating method, or the like.

Although the EL layer can be formed to have a single-layer structure, it is generally formed to have a stacked-layer structure. There is no particular limitation on the stacked-layer structure of the EL layer. The EL layer may be formed by any appropriate combination of a layer containing a substance having a high electron-transport property (an electron-transport layer), a layer containing a substance having a high hole-transport property (a hole-transport layer), a layer containing a substance having a high electron-injection property (electron-injection layer), a layer containing a substance having a high hole-injection property (a hole-injection layer), a layer containing a bipolar substance (a substance having a high electron-transport property and a high hole-transport property), a layer containing a light-emitting material (a light-emitting layer), or the like. For example, the EL layer can be formed in an appropriate combination of a hole-injection layer, a hole-transport layer, a light-emitting layer, an electron-transport layer, an electron-injection layer, and the like. Alternatively, a plurality of EL layers which are separated by an intermediate layer serving as a charge generation layer may be provided between the first electrode and the second electrode.

At least one of the first electrode and the second electrode is formed using a light-transmitting conductive film so that light is extracted from the light-emitting element. According to the classification based on the direction in which light emitted from the light-emitting element formed over a substrate is extracted, there are three typical structures of light-emitting elements: a top emission structure in which light is extracted from the side of the substrate where the light-emitting element is formed, a bottom emission structure in which light is extracted from the opposite side of the substrate from the light-emitting element, and a dual emission structure in which light is emitted from both the side of the substrate where the light-emitting element is forming and the opposite side. The present invention can be applied to a light emitting element having any of these emission structures.

In the case where the EL layer is stacked over the first electrode, a peripheral portion of the first electrode is covered with a partition. The partition may be formed using, for example, an organic resin film of polyimide, acrylic resin, polyamide, or epoxy resin; an inorganic insulating film, or organic polysiloxane. For example, the partition is preferably formed using a photosensitive resin material. If a photosensitive resin material is used, a side surface of an opening in the partition is formed as an inclined surface with a continuous curvature and a step of forming a resist mask can be omitted.

Note that a color filter can be formed between the substrate and the light-emitting element. The color filter may be formed by a droplet discharge method such as an ink jetting method, a printing method, an etching method using a photolithography technique, or the like.

Further, it is preferable that an overcoat layer be formed over the color filter and a protective insulating layer be additionally formed. The provision of the overcoat layer can eliminate unevenness caused by the color filter. The provision of the protective insulating film can prevent impurities from being dispersed from the color filter to the light-emitting element.

Note that in the case where the light-emitting element is formed over the protective insulating layer, the overcoat layer, and the insulating layer which are formed over the transistor, a contact hole which penetrates the protective insulating layer, the overcoat layer, and the insulating layer and reaches a source electrode or a drain electrode of the transistor is formed. In particular, the contact hole is preferably formed at a position overlapping with the above partition, in which case the aperture ratio can be prevented from being reduced.

Next, a structural example of the pixel including a light-emitting element having a bottom emission structure will be described. FIG. 5A is a cross-sectional view of the driver transistor 7011 and a light-emitting element 7012 which are provided in the pixel.

In the driver transistor 7011, an insulating layer, an oxide semiconductor layer, a source and drain electrodes, a gate insulating layer, and a gate electrode are provided over a substrate, and wiring layers are provided so as to be electrically connected to the source and drain electrodes.

An insulating layer 7031 is formed to cover the driver transistor 7011, and a color filter 7033 having an opening is provided over the insulating layer 7031. A light-transmitting conductive film 7017 is formed over an overcoat layer 7034 and a protective insulating layer 7035 which are formed to cover the color filter 7033. Note that the drain electrode of the driver transistor 7011 and the conductive film 7017 are electrically connected to each other through an opening formed in the overcoat layer 7034, the protective insulating layer 7035, and the insulating layer 7031. Note that a first electrode 7013 of the light-emitting element 7012 is provided on and in contact with the conductive film 7017.

In the light-emitting element 7012, an EL layer 7014 is sandwiched between the first electrode 7013 and a second electrode 7015.

As the light-transmitting conductive film 7017, a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used.

Here, the case where the first electrode 7013 of the light-emitting element 7012 is used as a cathode will be described. In the case where the first electrode 7013 is used as a cathode, it is preferably formed using a metal having a low work function. In FIG. 5A, the thickness of the first electrode 7013 is set so that light can be transmitted (preferably, approximately 5 nm to 30 nm). For example, an aluminum film or an Mg—Ag alloy film having a thickness of 20 nm is used as the first electrode 7013.

Note that the light-transmitting conductive film and the aluminum film may be stacked and then selectively etched to form the light-transmitting conductive film 7017 and the first electrode 7013; in this case, the light-transmitting conductive film 7017 and the first electrode 7013 can be etched using the same mask, which is preferable.

For the second electrode 7015 formed over the EL layer 7014, a material having a high work function is preferably used. Further, a blocking film 7016, for example, a metal which blocks light or a metal which reflects light is provided over the second electrode 7015. In this embodiment, an ITO film is used as the second electrode 7015, and a Ti film is used as the blocking film 7016.

The color filter 7033 is covered with the overcoat layer 7034, and further covered with the protective insulating layer 7035. Note that although the overcoat layer 7034 has a small thickness in FIG. 5A, the overcoat layer 7034 has a function to planarize roughness due to the color filter 7033.

A contact hole which is formed in the overcoat layer 7034 and the protective insulating layer 7035 and reaches the drain electrode 7030 is positioned to overlap with the partition 7019.

Figure 5A:
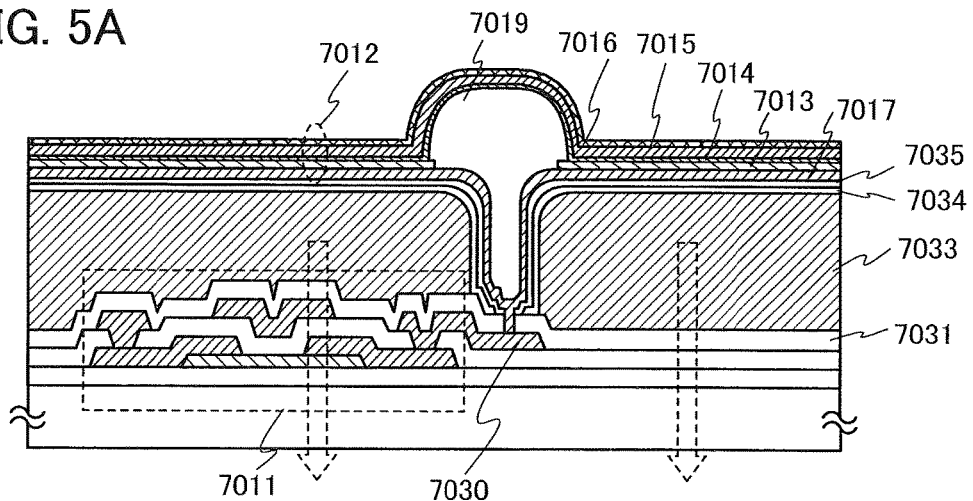
FIGS. 5A to 5C are cross-sectional views each illustrating a structural example of a pixel.

In the pixel structure illustrated in FIG. 5A, light is emitted from the light-emitting element 7012 to the first electrode 7013 side and to the outside through a color filter 7033 as indicated by an arrow.

Note that it is preferable that a light-transmitting conductive film be used as a gate electrode, a source electrode, and a drain electrode of the driver transistor 7011 and that a light-transmitting high-purity oxide semiconductor layer be used for a channel formation region of the driver transistor 7011. In this case, as is illustrated in FIG. 5A, light emitted from the light-emitting element 7012 is emitted outside not only through the color filter 7033, but through the driver transistor 7011, which leads to an improvement in aperture ratio. Further, by using a light-transmitting high-purity oxide semiconductor layer for the channel formation region of the driver transistor 7011, off current of the driver transistor 7011 can be extremely small; therefore, an area of an electrode for forming a storage capacitor can be reduced compared to a conventional case. Accordingly, the aperture ratio can be further improved.

Next, a structural example of the pixel including a light-emitting element having a dual emission structure will be described. FIG. 5B is a cross-sectional view of the driver transistor 7021 and a light-emitting element 7022 which are provided in the pixel.

In the driver transistor 7021, an insulating layer, an oxide semiconductor layer, a source and drain electrodes, a gate insulating layer, and a gate electrode are provided over a substrate, and wiring layers are provided so as to be electrically connected to the source and drain electrodes.

An insulating layer 7041 is formed to cover the driver transistor 7021, and a color filter 7043 having an opening is provided over the insulating layer 7041. A light-transmitting conductive film 7027 is formed over an overcoat layer 7044 and an insulating layer 7045 which are fainted to cover the color filter 7043. Note that the drain electrode of the driver transistor 7021 and the conductive film 7027 are electrically connected to each other through an opening formed in the overcoat layer 7044, the insulating layer 7045, and the insulating layer 7041. Note that a first electrode 7023 of the light-emitting element 7022 is provided on and in contact with the conductive film 7027.

In the light-emitting element 7022, an EL layer 7024 is sandwiched between the first electrode 7023 and a second electrode 7025.

Here, the case where the first electrode 7023 of the light-emitting element 7022 is used as a cathode will be described. The light-transmitting conductive film 7027 may be formed in a manner similar to the conductive film 7017 illustrated in FIG. 5A. The first electrode 7023 may be formed in a manner similar to the first electrode 7013 illustrated in FIG. 5A. The EL layer 7024 may be formed in a manner similar to the EL layer 7014 illustrated in FIG. 5A. Therefore, detailed description of those layers is not given here.

A second electrode 7025 formed over the EL layer 7024 serves as an anode here, and is preferably formed using a material having a high work function, for example, a transparent conductive material such as ITO, IZO, or ZnO. In this embodiment, ITO is used for the second electrode 7025.

The color filter 7043, the overcoat layer 7044, and the protective insulating layer 7045 may be respectively formed in a manner similar to the color filter 7033, the overcoat layer 7034, and the protective insulating layer 7035 included in the pixel illustrated in FIG. 5A.

Figure 5B:
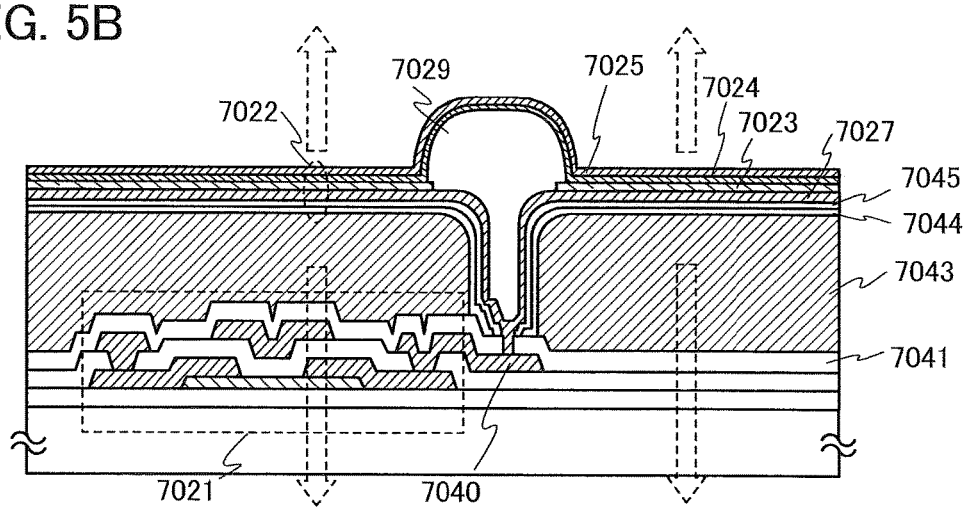

In the element structure illustrated in FIG. 5B, light is emitted from the light-emitting element 7022 to both the first electrode 7023 side and the second electrode 7025 side as indicated by arrows. Light emitted to the first electrode 7023 side passes through the color filter 7043 to the outside of the display device.

Note that FIG. 5B illustrates an example in which the driver transistor 7021 includes the gate electrode, the source electrode, and the drain electrode which are formed using light-transmitting conductive films. Thus, part of light emitted from the light-emitting element 7022 passes through the color filter 7043 and the driver transistor 7021 to the outside.

A contact hole which is formed in the overcoat layer 7044 and the protective insulating layer 7045 and reaches the drain electrode 7040 is positioned to overlap with a partition 7029. The contact hole which reaches the drain electrode and the partition 7029 overlap with each other, whereby the aperture ratio on the second electrode 7025 side can be approximately the same as the aperture ratio on the first electrode 7023 side.

Note that since light emitted from the second electrode 7025 side does not pass through the color filter 7043, when a light-emitting element having a dual emission structure is used and full color display is performed on both display surfaces, a sealing substrate provided with another color filter is preferably provided over the second electrode 7025.

Next, a structural example of the pixel including a light-emitting element having a top emission structure will be described. FIG. 5C is a cross-sectional view of the driver transistor 7001 and a light-emitting element 7002 which are provided in the pixel.

In the driver transistor 7001, an insulating layer, an oxide semiconductor layer, a source and drain electrodes, a gate insulating layer, and a gate electrode are provided over a substrate, and wiring layers are provided so as to be electrically connected to the source and drain electrodes.

An insulating layer 7051 is formed to cover the driver transistor 7001, and an insulating layer 7053 having an opening is provided over the insulating layer 7051. A first electrode 7003 is formed over an insulating layer 7055 which is formed to cover the insulating layer 7053. Note that the drain electrode of the driver transistor 7001 and the first electrode 7003 are electrically connected to each other through an opening formed in the insulating layer 7055 and the insulating layer 7051.

Note that for the insulating layer 7053, a resin material such as polyimide, acrylic resin, benzocyclobutene resin, or polyamide can be used. As an alternative to such resin materials, it is possible to use a low-dielectric constant material (a low-k material), a siloxane-based resin, phosphosilicate glass (PSG), borophosphosilicate glass (BPSG), or the like. Note that the insulating layer 7053 may be formed by stacking a plurality of insulating films formed of any of these materials. The method for forming the insulating layer 7053 is not particularly limited. Depending on the material, the insulating layer 7053 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like. For example, the formation of the insulating layer 7053 can eliminate unevenness caused by the driver transistor. In addition, a contact hole which is formed in the insulating layer 7055 and the insulating layer 7053 and reaches the drain electrode 7050 is positioned to overlap with a partition 7009.

In the light-emitting element 7002, an EL layer 7004 is sandwiched between the first electrode 7003 and a second electrode 7005. The case where the first electrode 7003 is used as a cathode of the light-emitting element 7002 illustrated as an example in FIG. 5C will be described.

A material similar to that of the first electrode 7013 illustrated in FIG. 5A may be used for the first electrode 7003. However, it is preferable that in the light-emitting element having a top emission structure illustrated in FIG. 5C, the first electrode 7003 preferably has high reflectance rather than a light-transmitting property. The use of an electrode having high reflectance makes it possible to increase light extraction efficiency.

As the first electrode 7003, for example, an aluminum film, an alloy film containing aluminum as a main component, or a stacked-layer in which a titanium film is formed over an aluminum film is preferably used. In FIG. 5C, a stacked-layer film in which a Ti film, an aluminum film, and a Ti film are stacked in this order is used as the first electrode 7003.

The EL layer 7004 may be formed in a manner similar to that of the EL layer 7014 illustrated in FIG. 5A. The second electrode 7005 may be formed in a manner similar to that of the second electrode 7025 illustrated in FIG. 5B. Therefore, detailed description is not given here.

Figure 5C:
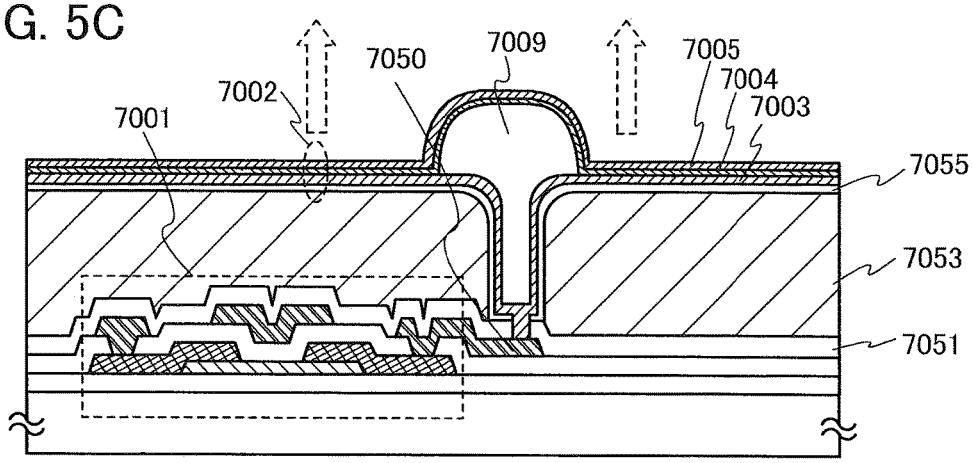

In the element structure illustrated in FIG. 5C, light is emitted from the light-emitting element 7002 to the second electrode 7005 side as indicated by an arrow.

When full color display is performed with the structure of FIG. 5C, for example, the light-emitting element 7002 is used as a green light-emitting element, one of the adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as the three kinds of light-emitting elements.

In the structure of FIG. 5C, a light-emitting display device capable of full color display may be manufactured in such a way that all of a plurality of light-emitting elements which are arranged is white light-emitting elements and a sealing substrate having a color filter or the like is provided over the light-emitting elements including the light-emitting element 7002. When a material which exhibits a single color such as white is formed and then combined with a color filter or a color conversion layer, full color display can be performed.

Further, an optical film such as a circularly polarizing plate may be provided if needed.

Figure 6A:
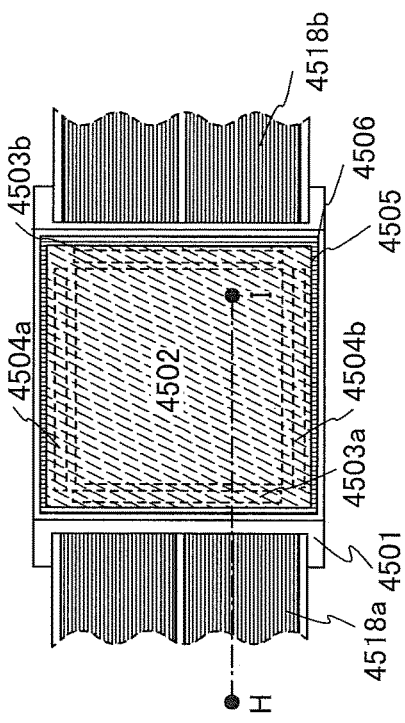
FIGS. 6A and 6B are a plan view and a cross-sectional view illustrating an example of a light-emitting display panel.
Figure 6B:
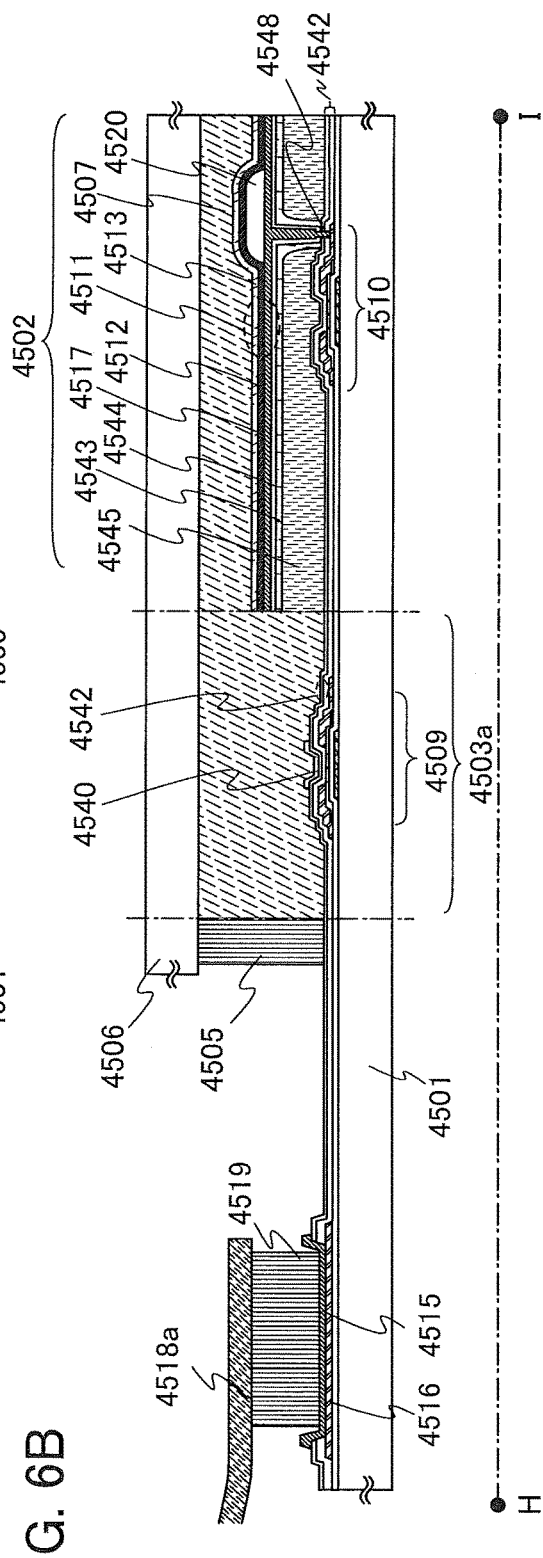

Next, the appearance and a cross section of a light-emitting display panel (also referred to as a light-emitting panel), which is one embodiment of a display device, will be described with reference to FIGS. 6A and 6B. FIG. 6A is a plan view of a panel in which transistors and a light-emitting element which are formed over a first substrate are sealed between the first substrate and a second substrate with a sealant. FIG. 6B is a cross-sectional view taken along line H-I in FIG. 6A.

A sealant 4505 is provided so as to surround a pixel portion 4502, signal line driver circuits 4503*a* and 4503*b*, and scan line driver circuits 4504*a* and 4504*b*, which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be thus packaged (sealed) with a protective film (such as a bonding film or an ultraviolet curable resin film) or a cover material with high air-tightness and little degasification so that the pixel portion 4502, the signal line driver circuits 4503*a* and 4503*b*, the scan line driver circuits 4504*a* and 4504*b* are not exposed to air.

The pixel portion 4502, the signal line driver circuits 4503*a* and 4503*b*, and the scan line driver circuits 4504*a* and 4504*b* which are formed over the first substrate 4501 each include a plurality of transistors. A transistor 4510 included in the pixel portion 4502 and a transistor 4509 included in the signal line driver circuit 4503*a* are illustrated as an example in FIG. 6B. Insulating layers 4542 to 4545 are provided over the transistors 4509 and 4510. In addition, a source electrode or a drain electrode 4548 of the transistor 4510 is electrically connected to a first electrode layer 4517 of a light-emitting element 4511 through a contact hole formed in the insulating layers 4542 to 4545.

In this embodiment, a transistor including a high-purity oxide semiconductor layer is used as the transistor 4509 in the signal line driver circuit 4503*a* and the transistor 4510 in the pixel portion 4502.

A conductive layer 4540 is provided over a part of the insulating layer 4542, which overlaps with a channel formation region of an oxide semiconductor layer in the transistor 4509 for the driver circuit. The conductive layer 4540 is provided at the position overlapping with the channel formation region in the oxide semiconductor layer, whereby the amount of change in threshold voltage of the transistor 4509 before and after BT stress test (bias-temperature stress test) can be reduced. In this specification, the BT stress test (the bias-temperature stress test) refers to a test in which high gate voltage is applied to a transistor in a high-temperature atmosphere. A potential of the conductive layer 4540 may be the same or different from that of a gate electrode of the transistor 4509. The conductive layer 4540 can also serves as a second gate electrode. Alternatively, the potential of the conductive layer 4540 may be GND or 0 V, or the conductive layer 4540 may be in a floating state.

Note that although the light-emitting element 4511 has a stacked-layer structure including the first electrode layer 4517, an electroluminescent layer 4512, and a second electrode layer 4513, the structure of the light-emitting element 4511 is not limited thereto. The structure of the light-emitting element 4511 can be changed as appropriate depending on, for example, the direction in which light is extracted from the light-emitting element 4511.

A partition 4520 is formed using an organic resin film, an inorganic insulating film, or organic polysiloxane. It is particularly preferable that the partition be formed using a photosensitive material to have a sidewall of the partition 4520 be formed as an inclined surface with a continuous curvature.

The electroluminescent layer 4512 may be formed using either a single layer or a stack of plural layers.

In order to prevent entry of oxygen, hydrogen, moisture, carbon dioxide, or the like into the light-emitting element 4511, a protective film may be formed over the second electrode layer 4513 and the partition 4520. As the protective film, a silicon nitride film, a silicon nitride oxide film, a DLC film, or the like can be formed.

In addition, a variety of signals and potentials are supplied from FPCs 4518*a* and 4518*b* to the signal line driver circuits 4503*a* and 4503*b*, the scan line driver circuits 4504*a* and 4504*b*, or the pixel portion 4502.

A connection terminal electrode 4515 is formed using the same conductive film as the first electrode layer 4517 included in the light-emitting element 4511. Further, a terminal electrode 4516 is formed using the same conductive film as the source electrode and the drain electrode included in the transistors 4509 and 4510.

The connection terminal electrode 4515 is electrically connected to a terminal included in the FPC 4518a via an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic resin film is used.

As the filler 4507, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene with vinyl acetate (EVA) can be used. For example, nitrogen may be used as the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Further, the polarizing plate or the circularly polarizing plate may be provided with an anti-reflection film. For example, anti-glare treatment by which reflected light can be diffused by projections and depressions of the surface so as to reduce the glare can be performed.

Note that the present invention is not limited to the structure in FIGS. 6A and 6B. As the signal line driver circuits 4503a and 4503b and the scan line driver circuits 4504a and 4504b, driver circuits formed by using a single crystal semiconductor film or a polycrystalline semiconductor film over a substrate separately prepared may be mounted. Alternatively, only the signal line driver circuits or part thereof, or only the scan line driver circuits or part thereof may be separately formed and mounted.

(Embodiment 2)

In this embodiment, a structure which leads to a further reduction in power consumption of a display device will be described. Specifically, a structure where power consumption is reduced not only in a pixel portion of a display device, but also in a driver circuit portion of the display device will be described.

Figure 7:
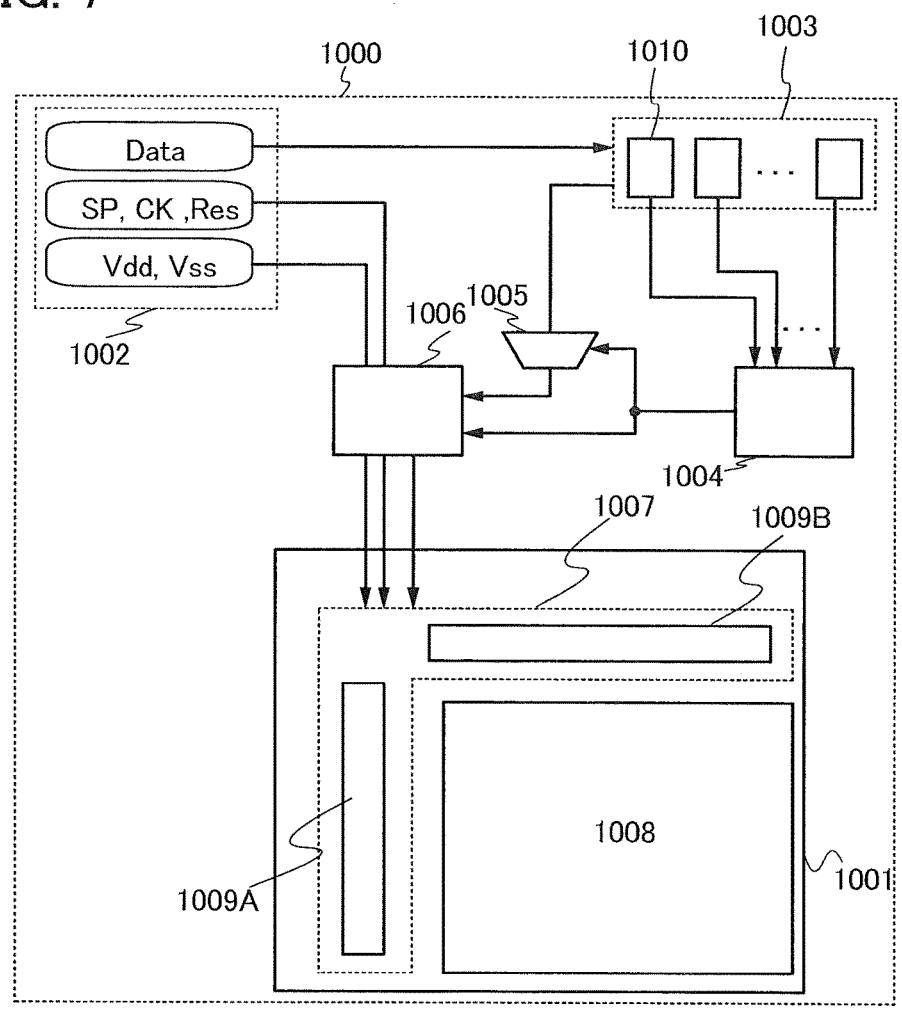
FIG. 7 is an example of a block diagram illustrating a display device.

FIG. 7 is a block diagram illustrating an example of a display device. Note that the present invention is not limited to the structure in FIG. 7.

A display device 1000 in FIG. 7 includes a display panel 1001, a signal generation circuit 1002, a memory circuit 1003, a comparison circuit 1004, a selection circuit 1005, and a display control circuit 1006. The display panel 1001 includes a driver circuit portion 1007 and a pixel portion 1008. The driver circuit portion 1007 includes a gate line driver circuit 1009A and a signal line driver circuit 1009B. The gate line driver circuit 1009A and the signal line driver circuit 1009B have a function to drive the pixel portion 1008 including a plurality of pixels.

As a transistor included in the pixel portion 1008, the transistor described in Embodiment 1 is used. In other words, an n-channel transistor including a high-purity oxide semiconductor layer is used as a switching transistor. Note that the driver transistor may include a high-purity oxide semiconductor layer or a silicon layer. In this embodiment, an n-channel transistor including a high-purity oxide semiconductor layer is also used as a driver transistor.

In this embodiment, a switching transistor, which is one of the transistors in the pixel portion 1008, is an n-channel transistor including a high-purity oxide semiconductor layer, whereby data such an image signal can be held in a long period of time. Therefore, the frequency of signal writing can be decreased when a still image is displayed. Accordingly, a reduction in power consumption of the display device can be achieved.

Furthermore, in this embodiment, when a still image is displayed, by operating the driver circuit portion to stop the output of a signal to be supplied to all the signal lines and/or all the scan lines included in the pixel portion, power consumption of the driver circuit portion as well as the pixel portion can be reduced. In other words, the display device includes a period when supply of signals to all the signal lines and/or all the scan lines included in the pixel portion is stopped in a period when the display device displays a still image. In this embodiment, as one structure for achieving a reduction in power consumption of the driver circuit portion, the display device 1000 includes the signal generation circuit 1002, the memory circuit 1003, the comparison circuit 1004, the selection circuit 1005, and the display control circuit 1006.

The signal generation circuit 1002 has a function to generate a signal (a control signal) needed for driving the gate line driver circuit 1009A and the signal line driver circuit 1009B. In addition, the signal generation circuit 1002 has a function to output the control signal to the driver circuit portion 1007 through a wiring and to output an image signal (also referred to as video voltage, video signal, video data) to the memory circuit 1003 through a wiring. In other words, the signal generation circuit 1002 is a circuit for generating and outputting control signals for controlling the driver circuit portion 1007 and image signals to be supplied to the pixel portion.

Specifically, the signal generation circuit 1002 supplies, as the control signals, a high power supply potential Vdd and a low power supply potential Vss to the gate line driver circuit 1009A and the signal line driver circuit 1009B, a start pulse SP and a clock pulse CK for the gate line driver circuit to the gate line driver circuit 1009A, and a start pulse SP and a clock pulse CK for the signal line driver circuit to the signal line driver circuit 1009B. Moreover, the signal generation circuit 1002 outputs image signal Data for displaying a moving image or a still image to the memory circuit 1003.

The moving image refers to an image which is recognized as a moving image with human eyes by rapid switching of a plurality of images which are time-divided into a plurality of frames. Specifically, a moving image refers to a series of image signals which can be recognized as a moving image with little flicker by the human eye by switching images 60 times (60 frames) or more per second. In contrast, a still image refers to image signals in which a plurality of images which are time-divided into a plurality of frames are switched at high speed, but which are not different between successive frame periods, for example, between the n-th frame and (n+1)th frame, unlike the moving image.

Note that the signal generation circuit 1002 may have a function to generate other signals such as an image signal and a latch signal. The signal generation circuit 1002 may also have a function to output, to the gate line driver circuit 1009A and/or the signal line driver circuit 1009B, a reset signal Res for stopping output of a pulse signal of each driver circuit. Note that each signal may be composed of a plurality of signals such as a first clock signal and a second clock signal.

Note that a high power supply potential Vdd refers to a potential which is higher than a reference potential, and a low power supply potential refers to a potential which is lower than or equal to the reference potential. Note that both the high power supply potential and the low power supply potential are preferably set to potentials with which a transistor can operate.

Note that voltage refers to a potential difference between a given potential and a reference potential (e.g., a ground potential) in many cases. Accordingly, voltage, potential, and a potential difference can be referred to as potential, voltage, and voltage, respectively.

In the case where an image signal output from the signal generation circuit 1002 to the memory circuit 1003 is an analog signal, the signal may be converted into a digital signal through an A/D converter or the like to be output to the memory circuit 1003.

The memory circuit 1003 includes a plurality of frame memories 1010 for storing image signals of a plurality of frames. Note that the frame memory may be formed using a memory element such as dynamic random access memory (DRAM) or static random access memory (SRAM).

Note that the number of frame memories 1010 is not particularly limited as long as an image signal can be stored for each frame period. The image signals of the frame memories 1010 are selectively read out by the comparison circuit 1004 and the selection circuit 1005.

The comparison circuit 1004 is a circuit which selectively reads out image signals in successive frame periods stored in the memory circuit 1003, compares the image signals, and detects a difference thereof. In the case where the difference is detected by the comparison of the image signals by the comparison circuit 1004, the image is recognized as a moving image in the successive frame periods from which the difference is detected. On the other hand, in the case where the difference is not detected by the comparison of the image signals by the comparison circuit 1004, the image is recognized as a still image in the successive frame periods from which the difference is not detected. In other words, depending on the presence or absence of difference detected by the comparison circuit 1004, whether the image signals in the successive frame periods are image signals for displaying a moving image or image signals for displaying a still image is determined. Note that the difference obtained by the comparison may be set to be detected when the difference exceeds a certain level.

The selection circuit 1005 includes a plurality of switches such as transistors, and is a circuit which selects the image signals from the frame memories 1010 in which the image signals are stored, and outputs the image signals to the display control circuit 1006 when it is determined that the image signals are those for displaying a moving image by the difference detection in the comparison circuit 1004. Note that in the case where a difference of image signals between frames compared by the comparison circuit is not detected, an image displayed in the successive frame periods is a still image. In that case, image signals of latter of the successive frame periods are not output to the display control circuit 1006.

The display control circuit 1006 is a circuit which switches between supply and stop of the image signal and the control signals such as the high power supply potential Vdd, the low power supply potential Vss, the start pulse SP, the clock pulse CK, and the reset signal Res to the driver circuit portion 1007. Specifically, when it is determined that an image to be displayed is a moving image by the comparison circuit 1004, that is, a difference between image signals in successive frames is detected, the image signals are supplied from the selection circuit 1005 to the display control circuit 1006. Then, the image signals are supplied to the driver circuit portion 1007 through the display control circuit 1006. In addition, the control signals are supplied to the driver circuit portion 1007 through the display control circuit 1006. On the other hand, when it is determined that an image to be displayed is a still image by the comparison circuit 1004, that is, a difference between image signals in successive frames is not detected, the image signals of the frame periods are not supplied from the selection circuit 1005; thus, the image signals are not supplied to the driver circuit portion 1007 through the display control circuit 1006, and the display control circuit 1006 stops supplying the control signals to the driver circuit portion 1007.

Note that in the case where it is determined that the image to be displayed is a still image, when the period during which the image is a still image is short, supply of the high power supply potential Vdd and the low power supply potential Vss among the control signals is not necessarily stopped. In this case, an increase of the power consumption due to frequent stop and start of supply of the high power supply potential Vdd and the low power supply potential Vss can be reduced, which is preferable.

It is preferable that the supply of the image signals and the control signals is stopped during a period in which the image signal can be held in each pixel in the pixel portion 1008, and the display control circuit 1006 may have a structure which can again supply the image signals and the control signals which the display control circuit 1006 supplies before, so that the image signals are supplied again after the holding period of each pixel.

The supply of a signal refers to supply of a predetermined potential to a wiring. The stop of supply of a signal refers to stop of supply of the predetermined potential to the wiring, and electrical connection to a wiring to which a predetermined fixed potential is supplied, for example, a wiring to which the low power supply potential Vss is supplied. The stop of supply of a signal also refers to cut of an electrical connection to a wiring to which a predetermined potential is supplied and to bring the wiring into a floating state.

In this manner, image signals are compared to determine whether an image thereof is a moving image or a still image, and supply or stop of control signals such as a clock signal or a start pulse is selected, whereby power consumption of the driver circuit portion 1007 can be reduced.

Next, an example of a structure of a shift register included in each of the gate line driver circuit 1009A and the signal line driver circuit 1009B of the driver circuit portion 1007 will be described with reference to FIGS. 8A to 8C.

Figure 8A:
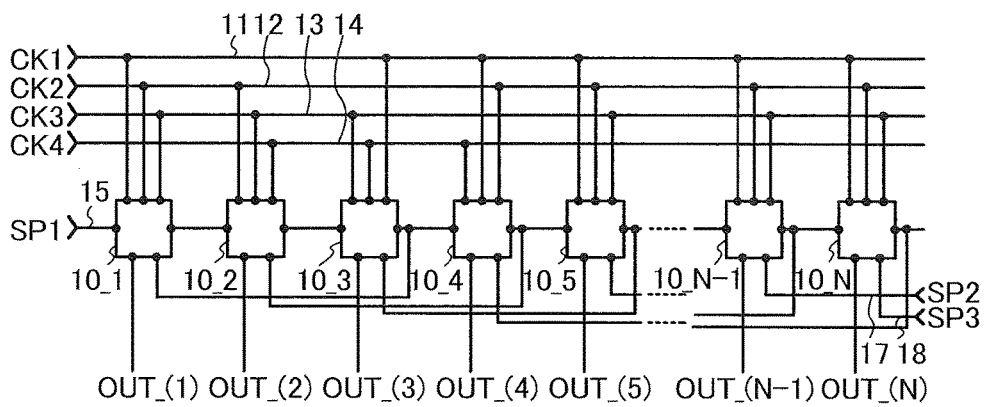
FIGS. 8A to 8C illustrate an example of a driver circuit.

The shift register illustrated in FIG. 8A includes a first to Nth pulse output circuits 10_1 to 10_N (N is a natural number of 3 or more). In the shift register illustrated in FIG. 8A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number of 2 or more and N or less), a signal from the pulse output circuit of the preceding stage (such a signal is referred to as a preceding-stage signal OUT(n−1)(SR)) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)(SR)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage, and second output signals (OUT(1) to OUT(N)) to be input to another wiring or the like. Note that since the subsequent-stage signal OUT(n+2)(SR) is not input to the last two stages of the shift register as illustrated in FIG. 8A, a second start pulse SP2 and a third start pulse SP3 may be input from a sixth wiring 17 and a seventh wiring 18, respectively, to the pulse output circuits of the last two stages, for example. Alternatively, a signal which is additionally generated in the shift register may be used. For example, a structure may be employed in which a (N+1)th pulse output circuit 10_(N+1) and a (N+2)th pulse output circuit 10_(N+2) which do not contribute to pulse output to the pixel portion (such circuits are also referred to as dummy stages) may be provided so that signals corresponding to the second start pulse (SP2) and the third start pulse (SP3) are generated in the dummy stages.

Figure 9:
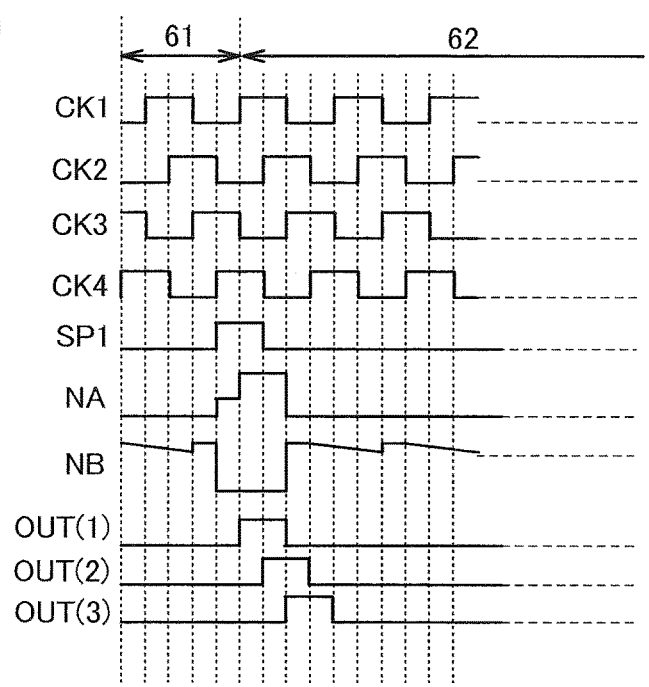
FIG. 9 is a timing diagram of a driver circuit.

Note that the first to the fourth clock signals (CK1) to (CK4) are signals that alternate between an H level and an L level at regular intervals as illustrated in FIG. 9. The first clock signal (CK1) to the fourth clock signal (CK4) are delayed by ¼ cycle sequentially. In this embodiment, driving of the pulse output circuit or the like is controlled with the first to fourth clock signals (CK1) to (CK4). Note that the clock signal CK may be referred to as GCK or SCK in some cases depending on a driver circuit to which the clock signal is input, but the clock signal is referred to as CK here.

Figure 8B:
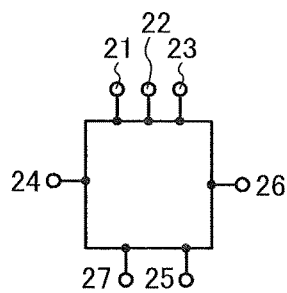

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 8B).

The first input terminal 21, the second input terminal 22, and the third input terminal 23 are electrically connected to any of the first to fourth wirings 11 to 14. For example, in the first pulse output circuit 10_1 in FIGS. 8A and 8B, the first input terminal 21 is electrically connected to the first wiring 11, the second input terminal 22 is electrically connected to the second wiring 12, and the third input terminal 23 is electrically connected to the third wiring 13. In the second pulse output circuit 10__2, the first input terminal 21 is electrically connected to the second wiring 12, the second input terminal 22 is electrically connected to the third wiring 13, and the third input terminal 23 is electrically connected to the fourth wiring 14.

In FIGS. 8A and 8B, in the first pulse output circuit 10_1, the start pulse is input to the fourth input terminal 24, a subsequent-stage signal OUT(3)(SR) is input to the fifth input terminal 25, the first output signal OUT(1)(SR) is output from the first output terminal 26, and the second output signal OUT(1) is output from the second output terminal 27.

Next, an example of a specific circuit configuration of the pulse output circuit will be described with reference to FIG. 8C.

Figure 8C:
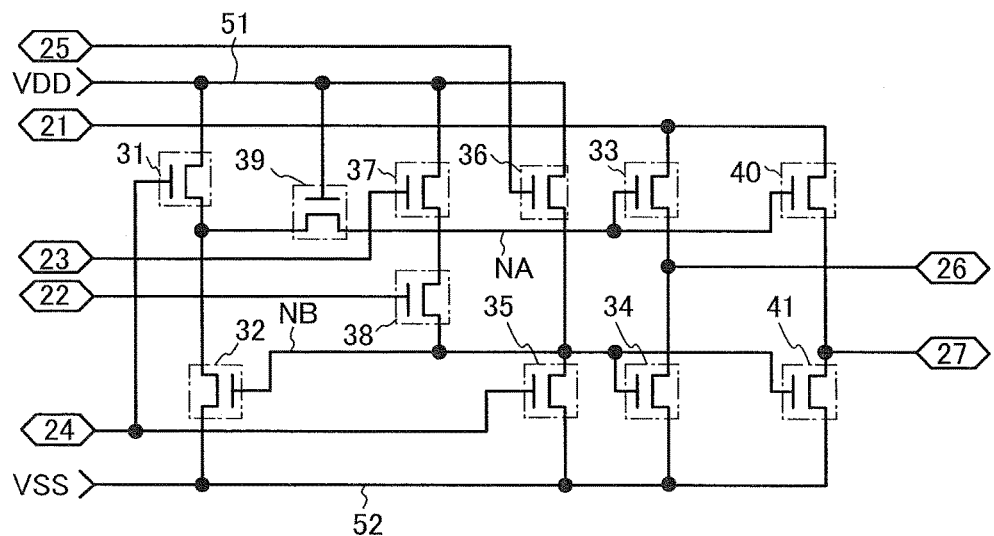

In FIG. 8C, a first terminal of the first transistor 31 is electrically connected to the power supply line 51, a second terminal of the first transistor 31 is electrically connected to a first terminal of the ninth transistor 39, and a gate of the first transistor 31 is electrically connected to the fourth input terminal 24. A first terminal of the second transistor 32 is electrically connected to the power supply line 52, a second terminal of the second transistor 32 is electrically connected to the first terminal of the ninth transistor 39, and a gate of the second transistor 32 is electrically connected to a gate of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 52, and a second terminal of the fourth transistor 34 is electrically connected to the first output terminal 26. A first terminal of the fifth transistor 35 is electrically connected to the power supply line 52, a second terminal of the fifth transistor 35 is electrically connected to the gate of the second transistor 32 and the gate of the fourth transistor 34, and a gate of the fifth transistor 35 is electrically connected to the fourth input terminal 24. A first terminal of the sixth transistor 36 is electrically connected to the power supply line 51, a second terminal of the sixth transistor 36 is electrically connected to the gate of the second transistor 32 and the gate of the fourth transistor 34, and a gate of the sixth transistor 36 is electrically connected to the fifth input terminal 25. A first terminal of the seventh transistor 37 is electrically connected to the power supply line 51, a second terminal of the seventh transistor 37 is electrically connected to a second terminal of the eighth transistor 38, and a gate of the seventh transistor 37 is electrically connected to the third input terminal 23. A first terminal of the eighth transistor 38 is electrically connected to the gate of the second transistor 32 and the gate of the fourth transistor 34, and a gate of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate of the third transistor 33 and a gate of the tenth transistor 40, and a gate of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate of the tenth transistor 40 is electrically connected to the second terminal of the ninth transistor 39. A first terminal of the eleventh transistor 41 is electrically connected to the power supply line 52, a second terminal of the eleventh transistor 41 is electrically connected to the second output terminal 27, and a gate of the eleventh transistor 41 is electrically connected to the gate of the second transistor 32 and the gate of the fourth transistor 34.

In FIG. 8C, a connection point where the gate of the third transistor 33, the gate of the tenth transistor 40, and the second terminal of the ninth transistor 39 are connected is referred to as a node NA. A connection point where the gate of the second transistor 32, the gate of the fourth transistor 34, the second terminal of the fifth transistor 35, the second terminal of the sixth transistor 36, the first terminal of the eighth transistor 38, and the gate of the eleventh transistor 41 are connected is referred to as a node NB.

In the case where the pulse output circuit in FIG. 8C is the first pulse output circuit 10_1, the first clock signal CK1 is input to the first input terminal 21, the second clock signal CK2 is input to the second input terminal 22, the third clock signal CK3 is input to the third input terminal 23, the start pulse SP1 is input to the fourth input terminal 24, a subsequent-stage signal OUT(3)(SR) is input to the fifth input terminal 25, the OUT(1)(SR) is output from the first output terminal 26, and the OUT(1) is output from the second output terminal 27.

FIG. 9 is a timing diagram of a shift register including a plurality of pulse output circuits illustrated in FIG. 8C. Note that when the shift register is a gate line driver circuit, a period 61 in FIG. 9 corresponds to a vertical retrace period and a period 62 corresponds to a gate selection period.

The process of supply and stop of potentials of wirings in the driver circuit including a plurality of n-channel transistors illustrated as an example in FIGS. 8A to 8C and FIG. 9, in the case where a still image and a moving image are displayed, is described below.

Figure 11A:
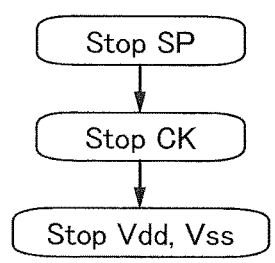
FIGS. 11A to 11D illustrate examples of the process for supplying and stopping a signal for a driver circuit.
Figure 11B:
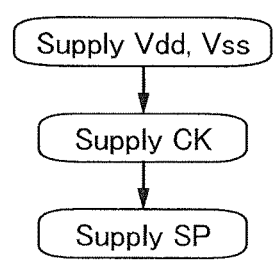

First, to stop operation of the driver circuit portion 1007, supply of the start pulse SP is stopped by the display control circuit 1006. After the supply of the start pulse SP is stopped, pulse output reaches the last stage of the shift register, and then supply of the each clock signal CK is stopped. Next, supply of the high power supply potential Vdd and the low power supply potential Vss of the power supply voltage is stopped (see FIG. 11A). To start the operation of the driver circuit portion 1007 again, first, the display control circuit 1006 supplies the high power supply potential Vdd and the low power supply potential Vss of the power supply voltage to the driver circuit portion 1007. Then, each of the clock signals CK is supplied, and then, supply of the start pulse SP is started again (see FIG. 11B).

Figure 28:
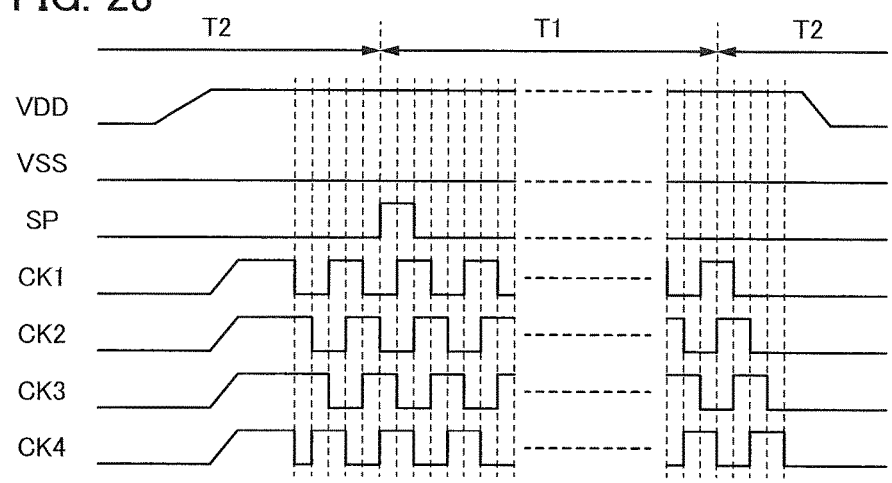
FIG. 28 illustrates an example of the process for supplying and stopping a signal to a driver circuit.

The process of supply and stop of a potential to each wiring of the driver circuit portion during an operation in which an image to be displayed changes from a still image to a moving image or an operation in which a voltage applied to a gate of a driver transistor is rewritten (hereinafter the operation is also referred to as refresh operation), in the driver circuit manufactured using a plurality of n-channel transistors, which is given as an example in FIGS. 8A to 8C and FIG. 9, will be described with reference to FIG. 28. FIG. 28 illustrates changes in potentials, before and after a frame period (T1), of a wiring for supplying a high power supply potential (VDD), a wiring for supplying a low power supply potential (VSS), a wiring for supplying a start pulse (SP), and wirings for supplying first to fourth clock signals (CK1 to CK4) to a shift register.

The display device according to this embodiment can display not only a moving image and a still image with constantly operating the drive circuit portion but also a still image without constantly operating the driver circuit portion due to refleash operation. Therefore, as illustrated in FIG. 28, there are a period in which control signals such as the high power supply potential (VDD), the first to fourth clock signals (CK1 to CK4), and the start pulse are supplied to the shift register and a period in which the control signals are not supplied to the shift register. Note that the period T1 illustrated in FIG. 28 corresponds to the period in which control signals are supplied, in other words, a period in which a moving image is displayed or a period in which refresh operation is performed. The period T2 illustrated in FIG. 28 corresponds to the period in which the control signals are not supplied, in other words, a period in which a still image is displayed.

In FIG. 28, a period in which the high power supply potential (VDD) is supplied is given not only in the period T1; it starts before the period T1 and ends after the period T1. In addition, in FIG. 28, a period in which the first to fourth clock signals (CK1 to CK4) are supplied is given after the start of the supply of the high power supply potential (VDD) and before the stop of supply of the high power supply potential (VDD).

Further, as illustrated in FIG. 28, the first to fourth clock signals (CK1 to CK4) may be set so as to start oscillating at a constant frequency after being set to a high potential before the period T1 and stop oscillating after being set to a low potential after the period T1.

As described above, in the display device according to this embodiment, the supply of control signals such as the high power supply potential (VDD), the first to fourth clock signals (CK1 to CK4), and the start pulse to the shift register is stopped in the period T2. Then, in the period in which the supply of control signals is stopped, whether each transistor is turned on or turned off is controlled and the output of a pulse signal from the shift register is also stopped. Therefore, power consumption of the shift register and power consumption of the pixel portion which is driven by the shift register can be reduced.

Note that the above refresh operation needs to be performed regularly in consideration of a possibility that the quality of a displayed still image may deteriorate. In the liquid crystal display device of this embodiment, the above transistor including a high-purity oxide semiconductor is employed as a switching element for controlling voltage to be applied to a gate of driver transistor of each pixel. Accordingly, off current can be drastically decreased, and a change in voltage to be applied to the gate of the driver transistor of each pixel can be reduced. In other words, even when the period in which a still image is displayed and the operation of the shift register is stopped is long, deterioration of image quality can be suppressed. For example, even when the period is 3 minutes long, the quality of a displayed still image can be maintained. For example, when a display device in which refresh operation is performed once in 3 minutes is compared with a display device in which rewriting is performed 60 times per second, power consumption can be reduced to approximately 1/10000.

Note that the stop of supply of the high power supply potential (VDD) is to set a potential equal to the low power supply potential (VSS) as illustrated in FIG. 28. Note that, the stop of supply of the high power supply potential (VDD) may be to set the potential of a wiring, to which the high power supply potential is supplied, in a floating state.

Note that when the potential of the wiring to which the high power supply potential (VDD) is supplied is increased, which means that the potential is increased from the low power supply potential (VSS) to the high power supply potential (VDD) before the period T1, it is preferable that the potential of the wiring is controlled so as to change gradually. If the gradient of the change in potential of the wiring is steep, the change in potential may become noise and an irregular pulse may be output from the shift register. In the case where the shift register is included in a gate line driver circuit, the irregular pulse serves as a signal for turning on a transistor. Thus, voltage to be applied to a gate of the driver transistor may be changed by the irregular pulse and the quality of a still image may be changed. FIG. 28 thus illustrates an example in which the rise in signal to the high power supply potential (VDD) is more gradual than the fall. In particular, in the display device of this embodiment, when a still image is displayed in the pixel portion, the supply of the high power supply potential (VDD) to the shift register is stopped or restarted as appropriate. In other words, in the case where a change in potential of the wiring for supplying the high power supply potential (VDD) affects the pixel portion as noise, the noise directly leads to deterioration of a displayed image. Therefore, it is important to control the display device of this embodiment so as to prevent a change in potential (particularly, an increase in potential) of the wiring from entering the pixel portion as noise.

In the description of FIGS. 8A to 8C and FIG. 9, the reset signal Res is not supplied to the driver circuit. A structure in which the reset signal Res is supplied will be described with reference to FIGS. 10A to 10C.

Figure 10A:
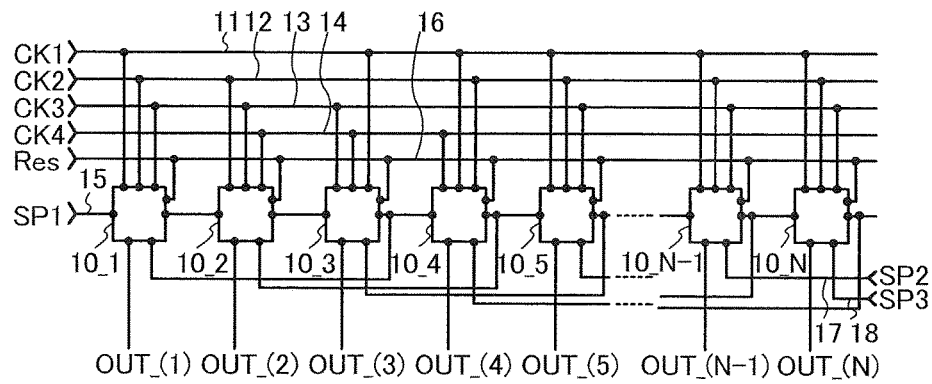
FIGS. 10A to 10C illustrate an example of a driver circuit.

The shift register illustrated in FIG. 10A includes a first to Nth pulse output circuits 10_1 to 10_N (N is a natural number of 3 or more). In the shift register illustrated in FIG. 10A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number of 2 or more and N or less), a signal from the pulse output circuit of the preceding stage (such a signal is referred to as a preceding-stage signal OUT(n−1)(SR)) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)(SR)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage, and second output signals (OUT(1) to OUT(N)) to be input to another wiring or the like. To the pulse output circuit in each stage, a reset signal Res is supplied from a sixth wiring 16.

Figure 10B:
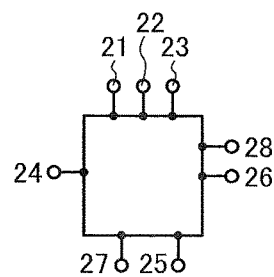
Figure 10C:
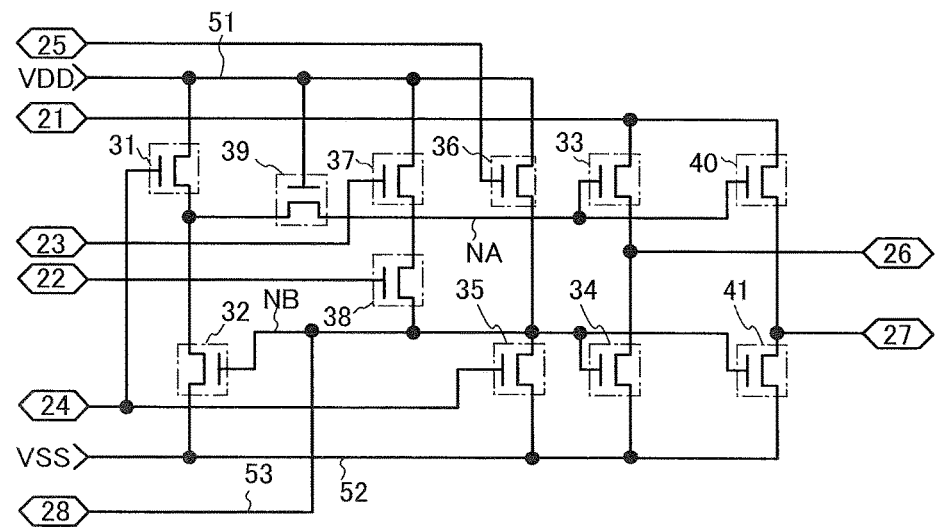

The pulse output circuit illustrated in FIGS. 10A to 10C is different from the pulse output circuit illustrated in FIGS. 8A to 8C in that the sixth wiring 16 for supplying the reset signal Res is provided; the other portions are similar to those described with reference to FIGS. 8A to 8C.

Each of the first to Nth pulse output circuits 10_1 to 10_N includes the first input terminal 21, the second input terminal 22, the third input terminal 23, a fourth input terminal 24, a fifth input terminal 25, a first output terminal 26, a second output terminal 27, and a sixth input terminal 28 (see FIG. 10B).

The first input terminal 21, the second input terminal 22, and the third input terminal 23 are electrically connected to any of the first to fourth wirings 11 to 14. For example, in the first pulse output circuit 10_1 in FIGS. 10A and 10B, the first input terminal 21 is electrically connected to the first wiring 11, the second input terminal 22 is electrically connected to the second wiring 12, and the third input terminal 23 is electrically connected to the third wiring 13. In the second pulse output circuit 10__2, the first input terminal 21 is electrically connected to the second wiring 12, the second input terminal 22 is electrically connected to the third wiring 13, and the third input terminal 23 is electrically connected to the fourth wiring 14.

In FIGS. 10A and 10B, in the first pulse output circuit 10_1, the start pulse is input to the fourth input terminal 24, a subsequent-stage signal OUT(3)(SR) is input to the fifth input terminal 25, the first output signal OUT(1)(SR) is output from the first output terminal 26, the second output signal OUT(1) is output from the second output terminal 27, and the reset signal Res is input from the sixth input terminal 28.

Next, an example of a specific circuit configuration of the pulse output circuit will be described with reference to FIG. 10C.

In FIG. 10C, the first terminal of the first transistor 31 is electrically connected to the power supply line 51, the second terminal of the first transistor 31 is electrically connected to the first terminal of the ninth transistor 39, and the gate of the first transistor 31 is electrically connected to the fourth input terminal 24. The first terminal of the second transistor 32 is electrically connected to the power supply line 52, the second terminal of the second transistor 32 is electrically connected to the first terminal of the ninth transistor 39, and the gate of the second transistor 32 is electrically connected to the gate of the fourth transistor 34. The first terminal of the third transistor 33 is electrically connected to the first input terminal 21, and the second terminal of the third transistor 33 is electrically connected to the first output terminal 26. The first terminal of the fourth transistor 34 is electrically connected to the power supply line 52, and the second terminal of the fourth transistor 34 is electrically connected to the first output terminal 26. The first terminal of the fifth transistor 35 is electrically connected to the power supply line 52, the second terminal of the fifth transistor 35 is electrically connected to the gate of the second transistor 32 and the gate of the fourth transistor 34, and the gate of the fifth transistor 35 is electrically connected to the fourth input terminal 24. The first terminal of the sixth transistor 36 is electrically connected to the power supply line 51, the second terminal of the sixth transistor 36 is electrically connected to the gate of the second transistor 32 and the gate of the fourth transistor 34, and the gate of the sixth transistor 36 is electrically connected to the fifth input terminal 25. The first terminal of the seventh transistor 37 is electrically connected to the power supply line 51, the second terminal of the seventh transistor 37 is electrically connected to the second terminal of the eighth transistor 38, and the gate of the seventh transistor 37 is electrically connected to the third input terminal 23. The first terminal of the eighth transistor 38 is electrically connected to the gate of the second transistor 32 and the gate of the fourth transistor 34, and the gate of the eighth transistor 38 is electrically connected to the second input terminal 22. The first terminal of the ninth transistor 39 is electrically connected to the second terminal of the first transistor 31 and the second terminal of the second transistor 32, the second terminal of the ninth transistor 39 is electrically connected to the gate of the third transistor 33 and the gate of the tenth transistor 40, and the gate of the ninth transistor 39 is electrically connected to the power supply line 51. The first terminal of the tenth transistor 40 is electrically connected to the first input terminal 21, the second terminal of the tenth transistor 40 is electrically connected to the second output terminal 27, and the gate of the tenth transistor 40 is electrically connected to the second terminal of the ninth transistor 39. The first terminal of the eleventh transistor 41 is electrically connected to the power supply line 52, the second terminal of the eleventh transistor 41 is electrically connected to the second output terminal 27, and the gate of the eleventh transistor 41 is electrically connected to the gate of the second transistor 32 and the gate of the fourth transistor 34. The gate of the second transistor 32, the gate of the fourth transistor 34, the second terminal of the fifth transistor 35, the second terminal of the sixth transistor 36, the first terminal of the eighth transistor 38, and the gate of the eleventh transistor 41 are electrically connected to a wiring 53 for supplying the reset signal Res. The reset signal Res is a signal which supplies a high power supply potential level to the gate of the second transistor 32, the gate of the fourth transistor 34, the second terminal of the fifth transistor 35, the second terminal of the sixth transistor 36, the first terminal of the eighth transistor 38, and the gate of the eleventh transistor 41, and thereby reducing the output from the pulse output circuit to a signal at a low power supply potential level.

In FIG. 10C, a connection point where the gate of the third transistor 33, the gate of the tenth transistor 40, and the second terminal of the ninth transistor 39 are connected is referred to as a node NA. A connection point where the gate of the second transistor 32, the gate of the fourth transistor 34, the second terminal of the fifth transistor 35, the second terminal of the sixth transistor 36, the first terminal of the eighth transistor 38, and the gate of the eleventh transistor 41 are connected is referred to as a node NB.

In the case where the pulse output circuit in FIG. 10C is the first pulse output circuit 10_1, the first clock signal CK1 is input to the first input terminal 21, the second clock signal CK2 is input to the second input terminal 22, the third clock signal CK3 is input to the third input terminal 23, the start pulse SP is input to the fourth input terminal 24, a subsequent-stage signal OUT(3)(SR) is input to the fifth input terminal 25, the OUT(1)(SR) is output from the first output terminal 26, the OUT(1) is output from the second output terminal 27, and the reset signal Res is input to the sixth input terminal 28.

Note that the timing diagram of the shift register including a plurality of pulse output circuits illustrated in FIG. 10C is similar to that illustrated in FIG. 9.

The process of supply and stop of potentials of wirings in the driver circuit including a plurality of n-channel transistors illustrated as an example in FIGS. 10A to 10C, in the case where a still image and a moving image are displayed, is described below.

Figure 11C:
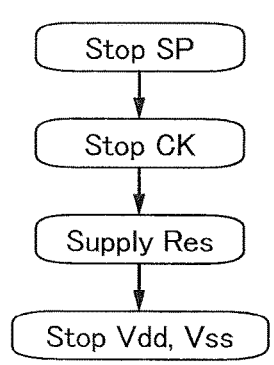
Figure 11D:
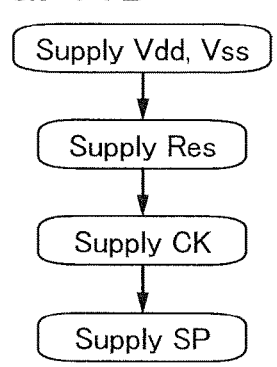

First, to stop operation of the driver circuit portion 1007, supply of the start pulse SP is stopped by the display control circuit 1006. After the supply of the start pulse SP is stopped, pulse output reaches the last stage of the shift register, and then supply of the each clock signal CK is stopped. Next, the reset signal Res is supplied. Next, supply of the high power supply potential Vdd and the low power supply potential Vss of the power supply voltage is stopped (see FIG. 11C). To start the operation of the driver circuit portion 1007 again, first, the display control circuit 1006 supplies the high power supply potential Vdd and the low power supply potential Vss of the power supply voltage to the driver circuit portion 1007. Next, the reset signal Res is supplied. Then, each of the clock signals CK is supplied, and then, supply of the start pulse SP is started again (see FIG. 11D).

The structure illustrated in FIGS. 10A to 10C in which the reset signal is supplied in addition to the structure shown in FIGS. 8A to 8C and FIG. 9 is preferable because malfunction due to signal delay at the time of switching between a still image and a moving image or the like can be reduced.

In the case where a still image is displayed, a common potential electrode provided over the transistor included in the driver circuit portion may be cut off from a common potential line to be brought into a floating state. Then, after a still-image mode, to start operation of the driver circuit again, the common potential electrode is connected to the common potential line. Accordingly, malfunction of the transistor in the driver circuit portion can be prevented.

Figure 12A:
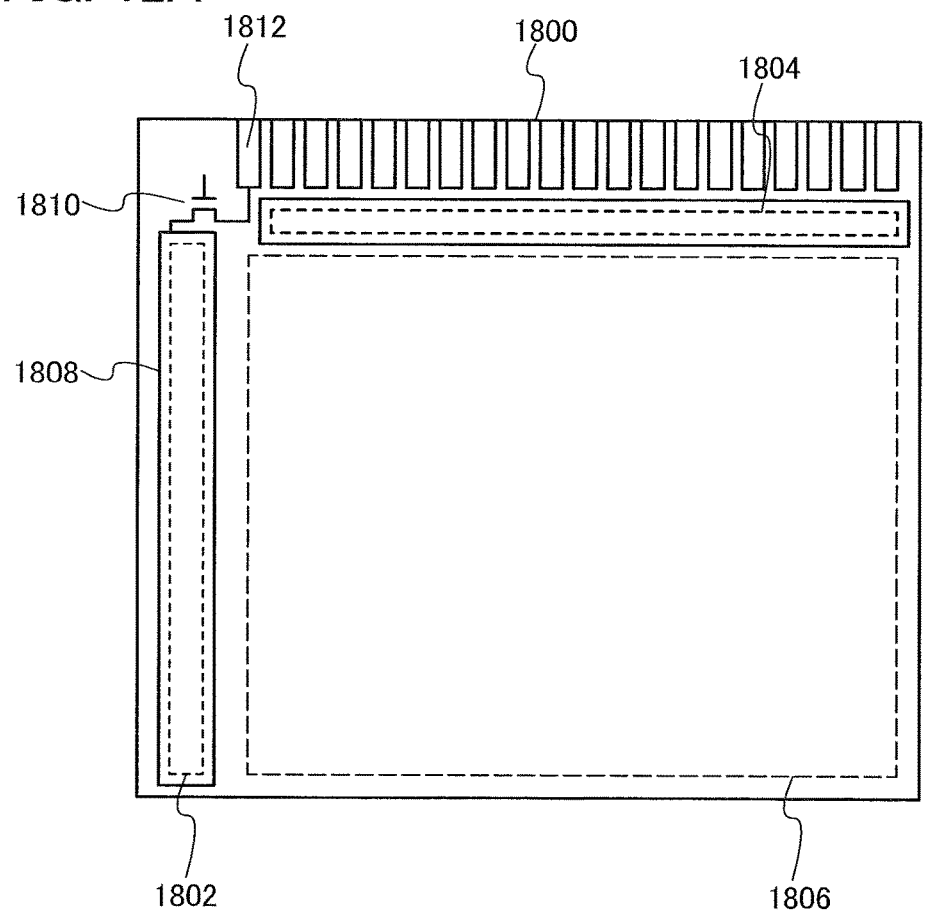
FIGS. 12A and 12B are a plan view and a cross-sectional view illustrating an example of a light-emitting display panel.
Figure 12B:
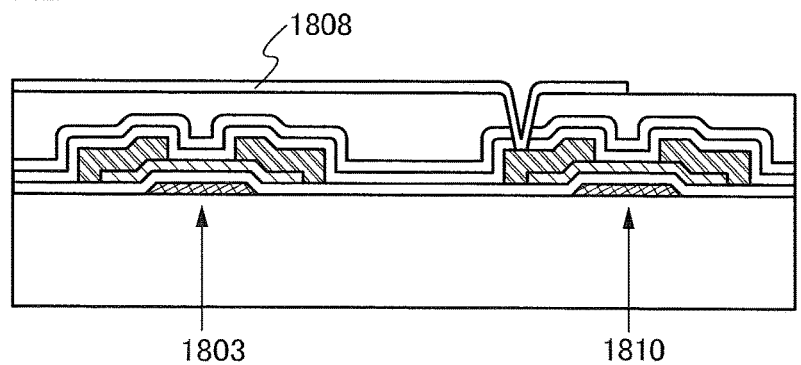

FIG. 12A illustrates a display panel 1800 having such a structure, and FIG. 12B illustrates a cross-sectional structure thereof. The display panel 1800 includes driver circuits 1802 and 1804 and a pixel portion 1806. A common potential electrode 1808 is provided so as to overlap the driver circuit 1802. A switch element 1810 for controlling connection/non-connection between the common potential electrode 1808 and a common potential terminal 1812 is provided therebetween.

The common potential electrode 1808 is provided over a transistor 1803 of the driver circuit as illustrated in FIG. 12B, thereby shielding the transistor 1803 from static electricity, so that a change of the threshold voltage or generation of a parasitic channel is prevented.

The switch element 1810 can have the same structure as the transistor 1803. These elements with extremely small leakage current in an off-state contribute to stabilization of operation of the display panel. In other words, in displaying a still image, even when the switch element 1810 is turned off to bring the common potential electrode into a floating state, the potential can be kept constant.

In this manner, by using a transistor formed using an oxide semiconductor having a wide band gap and providing the common potential electrode to block the external electric field, a still image can be displayed even in the state where the operation of the driver circuit is stopped. Further, by appropriately controlling the potential of the common potential electrode in accordance with the operation of the driver circuit, the operation of the display panel can be stabilized.

As described above, by providing a transistor including a high-purity oxide semiconductor in each pixel, a period in which a storage capacitor can hold voltage can be longer than that in a conventional case, and power consumption for displaying a still image or the like can be reduced. Furthermore, when a still image is displayed, by operating the driver circuit portion to stop the output of a signal to be supplied to all the signal lines and/or all the scan lines in the pixel portion, power consumption of the driver circuit portion as well as the pixel portion can be reduced.

(Embodiment 3)

In this embodiment, a structural example of the first transistor 6401 described in Embodiment 1 and an example of a manufacturing method thereof will be described. In other words, a structural example of a transistor including a high-purity oxide semiconductor and an example of a manufacturing method thereof will be described.

Figure 13A:
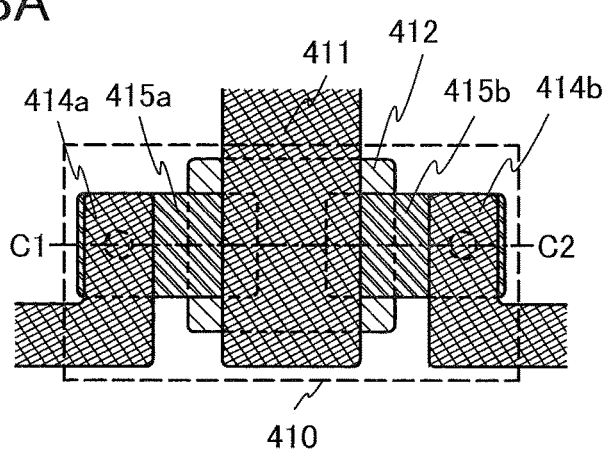
FIGS. 13A and 13B are a plan view and a cross-sectional view illustrating an example of a transistor.
Figure 13B:
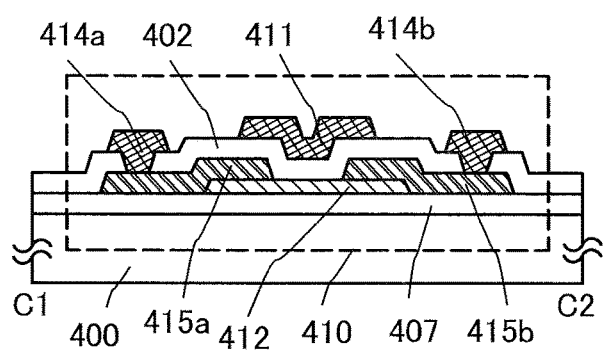

First, FIGS. 13A and 13B illustrate a planar structure and a cross-sectional structure of an example of a transistor. FIG. 13A is a plan view of a transistor 410 having a top-gate structure and FIG. 13B is a cross-sectional view taken along C1-C2 in FIG. 13A.

The transistor 410 includes, over a substrate 400, an insulating layer 407, an oxide semiconductor layer 412, a first electrode (one of a source electrode and a drain electrode) 415a, a second electrode (the other of the source electrode and the drain electrode) 415b, a gate insulating layer 402, and a gate electrode 411. A first wiring 414a and a second wiring 414b are provided in contact with and electrically connected to the first electrode 415a and the second electrode 415b, respectively.

Note that although the transistor 410 in FIG. 13A has a single-gate structure, the present invention is not limited to the structure. The transistor may have a multi-gate structure which includes a plurality of gate electrodes and a plurality of channel formation regions.

Next, a manufacturing process of the transistor 410 will be described with reference to FIGS. 14A to 14E.

First, an insulating layer 407 serving as a base film is formed over the substrate 400.

Although there is no particular limitation on a substrate that can be used as the substrate 400, the substrate needs to have heat resistance high enough to withstand at least heat treatment to be performed later. In the case where the temperature of the heat treatment to be performed later is high, a substrate having a strain point of 730° C. or higher is preferably used. Specific examples of the substrate 400 include a glass substrate, a crystalline glass substrate, a ceramic substrate, a quartz substrate, a sapphire substrate, and a plastic substrate. Further, specific examples of a material of the glass substrate include aluminosilicate glass, aluminoborosilicate glass, and barium borosilicate glass.

As the insulating layer 407, an oxide insulating layer such as a silicon oxide layer, a silicon oxynitride layer, an aluminum oxide layer, or an aluminum oxynitride layer is preferably used. The insulating layer 407 can be formed by a plasma CVD method, a sputtering method, or the like. In order to prevent the insulating layer 407 from containing a large amount of hydrogen, the insulating layer 407 is preferably formed by a sputtering method. In this embodiment, a silicon oxide layer is formed as the insulating layer 407 by a sputtering method. Specifically, the substrate 400 is transferred to a process chamber and a sputtering gas including high-purity oxygen from which hydrogen and moisture are removed is introduced, and a target of silicon or silicon oxide is used, whereby a silicon oxide layer is formed as the insulating layer 407 over the substrate 400. Note that the substrate 400 may be kept at room temperature or may be heated during deposition.

A specific example of a deposition condition for a silicon oxide film is as follows: quartz (preferably, synthetic quartz) is used as the target; the substrate temperature is 108° C.; the distance between a target and the substrate 400 (T-S distance) is 60 mm; the pressure is 0.4 Pa; the high-frequency power is 1.5 kW; the atmosphere is oxygen and argon (the flow rate ratio of oxygen to argon is 25 sccm:25 sccm=1:1); and an RF sputtering method is used. The thickness of the film is 100 nm. Note that a silicon target may be used as the target instead of the quartz (preferably, synthetic quartz) target. Further, an oxygen gas may be used as a sputtering gas instead of a mixed gas of oxygen and argon. Here, a sputtering gas for forming the insulating layer 407 is a high-purity gas in which impurities such as hydrogen, water, hydroxyl, or hydride are reduced to such a level that the concentration thereof can be expressed by ppm or ppb.

Further, it is preferable that the insulating layer 407 be formed while moisture remaining in the process chamber is removed so that the insulating layer 407 may be prevented from including hydrogen, hydroxyl, or moisture.

In order to remove moisture remaining in the process chamber, a capture-type vacuum pump may be used. For example, a cryopump, an ion pump, or a titanium sublimation pump can be used. Further, as an evacuation means, a turbo pump provided with a cold trap is preferable. A process chamber which is evacuated with a cryopump is preferable because hydrogen atoms, compounds including a hydrogen atom such as water ($H_2O$), or the like are exhausted from the chamber and thus hydrogen atoms are hardly included in the insulating layer 407 formed in the chamber.

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film can be formed by electric discharge of plural kinds of materials at the same time in the same chamber.

Further, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, there are also a reactive sputtering method in which a target substance and a sputtering gas component are chemically reacted with each other during the deposition to form a thin compound film thereof, and a bias sputtering method in which voltage is also applied to a substrate during the deposition.

The structure of the insulating layer 407 is not limited to a single-layer structure and may be a stacked-layer structure. For example, the insulating layer 407 may have a stacked-layer structure in which a nitride insulating layer such as a silicon nitride layer, a silicon nitride oxide layer, an aluminum nitride layer, or an aluminum nitride oxide layer and the above oxide insulating layer are stacked in this order over the substrate 400.

For example, a sputtering gas including high-purity nitrogen from which hydrogen and moisture are removed is introduced between the silicon oxide layer and the substrate and a silicon target is used to form a silicon nitride layer. In this step also, it is preferable that the silicon nitride layer be formed while moisture remaining in the process chamber is removed as in the case of the silicon oxide layer. In the formation of the silicon nitride layer, a substrate may also be heated during deposition.

In the case where the stack of a silicon nitride layer and a silicon oxide layer is provided as the insulating layer 407, the silicon nitride layer and the silicon oxide layer can be formed in the same process chamber using the same silicon target. First, a sputtering gas including nitrogen is introduced and a silicon nitride layer is formed using a silicon target provide in the process chamber, and then the sputtering gas is switched to a sputtering gas including oxygen to form a silicon oxide layer using the same silicon target. Since the silicon nitride layer and the silicon oxide layer can be formed in succession without exposure to air in this method, impurities such as hydrogen or moisture can be prevented from being adsorbed on a surface of the silicon nitride layer.

Then, an oxide semiconductor layer is formed over the insulating layer 407 by a sputtering method.

Further, in order that hydrogen, hydroxyl group, and moisture be contained in the oxide semiconductor layer as little as possible, it is preferable that the substrate 400 over which the insulating layer 407 is formed be preheated in a preheating chamber of a sputtering apparatus as pretreatment for the film formation so that impurities such as hydrogen and moisture adsorbed to the substrate 400 may be removed and evacuated. Note that as an evacuation means, a cryopump is preferably provided in the preheating chamber. Further, this preheating may be performed on the substrate 400 before the formation of the gate insulating layer 402, which is to be formed later. Further, this preheating is preferably performed similarly on the substrate 400 over which layers up to the first electrode 415*a* and the second electrode 415*b* are formed. Note that this preheating treatment may be omitted.

Note that before the oxide semiconductor layer is formed by a sputtering method, dust attached to a surface of the insulating layer 407 is preferably removed by reverse sputtering in which an argon gas is introduced and plasma is generated. The reverse sputtering refers to a method in which, without application of voltage to a target side, an high-frequency power source is used for application of voltage to a substrate side in an argon atmosphere in order to generate plasma in the vicinity of the substrate to modify a surface. Note that instead of an argon atmosphere, nitrogen, helium, oxygen, or the like may be used.

As a target for forming the oxide semiconductor layer, a metal oxide target including zinc oxide as its main component can be used. Another example of a metal oxide target which can be used is a metal oxide target including In, Ga, and Zn (with a composition ratio of $In_2O_3:Ga_2O_3:ZnO=1:1:1$ [mol %] or In:Ga:Zn=1:1:0.5 [atom %]). Alternatively, as the metal oxide target including In, Ga, and Zn, a target having a composition ratio of In:Ga:Zn=1:1:1 [atomic %] or a target having a composition ratio of In:Ga:Zn=1:1:2 [atomic %] can be used. Further, a target which includes $SiO_2$ at 2 wt % to 10 wt % inclusive can be used. The filling factor of the metal oxide target is 90% to 100% inclusive, and preferably 95% to 99.9% inclusive. With the use of a metal oxide target with a high filling factor, the formed oxide semiconductor layer can have high density.

Note that the oxide semiconductor layer may be formed in a rare gas (typically, argon) atmosphere, an oxygen atmosphere, or an atmosphere of a rare gas (typically, argon) and oxygen. Here, a sputtering for forming the oxide semiconductor layer is a high-purity gas in which impurities such as hydrogen, water, hydroxyl, or hydride are reduced to such a level that the concentration thereof can be expressed by ppm or ppb.

The oxide semiconductor layer is formed over the substrate 400 in such a manner that the substrate is held in a process chamber maintained at reduced pressure, a sputtering gas from which hydrogen and moisture are removed is introduced while moisture remaining in the process chamber is removed, and metal oxide is used as a target. In order to remove moisture remaining in the process chamber, a capture-type vacuum pump is preferably used. For example, a cryopump, an ion pump, or a titanium sublimation pump is preferably used. In a process chamber which is evacuated with a cryopump, hydrogen atoms, compounds including hydrogen atoms such as water ($H_2O$) (more preferably, compounds including carbon atoms in addition), and the like are exhausted. Accordingly, the concentration of impurities included in the oxide semiconductor layer formed in the process chamber can be reduced. Further, the substrate temperature may be kept at room temperature or may be increased to a temperature less than 400° C. during the deposition of the oxide semiconductor layer.

As an example of the deposition condition of the oxide semiconductor layer, the following condition can be given: the temperature of the substrate is room temperature; the distance between the substrate and the target is 110 mm; the pressure is 0.4 Pa; the direct current (DC) power supply is 0.5 kW; and the atmosphere is oxygen and argon (the flow rate ratio of oxygen to argon is 15 sccm:30 sccm). Note that a pulse direct current (DC) power supply is preferable because powder substances (also referred to as particles or dust) generated in the deposition be reduced and the film thickness can be made uniform. The thickness of the oxide semiconductor layer is preferably 2 nm to 200 nm inclusive, preferably 5 nm to 30 nm inclusive. Note that an appropriate thickness of the oxide semiconductor layer varies depending on the material; therefore, the thickness may be determined as appropriate depending on the material.

Specific examples of the oxide semiconductor layer formed by the above method can be an In—Sn—Ga—Zn—O layer that is a quaternary metal oxide; an In—Ga—Zn—O layer, an In—Sn—Zn—O layer, In—Al—Zn—O layer, an Sn—Ga—Zn—O layer, an Al—Ga—Zn—O layer, or an Sn—Al—Zn—O layer that is a ternary metal oxide; an In—Zn—O layer, an Sn—Zn—O layer, an Al—Zn—O layer, a Zn—Mg—O layer, an Sn—Mg—O layer, or an In—Mg—O layer that is a binary metal oxide; an In—O layer; an Sn—O layer; a Zn—O layer; and the like. These oxide semiconductor layers may include Si. These oxide semiconductor layers may be amorphous or crystalline. Further, these oxide semiconductor layers may be non-single-crystal or single crystal. In this embodiment an amorphous In—Ga—Zn—O film is formed by a sputtering method using In—Ga—Zn—O as a target.

Note that as the oxide semiconductor layer, a thin film expressed by $InMO_3(ZnO)_m$ (m>0) can be used. Here, M represents one or more metal elements selected from Ga, Al, Mn, and Co. For example, Ga, Ga and Al, Ga and Mn, or Ga and Co can be given as M. Among the oxide semiconductor films whose composition formulas are represented by $InMO_3(ZnO)_m$ (in >0), an oxide semiconductor which includes Ga as M is referred to as an In—Ga—Zn—O oxide semiconductor, which is given above.

Figure 14A:
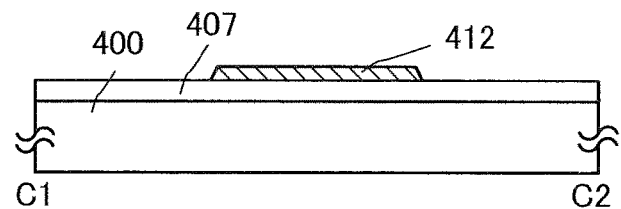
FIGS. 14A to 14E are cross-sectional views illustrating an example of a method for manufacturing a transistor.

Then, an oxide semiconductor layer is processed into an island-shaped oxide semiconductor layer 412 by a first photolithography step (see FIG. 14A). Note that a resist mask for forming the island-shaped oxide semiconductor layer 412 may be formed using an ink jetting method. The formation of the resist mask by an ink jetting method does not use a photomask; thus, manufacturing cost can be reduced.

Note that the etching of the oxide semiconductor layer may be dry etching, wet etching, or both wet etching and dry etching.

In the case of dry etching, a parallel plate reactive ion etching (RIE) method or an inductively coupled plasma (ICP) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

As an etching gas for dry etching, a gas including chlorine (a chlorine-based gas such as chlorine ($Cl_2$), boron chloride ($BCl_3$), silicon chloride ($SiCl_4$), or carbon tetrachloride ($CCl_4$)) is preferable but a gas including fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As an etchant used for wet etching, a mixed solution of phosphoric acid, acetic acid, and nitric acid, or an ammonium hydrogen peroxide mixture (a solution in which 31 wt % hydrogen peroxide, 28 wt % ammonia water, and water are mixed in a volume ratio of 5:2:2), or the like can be used. Further, ITO-07N (produced by KANTO CHEMICAL CO., INC.) may be used. The etching conditions (e.g., an etchant, an etching period, and a temperature) may be adjusted as appropriate in accordance with a material of the oxide semiconductor.

In the case of wet etching, an etchant is removed together with the material which is etched off by cleaning. The waste liquid including the etchant and the material which is etched off may be purified and the material may be reused. When a material (e.g., a rare metal such as indium) included in the oxide semiconductor layer is collected from the waste liquid after the etching and reused, the resources can be efficiently used.

In this embodiment, the oxide semiconductor layer is processed into the island-shaped oxide semiconductor layer 412 by a wet etching method using a mixed solution of phosphoric acid, acetic acid, and nitric acid as an etchant.

Then, first heat treatment is performed on the oxide semiconductor layer 412. The temperature of the first heat treatment is 400° C. to 750° C. inclusive, preferably 400° C. or higher and lower than the strain point of the substrate. Here, the substrate is put in an electric furnace which is one type of heat treatment apparatus and heat treatment is performed on the oxide semiconductor layer in a nitrogen atmosphere at 450° C. for one hour. After that, the oxide semiconductor layer is prevented from being exposed to air and from again including water or hydrogen. By this first heat treatment, hydrogen, water, hydroxyl, and the like can be removed from the oxide semiconductor layer 412.

Note that the heat treatment apparatus is not limited to an electric furnace, and an apparatus may be provided with a device for heating an object by heat conduction or thermal radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus with which an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas (typically, a rare gas such as argon) or a nitrogen gas can be used.

For example, the first heat treatment can employ GRTA, in which the substrate is transferred into an inert gas heated to a high temperature of 650° C. to 700° C., and heated for several minutes there, and then the substrate is transferred out of the inert gas heated to a high temperature. GRTA enables high-temperature heat treatment for a short time.

In the first heat treatment, it is preferable that water, hydrogen, and the like be not contained in the atmosphere. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

Note that depending on the conditions of the first heat treatment or a material of the oxide semiconductor layer, the oxide semiconductor layer 412 may be crystallized to be microcrystal or a polycrystal. For example, the oxide semiconductor layer may crystallize to become a microcrystalline oxide semiconductor layer having a crystallinity of 80% or more. Note that the island-shaped oxide semiconductor layer 412 may be an amorphous oxide semiconductor layer without crystallization after the first heat treatment. Further, the island-shaped oxide semiconductor layer 412 may become an oxide semiconductor layer in which a microcrystalline portion (with a grain diameter of 1 nm to 20 nm inclusive, typically 2 nm to 4 nm inclusive) is mixed into an amorphous oxide semiconductor layer.

The first heat treatment of the oxide semiconductor layer may be performed on the oxide semiconductor layer before being processed into the island-shaped oxide semiconductor layer. In that case, after the first heat treatment, the substrate is taken out of the heat treatment apparatus and subjected to the photolithography step.

Although the first heat treatment is performed mainly for the purpose of removing impurities such as hydrogen, water, and hydroxyl from the oxide semiconductor layer, it may generate oxygen defects in the oxide semiconductor layer. Therefore, the first heat treatment is preferably followed by treatment for supplying oxygen. Specifically, heat treatment in oxygen atmosphere or an atmosphere including nitrogen and oxygen (nitrogen to oxygen is 4 to 1 in volume ratio) may be performed as the oxidizing treatment after the first heat treatment, for example. Further, plasma treatment in an oxygen atmosphere may be employed.

The heat treatment having an effect of dehydration or dehydrogenation on the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Then, a conductive film is formed over the insulating layer 407 and the oxide semiconductor layer 412. The conductive film may be formed by a sputtering method or a vacuum evaporation method. As a material of the conductive film, a metal material such as Al, Cu, Cr, Ta, Ti, Mo, W, or Y, an alloy material including any of the metal materials, a conductive metal oxide, and the like can be given. As a conductive metal oxide, indium oxide ($In_2O_3$), tin oxide ($SnO_2$), zinc oxide (ZnO), an indium oxide-tin oxide alloy ($In_2O_3$—$SnO_2$, abbreviated as ITO), an indium oxide-zinc oxide alloy ($In_2O_3$—ZnO), or the metal oxide material including silicon or silicon oxide can be used. Further, an Al material to which an element such as Si, Ti, Ta, W, Mo, Cr, Nd, Sc, or Y which prevents generation of hillocks or whiskers which will be generated in an Al film, may be used. In this case, heat resistance can be improved.

Further, the conductive film may have a single-layer structure or a stacked-layer structure of two or more layers. For example, a single-layer structure of an aluminum film including silicon; a two-layer structure of an aluminum film and a titanium film stacked thereover; a three-layer structure of a Ti film, an aluminum film stacked thereover, and a Ti film stacked thereover can be given. Further, a stacked-layer structure in which a metal layer of Al, Cu, or the like and a refractory metal layer of Cr, Ta, Ti, Mo, W, or the like are stacked may be employed.

Figure 14B:
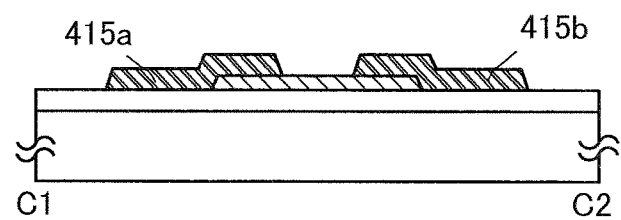

Then, by a second photolithography step, a resist mask is formed over the conductive film, and selective etching is performed, whereby the first electrode 415a and the second electrode 415b are forming, and then, the resist mask is removed (see FIG. 14B). The first electrode 415a serves as one of a source electrode and a drain electrode while the second electrode 415b serves as the other of the source electrode and the drain electrode. Here, the first electrode 415a and the second electrode 415b are preferably etched so as to have tapered ends because coverage with the gate insulating layer formed thereon will be improved. Note that resist mask for forming the first electrode 415a and the second electrode 415b may be formed by an ink jetting method. The formation of the resist mask by an ink jetting method does not use a photomask; thus, manufacturing cost can be reduced.

In this embodiment, as the first electrode 415a and the second electrode 415b, a 150-nm-thick titanium film is formed by a sputtering method.

Note that in order to prevent the oxide semiconductor layer 412 from being removed and the insulating layer 407 thereunder from being exposed in the etching of the conductive film, their materials and etching conditions of the conductive film need to be adjusted as appropriate. Therefore, in this embodiment, an In—Ga—Zn—O-based oxide semiconductor is used as the oxide semiconductor layer 412, a titanium firm is used as the conductive film, and an ammonium hydrogen peroxide mixture (a mixture of ammonia, water, and a hydrogen peroxide solution) is used as an etchant so that part of the oxide semiconductor layer 412 is not etched. However, the present invention is not limited thereto. Part of the oxide semiconductor layer 412 may be etched by the second photolithography step and an oxide semiconductor layer having a groove (a depression portion) can be formed.

Ultraviolet, KrF laser light, or ArF laser light is used for light exposure for forming the resist mask in the second photolithography step. A channel length L of the transistor to be formed later depends on the width of an interval between a lower end of the first electrode and a lower end of the second electrode which are adjacent to each other over the oxide semiconductor layer 412. Note that when light exposure is performed to provide the channel length L of less than 25 nm, extreme ultraviolet with extremely short wavelengths of several nanometers to several tens of nanometers is used for light exposure for forming the resist mask in the second photolithography step. Light exposure with extreme ultraviolet leads to a high resolution and a large depth of focus. Accordingly, the channel length L of the transistor to be formed later can be set to 10 nm to 1000 nm inclusive. In this case, an increase in operation speed of the transistor can be achieved, and further, a reduction in power consumption of the transistor can be achieved due to extremely small off current.

Figure 14C:
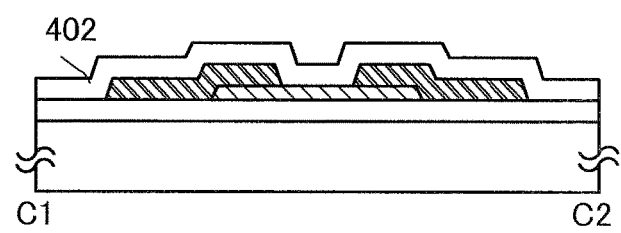

Then, the gate insulating layer 402 is formed over the insulating layer 407, the oxide semiconductor layer 412, the first electrode 415a, and the second electrode 415b (see FIG. 14C).

The gate insulating layer 402 can be formed to have a single-layer structure or a stacked-layer structure including any of a silicon oxide layer, a silicon nitride layer, a silicon oxynitride layer, a silicon nitride oxide layer, and an aluminum oxide layer by a plasma CVD method, a sputtering method, or the like.

The gate insulating layer 402 is preferably formed in a manner such that hydrogen is not included in the gate insulating layer 402. Thus, the gate insulating layer 402 is preferably formed by a sputtering method, in which hydrogen can be reduced to a very low level in an atmosphere during the disposition. In the case of forming a silicon oxide film by a sputtering method, a silicon target or a quartz target is used as a target, and oxygen or a mixed gas of oxygen and argon is used as a sputtering gas.

The gate insulating layer 402 can have a structure in which a silicon oxide layer and a silicon nitride layer are stacked over the first electrode 415a and the second electrode 415b. For example, a silicon oxide layer ($SiO_x$ (x>0)) with a thickness of 5 nm to 300 nm inclusive may be formed as a first gate insulating layer and a silicon nitride layer ($SiN_y$ (y>0)) with a thickness of 50 nm to 200 nm inclusive may be formed as a second gate insulating layer over the first gate insulating layer to provide a gate insulating layer with a thickness of 100 nm. In this embodiment, a silicon oxide layer having a thickness of 100 nm is formed by an RF sputtering method under a pressure of 0.4 Pa, a high-frequency power of 1.5 kW, and an atmosphere of oxygen and argon (the flow rate ratio of oxygen to argon is 25 sccm:25 sccm=1:1).

Figure 14D:
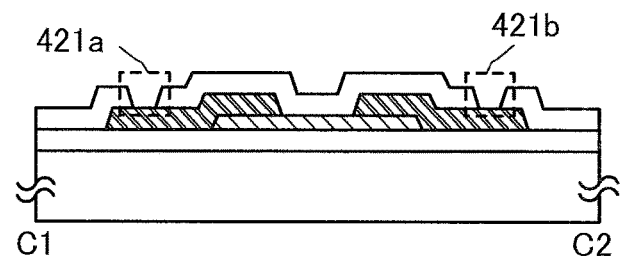

Next, by a third photolithography step, a resist mask is formed, and selective etching is performed, whereby part of the gate insulating layer 402 partly removed; thus, openings 421a and 421b reaching the first electrode 415a and the second electrode 415b are formed (see FIG. 14D). Note that the formation of the resist mask by an ink jetting method does not use a photomask; thus, manufacturing cost can be reduced.

Then, after a conductive film is formed over the gate insulating layer 402 and in the openings 421a and 421b, the gate electrode 411, the first wiring 414a and the second wiring 414b are formed in a fourth photolithography step.

The gate electrode 411, the first wiring 414a, and the second wiring 414b can be formed to have a single-layer structure or a stacked-layer structure using a metal material such as molybdenum, titanium, chromium, tantalum, tungsten, aluminum, copper, neodymium, or scandium, or an alloy material containing any of these materials as the main component. Specific examples of a two-layer structure of the gate electrode 411, the first wiring 414a, and the second wiring 414b include a structure including an aluminum layer and a molybdenum layer thereover, a structure including a copper layer and a molybdenum layer thereover, a structure including a copper layer and a titanium nitride layer or a tantalum nitride layer thereover, and a structure including a titanium nitride layer and a molybdenum layer thereover. Specific examples of a three-layer structure includes a structure in which a tungsten layer or a tungsten nitride layer, an alloy layer of aluminum and silicon or aluminum and titanium, and a titanium nitride layer or a titanium layer are stacked. Note that the gate electrode layer can be formed using a light-transmitting conductive film. As a light-transmitting conductive film, a film of a light-transmitting conductive oxide can be specifically given.

In this embodiment, as the gate electrode 411, the first wiring 414a, and the second wiring 414b, a 150-nm-thick titanium film is formed by a sputtering method.

Then, second heat treatment (preferably, at 200° C. to 400° C. inclusive, for example, at 250° C. to 350° C. inclusive) is performed in an inert gas atmosphere or in an oxygen gas atmosphere. In this embodiment, the second heat treatment is performed in a nitrogen atmosphere at 250° C. for one hour. Note that the second heat treatment may be performed after a protective insulating layer or a planarization insulating layer is formed over the transistor 410.

Heat treatment may be further performed at 100° C. to 200° C. inclusive in air for 1 hour to 30 hours inclusive. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating layer. Under reduced pressure, the heating time can be shortened, which is preferable.

Figure 14E:
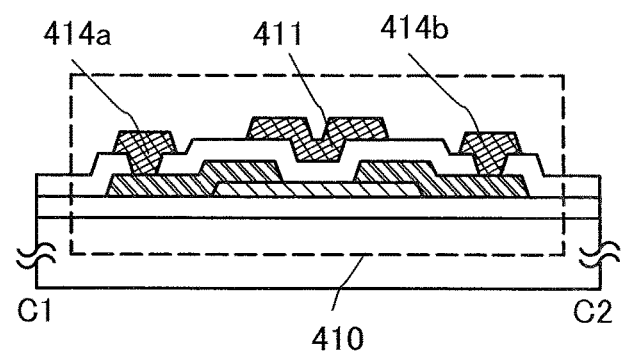

Through the above process, the transistor 410 including the high-purity oxide semiconductor layer 412 in which the concentration of hydrogen, moisture, hydride, and hydroxide is reduced can be formed (see FIG. 14E). The transistor 410 can be used as the first transistor 6401 described in Embodiment 1, for example.

A protective insulating layer or a planarization insulating layer for planarization may be provided over the transistor 410. The protective insulating layer can be formed to have a single-layer structure or a stacked-layer structure including any of a silicon oxide layer, a silicon nitride layer, a silicon oxynitride layer, a silicon nitride oxide layer, and an aluminum oxide layer. The planarization insulating layer can be formed of a heat-resistant organic material, such as polyimide, acrylic resin, benzocyclobutene resin, polyamide, or epoxy resin. As an alternative to such organic materials, it is also possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed of any of these materials.

Here, the siloxane-based resin corresponds to a resin including a Si—O—Si bond which is formed using a siloxane-based material as a starting material. The siloxane-based resin may include an organic group (e.g., an alkyl group or an aryl group) or a fluoro group as a substituent. The organic group may include a fluoro group.

The method for forming the planarization insulating layer is not particularly limited. Depending on the material, the planarization insulating layer can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like.

As described above, by removing moisture remaining in the reaction atmosphere in the formation of the oxide semiconductor layer, the concentration of hydrogen and hydride in the oxide semiconductor layer can be reduced.

Off current can be reduced by using the transistor including an oxide semiconductor layer, which is described in this embodiment, in a pixel in a display portion of a display device. Accordingly, a period in which a storage capacitor can hold voltage can be extended; thus, power consumption for displaying a still image or the like can be reduced. Further, supply of a control signal is stopped when a still image is displayed, whereby power consumption can be further reduced. In addition, a still image and a moving image can be switched without malfunction.

(Embodiment 4)

In this embodiment, a structural example of the first transistor 6401 described in Embodiment 1 and an example of a manufacturing method thereof will be described. In other words, a structural example of a transistor including a high-purity oxide semiconductor and an example of a manufacturing method thereof will be described with reference to FIGS. 15A to 15E.

Figure 15A:
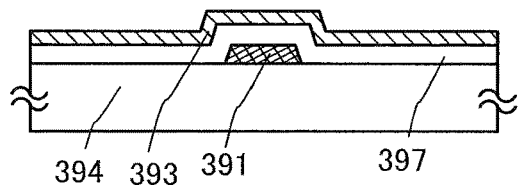
FIGS. 15A to 15E are cross-sectional views illustrating an example of a method for manufacturing a transistor.
Figure 15B:
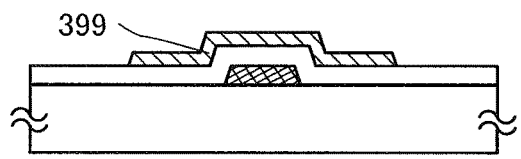
Figure 15C:
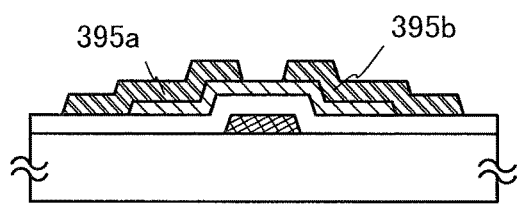
Figure 15D:
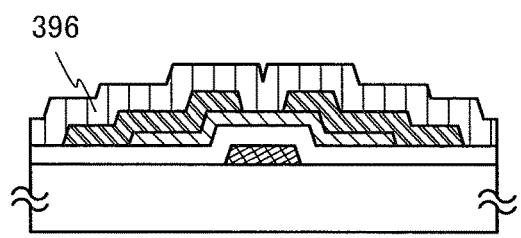
Figure 15E:
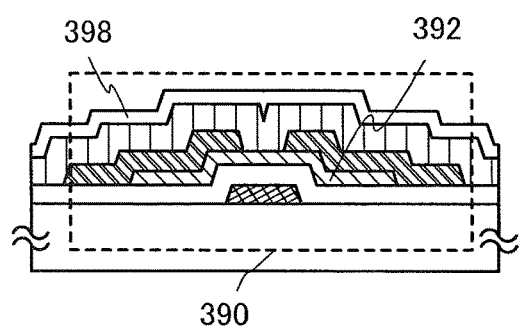
Figure 16A:
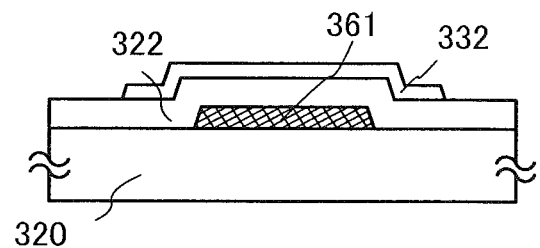
FIGS. 16A to 16D are cross-sectional views illustrating an example of a method for manufacturing a transistor.
Figure 16B:
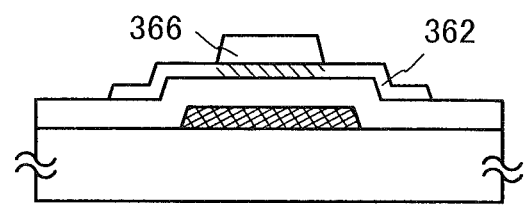
Figure 16C:
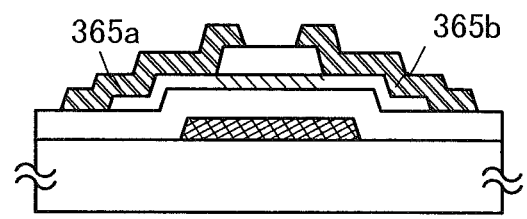
Figure 16D:
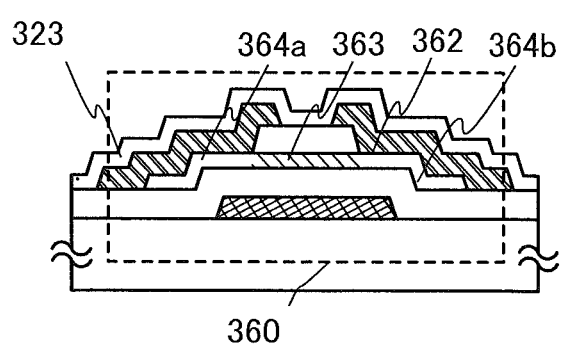

FIGS. 15A to 15E illustrate an example of a cross-sectional structure of a transistor. A transistor 390 illustrated in FIG. 15E is one type of a bottom gate structure and is also referred to as an inverted staggered transistor. The transistor 390 can be used as the first transistor 6401 described in Embodiment 1, for example. Note that although the transistor 390 has a single-gate structure, the present invention is not limited to the structure. The transistor may have a multi-gate structure which includes a plurality of gate electrodes and a plurality of channel formation regions.

A process of manufacturing the transistor 390 over a substrate 394 will be described below with reference to FIGS. 15A to 15E.

First, a conductive film is formed over the substrate 394, and then, a gate electrode 391 is formed by a first photolithography step. It is preferable that an end portion of the formed gate electrode be tapered because coverage with a gate insulating layer formed thereover is improved. Note that a resist mask may be formed by an ink jetting method. The formation of the resist mask by an ink jetting method does not use a photomask; thus, manufacturing cost can be reduced.

For the material of the substrate 394, a material similar to that of the substrate 400 described in Embodiment 3 can be employed. For the material and the formation method of the gate electrode 391, a material and a method similar to those of the gate electrode 411 described in Embodiment 3 can be employed.

Note that an insulating film serving as a base film may be provided between the substrate 394 and the gate electrode 391. The base film has a function of preventing diffusion of impurity elements from the substrate 394, and can be formed to have a single-layer structure or a stacked-layer structure including one or more of a silicon nitride film, a silicon oxide film, a silicon nitride oxide film, and a silicon oxynitride film.

Then, a gate insulating layer 397 is formed over the gate electrode 391.

The gate insulating layer 397 can be formed to have a single-layer structure or a stacked-layer structure including any of a silicon oxide layer, a silicon nitride layer, a silicon oxynitride layer, a silicon nitride oxide layer, and an aluminum oxide layer by a plasma CVD method, a sputtering method, or the like. Note that in order to prevent the gate insulating layer 397 from containing a large amount of hydrogen, the gate insulating layer 397 is preferably formed by a sputtering method. In the case of forming a silicon oxide film by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked over the gate electrode 391. For example, a silicon nitride layer ($SiN_y$ (y>0)) with a thickness of 50 nm to 200 nm inclusive may be formed by a sputtering method as a first gate insulating layer and a silicon oxide layer ($SiO_x$ (x>0)) with a thickness of 5 urn to 300 nm inclusive may be formed as a second gate insulating layer over the first gate insulating layer to provide a gate insulating layer with a thickness of 100 nm.

Then, the oxide semiconductor layer 393 is formed with a thickness of 2 nm to 200 nm inclusive over the gate insulating layer 397 (see FIG. 15A).

For the material and the formation method of the oxide semiconductor layer 393, a material and a method similar to those of the oxide semiconductor layer (the island-shaped oxide semiconductor layer 412) described in Embodiment 3 can be employed.

As an example of the deposition condition in the case where the oxide semiconductor layer 393 is formed by a sputtering method, the following condition can be given: the distance between the substrate and the target is 100 mm, the pressure is 0.6 Pa, the direct current (DC) power supply is 0.5 kW, and the atmosphere is oxygen (the proportion of the oxygen flow is 100%). Note that a pulse direct current (DC) power supply is preferable because powder substances (also referred to as particles or dust) generated in the deposition can be reduced and the film thickness can be made uniform. The thickness of the oxide semiconductor layer 393 is preferably 2 nm to 200 nm inclusive, preferably 5 nm to 30 nm inclusive. Note that an appropriate thickness of the oxide semiconductor layer varies depending on the material; therefore, the thickness may be determined as appropriate depending on the material.

Note that before the oxide semiconductor layer 393 is formed, dust attached to a surface of the gate insulating layer 397 is preferably removed by reverse sputtering in which an argon gas is introduced and plasma is generated.

Further, in order that hydrogen, hydroxyl, and moisture may be contained in the gate insulating layer 397 and the oxide semiconductor layer 393 as little as possible, it is preferable that the substrate 394 over which the gate electrode 391 is formed or the substrate 394 over which layers up to the gate insulating layer 397 are formed be preheated in a preheating chamber of a sputtering apparatus as pretreatment for the film formation so that impurities such as hydrogen and moisture adsorbed to the substrate 394 are removed and evacuated. The temperature of the preheating may be 100° C. to 400° C. inclusive, preferably 150° C. to 300° C. inclusive. As an evacuation means, a cryopump is preferably provided in the preheating chamber. Further, this preheating may be similarly performed on the substrate 394 over which layers up to and including a first electrode 395a and a second electrode 395b are formed, before the formation of a protective insulating layer 396.

Then, an oxide semiconductor layer is processed into an island-shaped oxide semiconductor layer 399 by a second photolithography step (see FIG. 15B). Note that for the process method of the island-shaped oxide semiconductor layer 399, a process method of similar to that of the island-shaped oxide semiconductor layer 412 described in Embodiment 3 can be employed.

Note that it is preferable that reverse sputtering be performed before formation of a conductive film in the subsequent step in order to remove a resist residue or the like attached on the surfaces of the oxide semiconductor layer 399 and the gate insulating layer 397.

Then, a conductive film is formed over the gate insulating layer 397 and the oxide semiconductor layer 399. The conductive film may be formed by a sputtering method or a vacuum evaporation method. As a material of the conductive film, an element selected from Al, Cr, Cu, Ta, Ti, Mo, and W; an alloy containing any of these elements as a component; an alloy containing a plurality of these elements in combination; and the like can be used. Further, one or more materials selected from manganese, magnesium, zirconium, beryllium, and thorium may be used. Further, a light-transmitting conductive film may be used. As a light-transmitting conductive film, a film of a light-transmitting conductive oxide can be specifically given.

Further, the conductive film may have a single-layer structure or a stacked-layer structure of two or more layers. For example, a single-layer structure of an aluminum film including silicon; a two-layer structure of an aluminum film and a titanium film stacked thereover; a three-layer structure of a Ti film, an aluminum film stacked thereover, and a Ti film stacked thereover can be given.

Then, by a third photolithography step, a resist mask is formed over the conductive film, and selective etching is performed, whereby the first electrode 395a and the second electrode 395b are formed, and then, the resist mask is removed (see FIG. 15C). Here, in order to prevent the oxide semiconductor layer 399 from being removed and the gate insulating layer 397 thereunder from being exposed in the etching of the conductive film, their materials and etching conditions of the conductive film need to be adjusted as appropriate. Therefore, in this embodiment, an In—Ga—Zn—O-based oxide semiconductor is used as the oxide semiconductor layer 399, a titanium firm is used as the conductive film, and an ammonium hydrogen peroxide mixture (a mixture of ammonia, water, and a hydrogen peroxide solution) is used as an etchant so that part of the oxide semiconductor layer 399 is not etched. However, the present invention is not limited thereto. Part of the oxide semiconductor layer 399 may be etched by the third photolithography step and an oxide semiconductor layer having a groove (a depression portion) can be formed.

Ultraviolet, KrF laser light, or ArF laser light is used for light exposure for forming the resist mask in the third photolithography step. A channel length L of the transistor to be formed later depends on the width of an interval between a lower end of the first electrode 395a and a lower end of the second electrode 395b which are adjacent to each other over the oxide semiconductor layer 399. Note that when light exposure is performed to provide the channel length L of less than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of focus. Accordingly, the channel length L of the transistor to be formed later can be set to 10 nm to 1000 nm inclusive, which will lead to an increase in operation speed of the circuit, and further, a reduction in power consumption of the transistor due to extremely small off current.

Further, in order to reduce the number of photomasks used in the photolithography steps and reduce the number of photolithography steps, an etching step may be performed with the use of a multi-tone mask which is a light-exposure mask through which light is transmitted to have a plurality of intensities. A resist mask formed using a multi-tone mask has a plurality of thicknesses and further can be changed in shape by being etched, and therefore, can be used in a plurality of etching steps to provide different patterns. Therefore, a resist mask corresponding to at least two kinds of different patterns can be formed using one multi-tone mask. Thus, the number of light-exposure masks can be reduced and the number of corresponding photolithography steps can also be reduced, whereby simplification of the process can be realized.

In addition, plasma treatment using a gas such as $N_2O$, $N_2$, or Ar may be performed to remove water or the like adsorbed on an exposed surface of the oxide semiconductor layer 399. Plasma treatment may be performed using a mixed gas of oxygen and argon. In this embodiment, either plasma treatment is performed.

Then, after the plasma treatment, a protective insulating layer 396 which is in contact with the exposed oxide semiconductor layer 399, the first electrode 395a, and the second electrode 395b is formed without exposure to air (see FIG. 15D). At this time, it is preferable that the protective insulating layer 396 be formed while moisture remaining in the process chamber is removed so that the oxide semiconductor layer 399 and the protective insulating layer 396 can be prevented from including hydrogen, hydroxyl, or moisture. In order to remove moisture remaining in the process chamber, a capture-type vacuum pump is preferably used. For example, a cryopump, an ion pump, or a titanium sublimation pump is preferably used. In a chamber which is evacuated with a cryopump, hydrogen atoms, compounds including hydrogen atoms such as water ($H_2O$), and the like are exhausted. Accordingly, the concentration of impurities included in the protective insulating layer 396 formed in the process chamber can be reduced.

In this embodiment, an oxide insulating layer is formed as the protective insulating layer 396. For the formation of the protective insulating layer 396, the substrate 394 over which layers up to the island-shaped oxide semiconductor layer 399, the first electrode 395a, and the second electrode 395b are formed is kept at room temperature or heated to a temperature lower than 100° C., a sputtering gas including high-purity oxygen from which hydrogen and moisture are removed is introduced, and a silicon semiconductor target is used, whereby a silicon oxide layer is formed. Note that instead of a silicon oxide layer, a silicon oxynitride layer, an aluminum oxide layer, an aluminum oxynitride layer, or the like can be used as the oxide insulating layer.

For example, a silicon oxide layer is formed by a pulsed DC sputtering method under the following condition: a boron-doped silicon target which has a purity of 6N (the resistivity is 0.01 Ωcm) is used; the distance between the substrate and the target (T-S distance) is 89 mm; the pressure is 0.4 Pa, the direct-current (DC) power supply is 6 kW, and the atmosphere is oxygen (the proportion of the oxygen flow is 100%). The thickness of the silicon oxide layer is 300 nm. Note that instead of a silicon target, quartz (preferably, synthetic quartz) can be used. As a sputtering gas, an oxygen gas or a mixed gas of oxygen and argon may be used.

Further, heat treatment is preferably performed at 100° C. to 400° C. inclusive while the protective insulating layer 396 and the oxide semiconductor layer 399 are in contact with each other. By the heat treatment, impurities such as hydrogen, moisture, hydroxyl, or hydride contained in the oxide semiconductor layer 399 is diffused into the protective insulating layer 396 so that the impurities contained in the oxide semiconductor layer 399 may be further reduced.

Through the above process, the transistor 390 including the oxide semiconductor layer 392 in which the concentration of hydrogen, moisture, hydroxyl, and hydroxide is reduced can be formed (see FIG. 15E). As described in this embodiment, by removing moisture remaining in the reaction atmosphere in the formation of the oxide semiconductor layer, the concentration of hydrogen and hydride in the oxide semiconductor layer can be reduced. As a result, an intrinsic or substantially intrinsic semiconductor can be obtained.

Note that an insulating layer may be additionally provided over the protective insulating layer 396. In this embodiment, a protective insulating layer 398 is formed over the protective insulating layer 396. As the insulating layer 398, a silicon nitride film, a silicon nitride oxide film, an aluminum nitride film, an aluminum nitride oxide film, or the like may be used.

For the formation of the insulating layer 398, the substrate 394 over which layers up to the protective insulating layer 396 are formed is heated to a temperature of 100° C. to 400° C., a sputtering gas including high-purity nitrogen from which hydrogen and moisture are removed is introduced, and a silicon semiconductor target is used, whereby a silicon nitride film is formed. In this step also, it is preferable that the insulating layer 398 be formed while moisture remaining in the process chamber is removed as in the case of the protective insulating layer 396. By heating the substrate 394 to 100° C. to 400° C. in the deposition of the insulating layer 398, hydrogen or moisture in the oxide semiconductor layer 399 can be diffused into the insulating layer 398. In that case, heat treatment is not necessarily performed directly after the formation of the protective insulating layer 396.

In the case where a silicon oxide layer is formed as the protective insulating layer 396 and a silicon nitride layer is formed as the insulating layer 398, the silicon oxide layer and the silicon nitride layer can be formed in the same process chamber using the same silicon target. First, an etching gas including oxygen is introduced and a silicon oxide layer is formed using a silicon target provide in the process chamber, and then the etching gas is switched to an etching gas including nitrogen and a silicon nitride layer is formed using the same silicon target. Since the silicon oxide layer and the silicon nitride layer can be formed in succession without exposure to air, impurities such as hydrogen or moisture can be prevented from being adsorbed on a surface of the silicon oxide layer. Note that after the silicon oxide layer is formed as the protective insulating layer 396 and the silicon nitride layer is formed thereover as the insulating layer 398, heat treatment (at a temperature of 100° C. to 400° C.) for diffusion of hydrogen or moisture in the oxide semiconductor layer into the oxide insulating layer is preferably performed.

After the formation of the protective insulating layer 396, heat treatment may be further performed at 100° C. to 200° C. inclusive in air for 1 hour to 30 hours inclusive. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating layer. Under reduced pressure, the heating time can be shortened.

Since the above process can be performed at a temperature of 400° C. or lower, the process can be preferably applied to a manufacturing process using a glass substrate having a side longer than 1 m and a thickness of 1 mm or less. In addition, since the whole process can be performed at a treatment temperature of 400° C. or lower, a display panel can be manufactured with less energy consumption.

Off current can be reduced by using the transistor including an oxide semiconductor layer, which is described in this embodiment, in a pixel in a display portion of a display device. Accordingly, a period in which a storage capacitor can hold voltage can be extended; thus, power consumption for displaying a still image or the like can be reduced. Further, supply of a control signal is stopped when a still image is displayed, whereby power consumption can be further reduced. In addition, a still image and a moving image can be switched without malfunction.

(Embodiment 5)

In this embodiment, a structural example of the first transistor 6401 described in Embodiment 1 and an example of a manufacturing method thereof will be described. In other words, a structural example of a transistor including a high-purity oxide semiconductor and an example of a manufacturing method thereof will be described with reference to FIGS. 16A to 16D.

FIGS. 16A to 16D illustrate an example of a cross-sectional structure of a transistor. A transistor 360 illustrated in FIG. 16A to 16D is one type of a bottom gate structure called a channel-protective type (channel-stop type) and is also referred to as an inverted staggered transistor. The transistor 360 can be used as the first transistor 6401 described in Embodiment 1. Note that although the transistor 360 has a single-gate structure, the present invention is not limited to the structure. The transistor may have a multi-gate structure which includes a plurality of gate electrodes and a plurality of channel formation regions.

A process of manufacturing the transistor 360 over a substrate 320 will be described below with reference to FIGS. 16A to 16D.

First, a conductive film is formed over the substrate 320, and then, a gate electrode 361 is formed by a first photolithography step. For the material of the substrate 320, a material similar to that of the substrate 394 described in Embodiment 4 can be employed. For the material and the formation method of the gate electrode 361, a material and a method similar to those of the gate electrode 391 described in Embodiment 4 can be employed.

Then, a gate insulating layer 322 is formed over the gate electrode 361. For the material of the gate insulating layer 322, a material similar to that of the gate insulating layer 397 described in Embodiment 4 can be employed. In this embodiment, a silicon oxynitride layer having a thickness of 100 nm or less is formed by a plasma CVD method as the gate insulating layer 322.

Then, an oxide semiconductor layer having a thickness of 2 nm to 200 nm inclusive is formed over the gate insulating layer 322 and processed into an island-shaped oxide semiconductor layer by a second photolithography step. For the material and the formation method of the island-shaped oxide semiconductor layer, a material and a method similar to those of the island-shaped oxide semiconductor layer 399 described in Embodiment 4 can be employed. In this embodiment, the oxide semiconductor layer is formed by a sputtering method using an In—Ga—Zn—O-based oxide semiconductor target.

Then, dehydration or dehydrogenation of the oxide semiconductor layer is performed. The temperature of the first heat treatment for dehydration or dehydrogenation is 400° C. to 750° C. inclusive, preferably 400° C. or higher and lower than the strain point of the substrate. Here, the substrate is put in an electric furnace which is one type of heat treatment apparatus and heat treatment is performed on the oxide semiconductor layer in a nitrogen atmosphere at 450° C. for one hour. After that, the oxide semiconductor layer is prevented from being exposed to air and from again including water or hydrogen; thus the oxide semiconductor layer 332 is obtained (see FIG. 16A).

Then, plasma treatment using a gas such as $N_2O$, $N_2$, or Ar is performed. By this plasma treatment, adsorbed water or the like of an exposed surface of the oxide semiconductor layer is removed. Plasma treatment may be performed using a mixed gas of oxygen and argon.

Then, an oxide insulating layer is formed over the gate insulating layer 322 and the oxide semiconductor layer 332. Then, by a third photolithography step, a resist mask is formed, and selective etching is performed, whereby the oxide insulating layer 366 is formed, and then, the resist mask is removed.

In this embodiment, a 200-nm-thick silicon oxide film is formed as the oxide insulating layer 366 by a sputtering method. The substrate temperature in film formation may be room temperature to 300° C. inclusive, and in this embodiment, the substrate temperature is 100° C. The silicon oxide film can be formed by a sputtering method in a rare gas (typically, argon) atmosphere, an oxygen atmosphere, or an atmosphere including a rare gas (typically, argon) and oxygen. As a target, a silicon oxide target or a silicon target can be used. For example, with use of a silicon target, a silicon oxide film can be formed by a sputtering method in an atmosphere of oxygen and nitrogen. The oxide insulating layer 366 which is formed in contact with the oxide semiconductor layer is formed using an inorganic insulating film which does not include impurities such as moisture, a hydrogen ion, and OH⁻ and which prevents entry of them from the outside; for example, a silicon oxide film, a silicon oxynitride film, an aluminum oxide film, an aluminum oxynitride film, or the like can be typically used.

At this time, it is preferable that the oxide insulating layer 366 be formed while moisture remaining in the process chamber is removed so that the oxide semiconductor layer 332 and the oxide insulating layer 366 can be prevented from including hydrogen, hydroxyl, or moisture. As for a method for removing moisture remaining in the process chamber, the method described in other embodiments can be employed.

Then, second heat treatment (preferably, at 200° C. to 400° C. inclusive, for example, at 250° C. to 350° C. inclusive) is preferably performed in an inert gas atmosphere or in an oxygen gas atmosphere. For example, the second heat treatment is performed in a nitrogen atmosphere at 250° C. for one hour. In the second heat treatment, a portion of the oxide semiconductor layer (a channel formation region) is heated while being in contact with the oxide insulating layer 366.

In this embodiment, heat treatment is performed on a region of the oxide semiconductor layer 332 which is not covered with the oxide insulating layer 366 in nitrogen, an inert atmosphere, or under reduced pressure. By the heat treatment in nitrogen, an inert gas atmosphere, or under reduced pressure, the region of the oxide semiconductor layer 332 which is not covered with the oxide insulating layer 366 is dehydrogenated and brought into an oxygen-deficient state, and thereby reduced in resistance. For example, the heat treatment may be performed in a nitrogen atmosphere at 250° C. for one hour.

By the heat treatment on the oxide semiconductor layer 332 over which the oxide insulating layer 366 is formed in a nitrogen atmosphere, the resistance of the exposed region of the oxide semiconductor layer 332 is reduced; thus, an oxide semiconductor layer 362 including regions with different resistances (indicated as a shaded region and a white region in FIG. 16B) is formed.

Then, a conductive film is formed over the gate insulating layer 322, the oxide semiconductor layer 362, and the oxide insulating layer 366. After that, by a fourth photolithography step, a resist mask is formed, and selective etching is performed to form a first electrode 365a and a second electrode 365b. Then, the resist mask is removed (see FIG. 16C).

As a material of the first electrode 365a and the second electrode 365b, an element selected from Al, Cr, Cu, Ta, Ti, Mo, and W, an alloy containing any of these elements as a component, an alloy film containing any of these the elements in combination, or the like can be given. Further, the metal conductive film may have a single-layer structure or a stacked-layer structure of two or more layers.

Through the above steps, heat treatment for dehydration or dehydrogenation is performed on the oxide semiconductor layers after deposition to reduce the resistance, and then, part of the oxide semiconductor layers is selectively brought into an oxygen-excess state. As a result, the channel formation region 363 which overlaps with the gate electrode 361 becomes an i-type region. In addition, a low-resistance source region 364a which overlaps with the first electrode 365a, and a low-resistance drain region 364b which overlaps with the second electrode 365b are formed in a self-aligned manner. Through the above steps, the transistor 360 is formed.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating film. Under reduced pressure, the heating time can be shortened.

By forming the low-resistance drain region 364b (or the low-resistance source region 364a) in part of the oxide semiconductor layer which overlaps with the second electrode 365b (or the first electrode 365a), the reliability of the transistor can be improved. Specifically, by forming the low-resistance drain region 364b, the conductivity can vary stepwise from the drain electrode to the low-resistance drain region 364b and the channel formation region 363. Therefore, in the case where the transistor operates with the second electrode 365b connected to a wiring for supplying a high power supply potential VDD, the low-resistance drain region serves as a buffer and a high electric field is not applied locally even if a high electric field is applied between the gate electrode 361 and the second electrode 365b; thus, the breakdown voltage of the transistor can be improved.

Then, a protective insulating layer 323 is formed over the first electrode 365a, the second electrode 365b, and the oxide insulating layer 366. In this embodiment, the protective insulating layer 323 is formed using a silicon nitride film (see FIG. 16D).

Off current can be reduced by using the transistor including an oxide semiconductor layer, which is described in this embodiment, in a pixel in a display portion of a display device. Accordingly, a period in which a storage capacitor can hold voltage can be extended; thus, power consumption for displaying a still image or the like can be reduced. Further, supply of a control signal is stopped when a still image is displayed, whereby power consumption can be further reduced. In addition, a still image and a moving image can be switched without malfunction.

(Embodiment 6)

In this embodiment, another example of a transistor which can be applied to the display device disclosed in this specification will be described. A transistor 350 in this embodiment can be used as, for example, the transistor 6401 in each pixel of the pixel portion described in Embodiment 1.

Figure 17A:
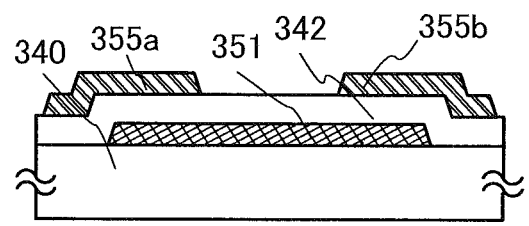
FIGS. 17A to 17D are cross-sectional views illustrating an example of a method for manufacturing a transistor.
Figure 17B:
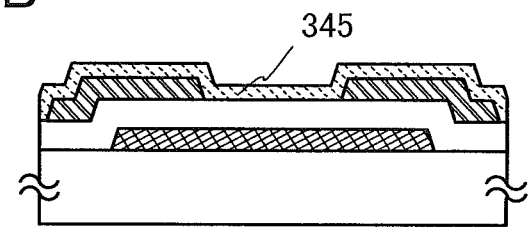
Figure 17C:
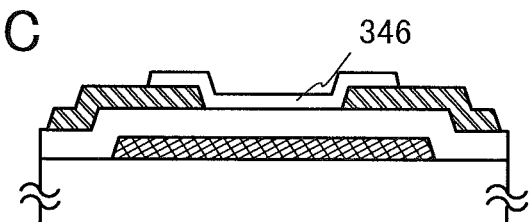
Figure 17D:
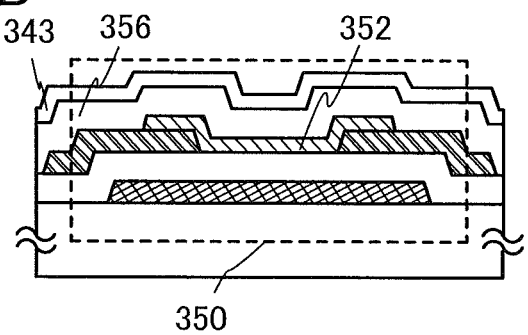

Although the transistor 350 in FIG. 17D has a single-gate structure, the present invention is not limited to the structure. The transistor may have a multi-gate structure which includes a plurality of gate electrodes and a plurality of channel formation regions.

A process of manufacturing the transistor 350 over a substrate 340 will be described below with reference to FIGS. 17A to 17D.

First, a conductive film is formed over the substrate 340, and then, a gate electrode 351 is formed by a first photolithography step. In this embodiment, a 150-nm-thick tungsten film is formed as the gate electrode 351 by a sputtering method.

Then, a gate insulating layer 342 is formed over the gate electrode 351. In this embodiment, a silicon oxynitride film having a thickness of 100 nm or less is formed by a plasma CVD method as the gate insulating layer 342.

Then, a conductive film is formed over the gate insulating layer 342. By a second photolithography step, a resist mask is formed over the conductive film, and selective etching is performed, whereby a source electrode 355a and the drain electrode 355b are formed, and then, the resist mask is removed (see FIG. 17A).

Then, an oxide semiconductor layer 345 is formed (see FIG. 17B). In this embodiment, the oxide semiconductor layer 345 is formed by a sputtering method using an In—Ga—Zn—O-based metal oxide target. Then, the oxide semiconductor layer 345 is processed into an island-shaped oxide semiconductor layer by a third photolithography step.

In the step of forming the oxide semiconductor layer 345, it is preferable that the oxide semiconductor layer 345 be formed while moisture remaining in the process chamber is removed so that the oxide semiconductor layer 345 can be prevented from including hydrogen, hydroxyl, or moisture. As for a method for removing moisture remaining in the process chamber, the method described in other embodiments can be employed.

Then, first treatment is performed on the oxide semiconductor layer for dehydration or dehydrogenation. The temperature of the first heat treatment is 400° C. to 750° C. inclusive, preferably 400° C. or higher and lower than the strain point of the substrate. Here, the substrate is put in an electric furnace which is one type of heat treatment apparatus and heat treatment is performed on the oxide semiconductor layer in a nitrogen atmosphere at 450° C. for one hour. After that, the oxide semiconductor layer is prevented from being exposed to air and from again including water or hydrogen; thus an oxide semiconductor layer 346 is obtained (see FIG. 17C).

The first heat treatment can employ GRTA, in which the substrate is transferred into an inert gas heated to a high temperature of 650° C. to 700° C., and heated for several minutes there, and then the substrate is transferred out of the inert gas heated to a high temperature.

Then, an oxide insulating layer 356 is formed in contact with the oxide semiconductor layer 346. The oxide insulating layer 356 can be formed with a thickness of 1 nm or more by a method by which impurities such as water or hydrogen is not mixed into the oxide insulating layer 356 (e.g., a sputtering method) as appropriate. When hydrogen is included in the oxide insulating layer 356, entry of hydrogen to the oxide semiconductor layer or extraction of oxygen in the oxide semiconductor layer by the hydrogen is caused, and thus a backchannel of the oxide semiconductor layer comes to have low resistance (to have n-type), whereby a parasitic channel might be formed. Therefore, it is important to form the oxide insulating layer 356 by a method by which hydrogen included in the oxide insulating layer 356 is reduced as much as possible.

Note that for the material and the formation method of the oxide insulating layer 356, a material and a method similar to those of the oxide insulating layer 396 described in Embodiment 4 can be employed.

Then, second heat treatment (preferably, at 200° C. to 400° C. inclusive, for example, at 250° C. to 350° C. inclusive) is performed in an inert gas atmosphere or in an oxygen gas atmosphere. For example, the second heat treatment is performed in a nitrogen atmosphere at 250° C. for one hour. In the second heat treatment, the oxide semiconductor layer is heated while being in contact with the oxide insulating layer 356.

Through the above steps, heat treatment for dehydration or dehydrogenation is performed on the oxide semiconductor layers after deposition to reduce the resistance, and then, the oxide semiconductor layers is brought into an oxygen-excess state. As a result, an i-type oxide semiconductor layer 352 is formed. Through the above steps, the transistor 350 is formed.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating film. Under reduced pressure, the heating time can be shortened. With such heat treatment, hydrogen is introduced from the oxide semiconductor layer to the oxide insulating layer; thus, a normally-off transistor can be obtained. Thus, the reliability of a display device can be increased.

Note that an insulating layer may be additionally provided over the oxide insulating layer 356. In this embodiment, an insulating layer 343 is formed over the oxide insulating layer 356 (see FIG. 17D). For the material and the formation method of the insulating layer 343, a material and a method similar to those of the protective insulating layer 398 described in Embodiment 4 can be employed.

Further, a planarization insulating layer may be provided for the purpose of planarizing a surface over the insulating layer 343.

Off current can be reduced by using the transistor including an oxide semiconductor layer, which is described in this embodiment, in a pixel in a display portion of a display device. Accordingly, a period in which a storage capacitor can hold voltage can be extended; thus, power consumption for displaying a still image or the like can be reduced. Further, supply of a control signal is stopped when a still image is displayed, whereby power consumption can be further reduced. In addition, a still image and a moving image can be switched without malfunction.

(Embodiment 7)

In this embodiment, one embodiment of a display device in which a luminous layer is provided in a pixel portion will be described.

Figure 18:
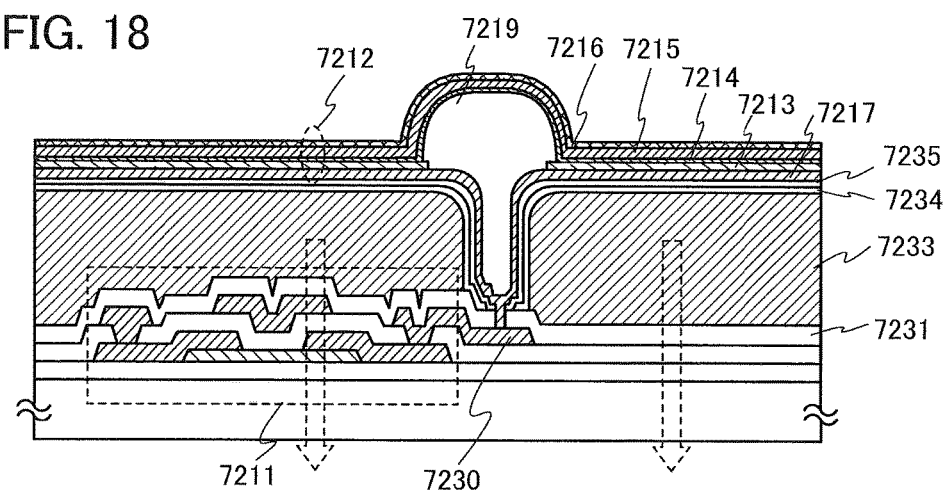
FIG. 18 is a cross-sectional view illustrating a structural example of a pixel.

FIG. 18 is a cross-sectional view of a pixel portion having a bottom emission structure and illustrates a cross section of a transistor (a driver transistor) 7211 and a light-emitting element 7212 electrically connected to the transistor 7211 which are provided in a pixel.

In the transistor 7211, an insulating layer, an oxide semiconductor layer, a source and drain electrode layers, a gate insulating layer, and a gate electrode layer are provided over a substrate, and wiring layers are provided so as to be electrically connected to the source and drain electrode layers.

Further, an insulating layer 7231 is formed to cover the transistor 7211, and a luminous layer 7233 having an opening is provided over the insulating layer 7231. Further, a light-transmitting conductive film 7217 is formed over the overcoat layer 7234 and the insulating layer 7235 which are over the luminous layer 7233. Note that a drain electrode 7230 of the transistor 7211 and the conductive film 7217 are electrically connected to each other through an opening formed in the luminous layer 7233, the overcoat layer 7234, the insulating layer 7235, and the insulating layer 7231. Further, a first electrode 7213 of the light-emitting element 7212 is provided on and in contact with the conductive film 7217. Note that the light-emitting layer 7212 has a structure in which the electroluminescence layer 7214 is interposed between the first electrode 7213 and a second electrode 7215, and a blocking layer 7216 is provided over the second electrode 7215.

Note that the transistor 7211 and the light-emitting element 7212 can be formed by the method described in Embodiments 3 to 6. Therefore, the detailed description is not given here.

The luminous layer 7233 contains a luminous material and stores light emitted from the light-emitting element adjacent thereto. After the adjacent light-emitting element stops emitting light, the luminous material contained in the luminous layer 7233 continues to emit light. In this embodiment, as the luminous material, copper-activated zinc sulfide (ZnS:Cu) is used. Alternatively, a phosphor in which an activator is added to sulfide such as strontium sulfide (SrS) as a base material or alkaline earth aluminate to which a rare earth element is added as an activator can be used. Specific examples of alkaline earth aluminate to which a rare earth element is added as an activator are $CaAl_2O_4$:Eu, $CaAl_2O_4$:Nd, $Sr_4Al_{14}O_{25}$:Eu, $Sr_4Al_{14}O_{25}$:Dy, $SrAl_2O_4$:Eu, and $ArAl_2O_4$:Dy. Note that in the case where the luminous material is an inorganic particle, if the grain size is 1 nm or less, a light-storing property may be lost, and if the grain size is 10 μm or more, the planarity of the luminous layer may be lowered, which impedes the formation of a light-emitting element. Therefore, the grain diameter is preferably 1 nm to 10 μm inclusive if inorganic particles are used.

The period in which the luminous layer 7233 keeps emitting light can be changed depending on the kind of luminous material. In other words, the period in which the luminous layer 7233 keeps emitting light, that is, the afterglow time depends on the kind of luminous material; therefore, the material is selected in accordance with an intended purpose. For example, for an electronic device (i.e., an electronic paper) including a display device which does not need frequent rewriting of display contents, a luminous material with a long afterglow time is preferably selected. Further, for an electronic device (i.e., a television) including a display device which need relatively frequent rewriting of display contents, a luminous material with a short afterglow time is preferably selected.

In addition, the luminous layer 7233 may include a binder polymer. When the luminous layer 7233 includes a binder polymer, the luminous layer 7233 can be formed using a dispersion liquid in which a luminous material is dispersed, and by a droplet discharge method such as an ink jetting method, a printing method, a spin coating method, an etching method using a photolithography technique, or the like which is selected as appropriate.

In addition, in order to planarize surface roughness of the luminous layer 7233, the surface of the luminous layer 7233 is preferably covered with the overcoat layer 7234. Further, the overcoat layer 7234 is preferably covered with the insulating layer 7235. Note that, in FIG. 18, a contact hole which is formed in the overcoat layer 7234 and the protective insulating layer 7235 and reaches to the drain electrode 7230 is located at a position with which a partition 7219 is overlapped.

Note that the position where the luminous layer 7233 is provided is not limited to the position between a user of the display device and the light-emitting element. For example, a light-emitting element having a dual emission structure in which an EL layer is sandwiched between a pair of light-transmitting electrodes has a light-transmitting property. In such a case where the light-emitting element has a light-transmitting property, the luminous layer 7233 can be arranged on the opposite surface side of a light-emitting layer from the side of the user of the display device. In other words, the light-emitting element can be provided between the luminous layer and the user of the display device. When the light-emitting element is provided between the user of the display device and the luminous layer, the light-storing layer does not necessarily need to have a light-transmitting property. Thus, the luminous material can be selected from a wide range of materials. Specifically, a luminous material with a grain size of 100 µm or less can be used.

As described above, the display device described in this embodiment includes a luminous layer in a pixel portion as well as a transistor including a high-purity oxide semiconductor layer. In such a display device having a pixel which includes a luminous layer in addition to a transistor with reduced off current, flickers are not conspicuous even when an emission interval of the light-emitting element is long. In other words, the display device in this embodiment can be reduced in power consumption and have an excellent display quality of still images.

(Embodiment 8)

In this embodiment, specific examples of an electronic device including a display device described in the above embodiments will be described. Note that electronic devices to which the present invention can be applied are not limited to the following specific examples.

Figure 19A:
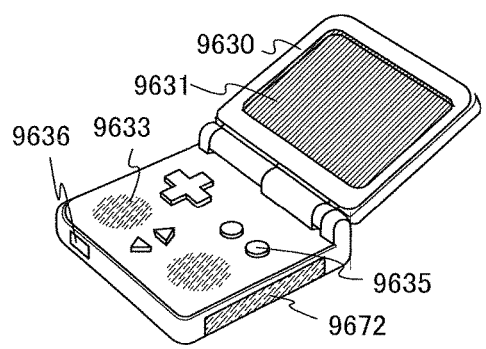
FIGS. 19A to 19C each illustrate an electronic device.

An electronic device illustrated in FIG. 19A is a portable game console which includes a housing 9630, a display portion 9631, a speaker 9633, operation keys 9635, a connection terminal 9636, a storage medium reading portion 9672, and the like. The portable game console may have a function of reading a program or data stored in a storage medium to display it on the display portion, and a function of sharing data with another portable game console by wireless communication. Note that the portable game console can have a variety of functions besides those given above.

Figure 19B:
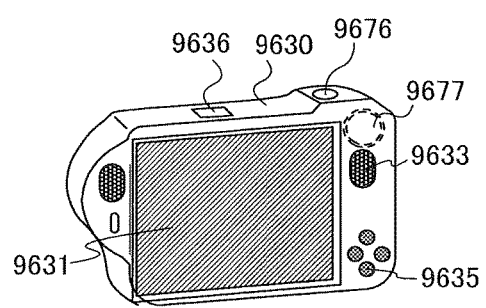

An electronic device illustrated in FIG. 19B is a digital camera which includes a housing 9630, a display portion 9631, a speaker 9633, operation keys 9635, a connection terminal 9636, a shutter button 9676, an image receiving portion 9677, and the like. The digital camera may have a function of photographing a still image and/or a moving image, a function of automatically or manually correcting the photographed image, a function of storing the photographed image data in a memory element, a function of displaying the photographed image data on the display portion, a television reception function, and the like. Note that the digital camera can have a variety of functions besides those given above.

Figure 19C:
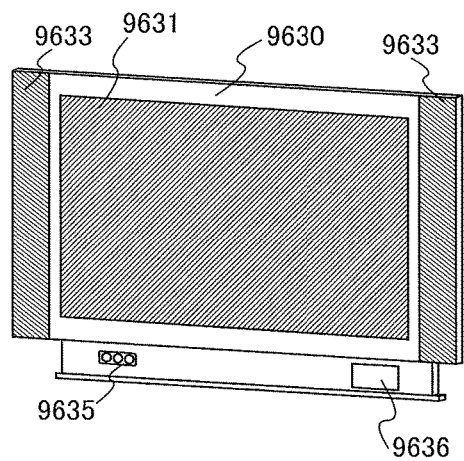

An electronic device illustrated in FIG. 19C is a television receiver which includes a housing 9630, a display portion 9631, speakers 9633, operation keys 9635, a connection terminal 9636, and the like. The television may have a function of converting a television electric wave into an image signal, a function of converting the image signal into a signal for display, a function of converting a frame frequency of the image signal, and the like. Note that the television receiver can have a variety of functions besides those given above.

Figure 20A:
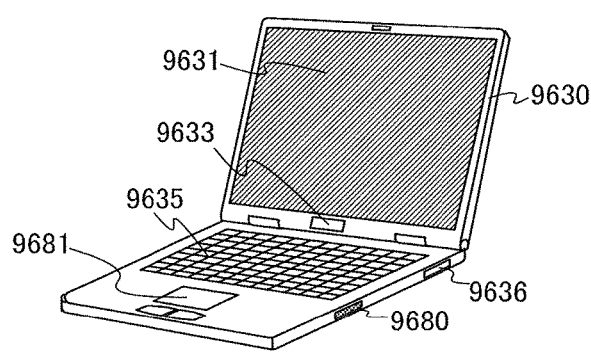
FIGS. 20A to 20D each illustrate an electronic device.

An electronic device illustrated in FIG. 20A is a computer which includes a housing 9630, a display portion 9631, a speaker 9633, operation keys 9635, a connection terminal 9636, a pointing device 9681, an external connection port 9680, and the like. The computer may have a function of displaying a variety of information (e.g., a still image, a moving image, and a text) on the display portion, a function of controlling processing with a variety of software (programs), a communication function such as wireless communication or wired communication, a function of being connected to various computer networks with the communication function, a function of transmitting or receiving a variety of data with the communication function, and the like. Note that the computer can have a variety of functions besides those given above.

Figure 20B:
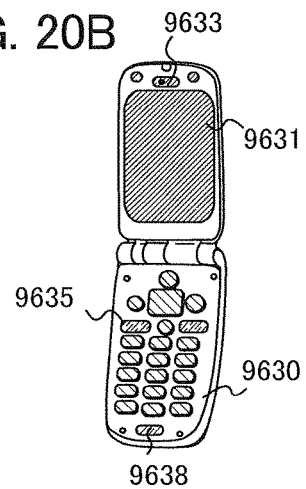

An electronic device illustrated in FIG. 20B is a mobile phone which includes a housing 9630, a display portion 9631, a speaker 9633, operation keys 9635, a microphone 9638, and the like. The mobile phone may have a function of displaying a variety of data (e.g., a still image, a moving image, and a text) on the display portion, a function of displaying a calendar, a date, the time, and the like on the display portion, a function for managing or editing the data displaying on the display portion, a function of controlling processing with various kinds of software (programs), and the like. Note that the mobile phone can have a variety of functions besides those given above.

Figure 20C:
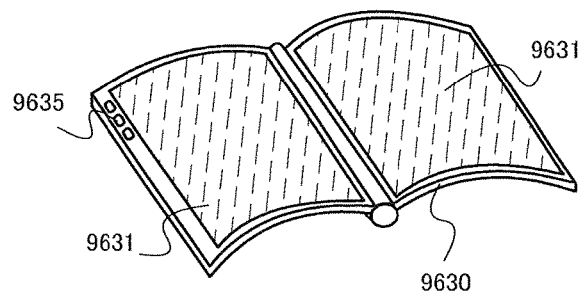

An electric device illustrated in FIG. 20C is an electronic paper including a housing 9630, a display portion 9631, operation keys 9635, and the like. The electronic paper may have a function of displaying a variety of data (e.g., a still image, a moving image, and a text) on the display portion, a function of displaying a calendar, a date, the time, and the like on the display portion, a function for managing or editing the data displaying on the display portion, a function of controlling processing with various kinds of software (programs), and the like. Note that the electronic paper can have a variety of functions besides those given above. An electronic paper can be specifically applied to an electronic book reader (also referred to as an e-book reader), a poster, and an advertisement in a vehicle such as a train, for example.

Figure 20D:
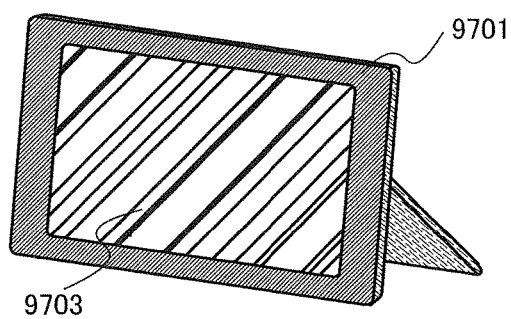

An electric device illustrated in FIG. 20D is a digital photo frame including a display portion 9703 incorporated in a housing 9701. The display portion 9703 can display a variety of images. For example, the display portion 9703 can display image data taken with a digital camera or the like and function like a normal photo frame.

Note that the digital photo frame is provided with an operation portion, an external connection terminal (e.g., a USB terminal and a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame and the data is loaded, whereby the image can be displayed on the display portion 9703.

The digital photo frame may have a function which allows receiving and transmitting of data through wireless communication. In this case, through wireless communication, desired image data can be loaded to the digital photo frame to be displayed. Note that the digital photo frame can have a variety of functions besides those given above.

By using a display device which is one embodiment of the present invention to those electronic devices, power consumption for displaying a still image or the like can be reduced. Accordingly, when the display device which is one embodiment of the present invention is applied to an electronic device which displays still images more often than moving images, such as a digital camera, an electronic paper, and a digital photo frame, an effect of a reduction in power consumption is significant, which is particularly preferable.

This application is based on Japanese Patent Application serial no. 2009-259818 filed with Japan Patent Office on Nov. 13, 2009 and Japanese Patent Application serial no. 2009-278995 filed with Japan Patent Office on Dec. 8, 2009, the entire contents of which are hereby incorporated by reference.

The invention claimed is:

1. A display device comprising:
a display panel comprising:
a pixel portion comprising:
a pixel comprising:
a first transistor comprising:
a gate electrically connected to a scan line; and
a crystalline oxide semiconductor layer comprising indium, gallium, and zinc;
a second transistor comprising a gate electrically connected to a signal line through the first transistor; and
a light-emitting element electrically connected to a power supply line through the second transistor; and
a driver circuit portion comprising:
a gate line driver circuit; and
a display control circuit configured to switch between supply and stop of clock pulse to the driver circuit portion,
wherein the clock pulse is to be supplied to the gate line driver circuit,
wherein the crystalline oxide semiconductor layer has a crystallinity of 80% or more, and
wherein a carrier concentration of the crystalline oxide semiconductor layer is less than $1\times10^{14}/cm^3$.

2. The display device according to claim 1, further comprising a memory circuit comprising a plurality of memory cells.

3. The display device according to claim 1, further comprising a comparison circuit.

4. The display device according to claim 1, further comprising a selection circuit.

5. The display device according to claim 1, wherein, in the first transistor, the crystalline oxide semiconductor layer is positioned over the gate.

6. The display device according to claim 1, wherein the pixel comprises a capacitor electrically connected between the gate of the second transistor and the power supply line.

7. The display device according to claim 1, wherein a hydrogen concentration of the oxide semiconductor layer is less than or equal to $5\times10^{19}/cm^3$.

8. A display device comprising:
a display panel comprising:
a pixel portion comprising:
a pixel comprising:
a first transistor comprising:
a gate electrically connected to a scan line; and
a crystalline oxide semiconductor layer comprising indium, gallium, and zinc;
a second transistor comprising a gate electrically connected to a signal line through the first transistor; and
a light-emitting element electrically connected to a power supply line through the second transistor; and
a driver circuit portion comprising:
a gate line driver circuit; and
a signal line driver circuit; and
a display control circuit configured to switch between supply and stop of clock pulse to the driver circuit portion,
wherein the clock pulse is to be supplied to the gate line driver circuit,
wherein the crystalline oxide semiconductor layer has a crystallinity of 80% or more, and
wherein a carrier concentration of the crystalline oxide semiconductor layer is less than $1\times10^{14}/cm^3$.

9. The display device according to claim 8, further comprising a memory circuit comprising a plurality of memory cells.

10. The display device according to claim 8, further comprising a comparison circuit.

11. The display device according to claim 8, further comprising a selection circuit.

12. The display device according to claim 8, wherein, in the first transistor, the crystalline oxide semiconductor layer is positioned over the gate.

13. The display device according to claim 8, wherein the pixel comprises a capacitor electrically connected between the gate of the second transistor and the power supply line.

14. The display device according to claim 8, wherein a hydrogen concentration of the oxide semiconductor layer is less than or equal to $5\times10^{19}/cm^3$.

15. A display device comprising:
a display panel comprising:
a pixel portion comprising:
a pixel comprising:
a first transistor comprising:
a gate electrically connected to a scan line; and
a crystalline oxide semiconductor layer comprising indium, gallium, and zinc;
a second transistor comprising a gate electrically connected to a signal line through the first transistor; and
a light-emitting element electrically connected to a power supply line through the second transistor; and
a driver circuit portion comprising:
a gate line driver circuit;
a signal generation circuit configured to generate clock pulse and output the clock pulse to the driver circuit portion; and
a display control circuit configured to switch between supply and stop of the clock pulse to the driver circuit portion,
wherein the clock pulse is to be supplied to the gate line driver circuit,
wherein the crystalline oxide semiconductor layer has a crystallinity of 80% or more, and
wherein a carrier concentration of the crystalline oxide semiconductor layer is less than $1\times10^{14}/cm^3$.

16. The display device according to claim 15, further comprising a memory circuit comprising a plurality of memory cells.

17. The display device according to claim 15, further comprising a comparison circuit.

18. The display device according to claim 15, further comprising a selection circuit.

19. The display device according to claim 15, wherein, in the first transistor, the crystalline oxide semiconductor layer is positioned over the gate.

20. The display device according to claim 15, wherein the driver circuit portion comprises a signal line driver circuit.

21. The display device according to claim 15, wherein the pixel comprises a capacitor electrically connected between the gate of the second transistor and the power supply line.

22. The display device according to claim 15, wherein a hydrogen concentration of the oxide semiconductor layer is less than or equal to $5\times10^{19}/cm^3$.

* * * * *